US006567327B2

(12) United States Patent
Tsuchi

(10) Patent No.: US 6,567,327 B2
(45) Date of Patent: May 20, 2003

(54) DRIVING CIRCUIT, CHARGE/DISCHARGE CIRCUIT AND THE LIKE

(75) Inventor: Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 100 days.

(21) Appl. No.: 09/924,609

(22) Filed: Aug. 9, 2001

(65) Prior Publication Data

US 2002/0021606 A1 Feb. 21, 2002

(30) Foreign Application Priority Data

Aug. 10, 2000 (JP) ....................................... 2000-243162

(51) Int. Cl.[7] ................................................. G11C 7/00

(52) U.S. Cl. .......................... 365/203; 365/204; 330/9; 330/53; 330/54; 330/255

(58) Field of Search ................................ 365/203, 204; 330/255, 9, 53, 54

(56) References Cited

U.S. PATENT DOCUMENTS 5,471,171 A 11/1995 Itakura et al.
5,841,317 A * 11/1998 Ohmori et al. ............. 327/563
6,028,598 A * 2/2000 Suyama et al. ............. 345/211
6,424,219 B1 * 7/2002 Kato .......................... 330/255
6,483,384 B1 * 11/2002 Chimura ..................... 330/257

FOREIGN PATENT DOCUMENTS

EP 0 747 748 A1 12/1996

OTHER PUBLICATIONS

European Search Report dated Apr. 2, 2002.
Lee et al., "A Low–Power Poly–Si TFT–LCD with Integrated 8–bit Digital Data Drivers", Proceedings of the 18th International Display Research Conference, ASIA Display 98, Seoul, Sep. 28–Oct. 1, 1998, International Display Research Conference, IDRC, San Jose, CA, SID, US, vol. CONF. 18, Sep. 28, 1998, pp. 285–288.
Conner et al., "Low–Power 6–Bit Column Driver for AMLCDs" SID International Symposium Digest of Technical Papers, San Jose, Jun. 14–16, 1994, Santa Ana, SID, US, vol. 25, Jun. 14, 1994, pp. 351–354.

* cited by examiner

*Primary Examiner*—Son T. Dinh
(74) *Attorney, Agent, or Firm*—McGinn & Gibb, PLLC

(57) ABSTRACT

To provide a driving circuit constituted by a first output stage including a charging means and a first constant current circuit, a second output stage including a discharging means and a second constant current circuit, a precharge/predischarge circuit composed of first and second differential circuits, an output circuit for outputting a desired voltage, and an operation control signal generating circuit for generating an operation control signal for controlling the precharge/predischarge circuit and the output circuit. At least the precharge/predischarge circuit is operated in the first half of an output period for outputting a desired voltage, and only the output circuit is operated in the second half of the output period.

This configuration allows a capacitive load connected to an output terminal to be driven to around a desired voltage at high speed while sufficiently suppressing charging/discharging power caused by precharging and predischarging, reduction in driving speed, and idling current.

60 Claims, 22 Drawing Sheets

| | t0 to t1 | t1 to t2 | t2 to t3 | t3 to t4 |
|---|---|---|---|---|
| SWITCHES 521,531,532 | ON | OFF | OFF | OFF |
| SWITCHES 522,541,542 | OFF | OFF | ON | OFF |
| OUTPUT CIRCUIT | NON-OPERATION (OPERATION) | OPERATION | NON-OPERATION (OPERATION) | OPERATION |

| | t0 to t1 | t1 to t2 | t2 to t3 | t3 to t4 |
|---|---|---|---|---|
| SWITCH 521 | ON | OFF | ON | OFF |
| SWITCHES 531,532 | ON | OFF | OFF | OFF |
| SWITCHES 541,542 | OFF | OFF | ON | OFF |
| OUTPUT CIRCUIT | NON-OPERATION (OPERATION) | OPERATION | NON-OPERATION (OPERATION) | OPERATION |

| | t0 to t1 | t1 to t2 | t2 to t3 |
|---|---|---|---|
| SWITCHES 521,531,532 | ON | OFF | OFF |
| SWITCHES 522,541,542 | OFF | ON | OFF |
| OUTPUT CIRCUIT | NON-OPERATION (OPERATION) | NON-OPERATION (OPERATION) | OPERATION |

| | t0 to t1 | t1 to t2 | t2 to t3 |
|---|---|---|---|
| SWITCH 521 | ON | ON | OFF |
| SWITCHES 531,532 | ON | OFF | OFF |
| SWITCHES 541,542 | OFF | ON | OFF |
| OUTPUT CIRCUIT | NON-OPERATION (OPERATION) | NON-OPERATION (OPERATION) | OPERATION |

| | t0 to t1 | t1 to t2 | t2 to t3 | t3 to t4 |
|---|---|---|---|---|
| SWITCHES 611,613 | ON | OFF | OFF | OFF |
| SWITCHES 612,614 | OFF | OFF | ON | OFF |
| SWITCHES 621,623 | OFF | OFF | ON | OFF |
| SWITCHES 622,624 | ON | OFF | OFF | OFF |
| SWITCHES 521,531,532 | ON | OFF | ON | OFF |
| SWITCHES 522,541,542 | ON | OFF | ON | OFF |
| OUTPUT CIRCUIT 1, OUTPUT CIRCUIT 2 | NON-OPERATION (OPERATION) | OPERATION | NON-OPERATION (OPERATION) | OPERATION |

| | t0 to t1 | t1 to t2 | t2 to t3 |
|---|---|---|---|
| SWITCHES 611,613 | ON | OFF | OFF |
| SWITCHES 612,614 | OFF | ON | OFF |
| SWITCHES 621,623 | OFF | ON | OFF |
| SWITCHES 622,624 | ON | OFF | OFF |
| SWITCHES 521,531,532 | ON | ON | OFF |
| SWITCHES 522,541,542 | ON | ON | OFF |
| OUTPUT CIRCUIT 1, OUTPUT CIRCUIT 2 | NON-OPERATION (OPERATION) | NON-OPERATION (OPERATION) | OPERATION |
FIG.18A
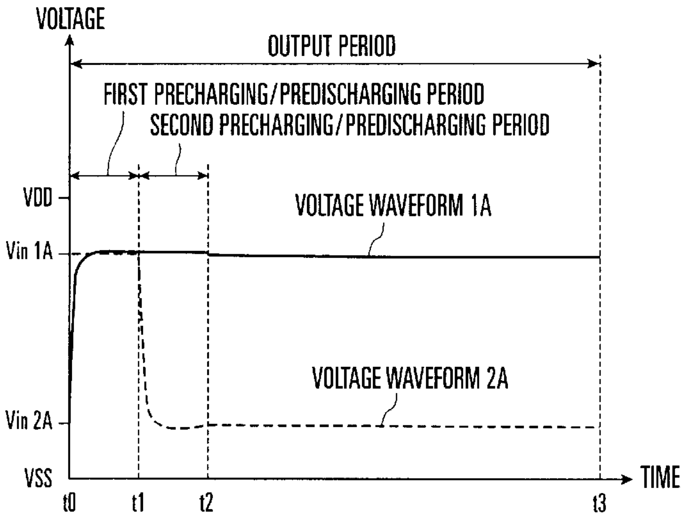
FIG.18B
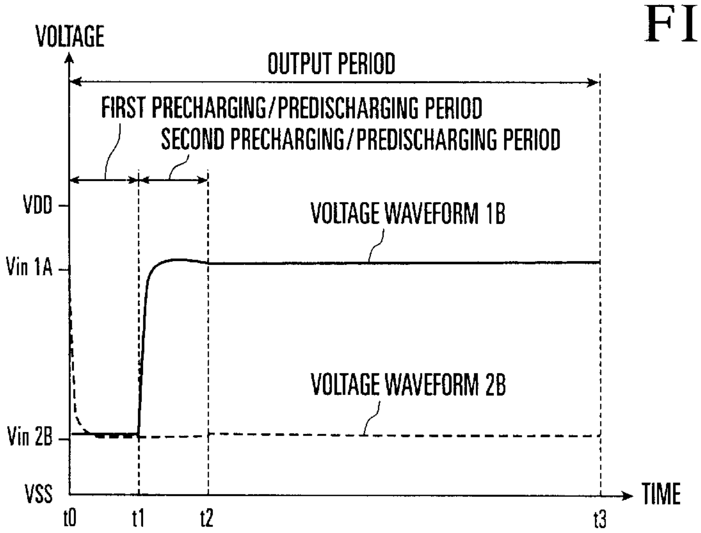
FIG.18C

DRIVING CIRCUIT, CHARGE/DISCHARGE CIRCUIT AND THE LIKE

BACKGROUND OF THE INVENTION

The present invention relates to a driving circuit, a charge/discharge circuit and the like for driving a capacitive load, and more particularly, to a driving circuit, a charge/discharge circuit and the like that are suitable for a liquid crystal display device and the like using an active matrix driving method.

In recent years, with development of communication technology, demand has increased for portable equipment with a display that includes a mobile phone, a personal digital assistant and the like. It is important for portable equipment to have sufficiently long continuous use, and a liquid crystal display device has been widely used for a display of portable equipment because of its low power consumption.

Further, although a liquid crystal display device has been conventionally translucent with backlighting, a reflective display, which uses extraneous light without backlighting, has been developed so as to further lower power consumption.

Moreover, as for a liquid crystal display device, a clear image display has been demanded with higher resolution. Thus, demand has increased for a liquid crystal display device using an active matrix driving method that can provide a clearer image than a conventional direct matrix method.

Lower power consumption has been also demanded on a driving circuit of a liquid crystal display device. A driving circuit with low power consumption has been earnestly studied and developed.

In general, as shown in FIG. 1, a liquid crystal display device 1000 using an active matrix driving method includes a liquid crystal driving device 1010 and a liquid crystal panel 1020. Moreover, the liquid crystal driving device 1010 includes a control circuit 1011, a data line driving circuit 1012, and a common electrode voltage generating circuit 1013. The liquid crystal panel 1020 includes a semiconductor substrate (TFT substrate) 1021 having transparent pixel electrodes and a thin-film transistor (TFT) thereon, an opposing substrate 1022 having a transparent common electrode formed entirely thereon, and liquid crystal filled between the two substrates being opposed to each other.

Data lines and scanning lines are disposed on the semiconductor substrate (TFT substrate) 1021. The data lines transmit a plurality of level voltages (gradation voltage) to be applied to the pixel electrodes and the scanning lines transmit switching (scanning) control signals to TFT elements. The data lines have a relatively large capacitive load due to a liquid crystal capacity between the opposing substrate electrodes, a capacity appearing on the intersections with the scanning lines, and the like.

The following will discuss a liquid crystal driving device of the liquid crystal display device.

The control circuit 1011 generates a driving control signal, a scan control signal, a common electrode control signal, and so on in response to a signal such as a parallel synchronizing signal and a video signal.

The data line driving circuit 1012 generates a plurality of gradation voltages for driving the data lines in response to a driving control signal.

Moreover, the common electrode voltage generating circuit 1013 supplies a predetermined voltage to the common electrode in response to a common electrode control signal.

A scan control signal controls the TFT, gradation voltage is applied to the pixel electrodes, a transmittance of liquid crystal is varied according to a potential difference between the pixel electrode and the opposing substrate electrode, and an image is displayed.

Gradation voltage is applied to the pixel electrodes via the data lines and is applied to all the pixels connected to the data lines in a single frame period (about 1/60 second). Hence, the data line driving circuit needs to rapidly drive the data lines serving as a capacitive load with high voltage accuracy.

As described above, the data line driving circuit 1012 needs to rapidly drive the data lines serving as a capacitive load with high voltage accuracy. Further, when being used for portable equipment, low power consumption is demanded. Therefore, a variety of data line driving circuits have been developed to satisfy the above-mentioned needs (high accuracy, high speed, and low consumption of output voltage).

As a simple driving circuit for outputting a plurality of level voltages in FIG. 1, a driving circuit of FIG. 2 has been known, which is composed of a resistor string (multilevel voltage generating circuit) 200 and decoders 300 each including a switch group 301.

In FIG. 2, as a simple configuration, voltage taken out from a connecting terminal of the resistor string (multilevel voltage generating circuit) 200 is selected in the decoder 300 including the switch group 301, and the voltage is directly outputted to the data lines of a liquid crystal display panel (e.g., 1020 in FIG. 1) connected to a output terminal group 400. Besides, a level voltage corresponding to each data line can be selected in the decoder 300 in response to a digital select control signal, which is one of driving control signals.

Power consumption of the driving circuit shown in FIG. 2 is determined by current applied to the resistor string 200. If the current is lowered, power consumption can be reduced. However, a driving period (a single output period) of a level voltage to the data line is generally determined by the number of scanning lines of the liquid crystal display panel. In case of a panel having a large number of pixels, a single output period is short and high-speed driving is necessary.

A speed of the driving circuit shown in FIG. 2 is dependent upon the magnitude of current applied to the resistor string 200, and charge supplied to the data lines is supplied from the resistor string 200. Hence, the circuit is large in impedance, and it is necessary to sufficiently increase the current of the resistor string 200 to perform high-speed driving in the driving circuit shown in FIG. 2. In this case, power consumption increases.

As a driving circuit for solving the above problem, for example, Japanese Patent Laid-Open No. 10-301539 discloses a driving circuit configured as FIG. 3.

Referring to FIG. 3, the driving circuit includes output circuits 900, which are respectively disposed on the outputs of the driving circuit shown in FIG. 2. The output circuit 900 has a switch 901 which connects the output of the decoder 300 and an output terminal 400, an N-channel MOS transistor (NMOS) 902, and a P-channel MOS transistor (PMOS) 903. The N-channel MOS transistor (NMOS) 902 has the drain connected to a high-potential side power source VDD, the source connected to the output terminal 400, and the gate connected to the output of the decoder 300. The P-channel MOS transistor (PMOS) 903 has the source connected to the output terminal 400, the drain connected to a lower-potential side power source VSS, and the gate connected to the output of the decoder 300.

Besides, the switch 901 is controlled by, for example, an operating control signal generated in an operating control signal generating circuit 800 or an operating control signal generated in the control circuit 1011 of FIG. 1. Namely, when the switch 901 is turned off during a spare charge/discharge period, which is provided in a first half of an output period, a source follower operation of the transistor 902 or 903 achieves faster speed to about a voltage shifted from a selected level voltage by a threshold voltage of the transistor. After the spare charge/discharge period, the switch 901 is turned on, charge is directly supplied from the resistor string 200 to the data lines like the driving circuit shown in FIG. 2, and driving is made at a selected level voltage.

In the driving circuit of FIG. 3, during the spare charge/discharge period, charge is supplied from the power source, which is connected to the drain of the transistor, to the data lines by impedance conversion in the source follower operation of the transistor. Thus, fast driving is possible.

Therefore, the driving circuit of FIG. 3 can provide driving to a selected level voltage faster than the driving circuit shown in FIG. 2.

Meanwhile, a driving circuit has been known which achieves high-speed driving completely by impedance conversion without supplying charge from the resistor string 200 to the data lines. FIG. 4 shows an example of a representative driving circuit.

Referring to FIG. 4, a driving circuit is composed of an operational amplifier, which is constituted by differential amplifying stages 81 and 82, and an output amplifying stage 84. In FIG. 4, when a voltage following structure is provided in which the output voltage Vout of the operational amplifier is fed back (negative feedback) to the Vin− (reversed input end) of the differential amplifying stages 81 and 82, a voltage equal to that inputted to the Vin+ (non-inverting input terminal) is amplified in current and is outputted as the output voltage Vout.

Therefore, when a level voltage is inputted to the Vin+, the data lines can be rapidly driven with high current supplying capability.

Regarding an operation of the operational amplifier in FIG. 4 having a voltage following structure, although the output voltage Vout is stable at Vin+=Vin−, when the voltage is changed to Vin+>Vin−, only a PMOS transistor 841 of the output amplifying stage 84 is operated and the output voltage Vout is increased to Vin+ (voltage on a non-inverting input terminal). Meanwhile, when the voltage is changed to Vin+<Vin−, only an NMOS transistor 842 of the output amplifying stage 84 is operated, and the output voltage Vout is reduced to Vin− (voltage on a reversed input end).

In the configuration having feedback, oscillation is likely to occur because of delays in responses of the differential amplifying stages 81 and 82 and the output amplifying stage 84 with respect to a change in output voltage Vout. Hence, capacitor elements 843 and 844 are provided as phase compensating means to adjust delayed timing of response (phase compensation). Thus, it is possible to prevent oscillation and obtain output voltage with stability. Such an operational amplifier makes it possible to drive the data lines with high speed. Additionally, when the operational amplifier of FIG. 4 is used as the output circuit 900 of FIG. 3, small current supplying capability is enough for the circuit supplying Vin+. Hence, it is possible to sufficiently reduce the current of the resistor string 200.

However, in the operational amplifier in FIG. 4, power is consumed due to charge/discharge power of a capacitive load and idling current for maintaining the operation of the operational amplifier. Further, when a level voltage inputted to Vin+ is changed, a charging operation and a discharging operation are switched with high speed until the output voltage is stabilized. Thus, an extremely large power may be consumed in a short time. Hence, although the operational amplifier shown in FIG. 4 can achieve high voltage accuracy and high-speed driving, power consumption is large.

As a driving circuit for solving the above problem, for example, Japanese Patent No. 2990082 discloses a driving circuit shown in FIG. 5. Referring to FIG. 5, the driving circuit is constituted by an operational amplifier, which is composed of a differential amplifying stage 81 and an output amplifying stage 83, and a spare discharge control switch 834.

Although the output amplifying stage 83 can perform a charging operation with high speed by using a PMOS transistor 831, a speed of a discharging operation is reduced by the current of a constant current circuit 832. Hence, a spare discharging period is provided in a first half of an outputting period. Data lines are temporarily reduced to a source voltage VSS during the spare discharging period by the switch 834, which is controlled by an operation control signal, and is driven to the inputted voltage Vin+ with high speed by the operational amplifier after the spare discharging period.

This makes it possible to reduce currents of constant current circuits 815 and 832 of the differential amplifying stage 81 and the output amplifying stage 83 so as to achieve high-speed driving even when idling current is reduced.

Namely, in the driving circuit shown in FIG. 5, the data lines are temporarily predischarged to the power source voltage VSS. Thus, high-speed driving can be achieved by the operational amplifier having low power consumption with small idling current and driving can be provided with high voltage accuracy of the operational amplifier.

Also, without the necessity for precharging, high-speed driving is possible with such a simple operational amplifier as the differential amplifying stage 81 and the output amplifying stage 83 of FIG. 5.

Further, as a driving circuit achieving low power consumption, for example, Japanese Patent Laid-Open No. 10-197848 discloses a configuration shown in FIG. 6.

Referring to FIG. 6, a feedback configuration is provided, in which an operational amplifier 860 having the input voltage Vin inputted to the reversed input end (−), a PMOS transistor 861 having the source connected to the high-potential side power source VDD via a switch 871, and an NMOS transistor 862 having the source connected to a low-potential side power source VSS via a switch 872. The drains of the PMOS transistor 861 and the NMOS transistor 862 are connected in common to the output terminal, the output of the operational amplifier 860 is connected in common to the gates of the PMOS transistor 861 and the NMOS transistor 862, and the voltage Vout of the output terminal is fed back to the non-inverting input terminal (+) of the operational amplifier 860.

The operational amplifier 860 is configured such that only the gates of the transistors 861 and 862 are driven. Hence, even when the operational amplifier 860 has low power consumption with reduced current supply capability, it is possible to drive the gates of the transistors 861 and 862 with high speed. Moreover, the transistors 861 and 862 can rapidly charge or discharge a capacitive load with high current supply capability and are stabilized at a voltage equal to that of the input of the operational amplifier 860.

Therefore, high-speed driving is possible in the driving circuit of FIG. 6. Besides, the switches 871 and 872 are controlled by an operation control signal and are provided for preventing flow-through current caused by the switching of charging and discharging. When the PMOS transistor 861 carries out a charging operation, the switch 871 is turned on. When the NMOS transistor 862 carries out a discharging operation, the switch 872 is turned on. Hence, high-speed driving is achieved and power consumption can be reduced to charge/discharge power of the capacitive load and idling current of the operational amplifier 860.

As described above, regarding the driving circuit of the liquid crystal display device used for portable equipment, low power consumption is required more than anything else. At the same time, high-speed driving with high voltage accuracy is necessary.

The driving circuit shown in FIG. 3 rapidly precharges/predischarges the data lines to a voltage shifted from a selected level voltage by about a threshold voltage of the transistor. And then, charge is directly supplied from the resistor string 200 and provides driving at a selected level voltage. Thus, faster driving is possible than the driving circuit shown in FIG. 2. However, in FIG. 3 as well, as for a change by about a threshold voltage of the transistor, driving needs to be made by directly supplying charge from the resistor string 200. Hence, it is not possible to sufficiently reduce the current of the resistor string 200 unless a threshold voltage of the transistor is sufficiently small. It is easily understood that when a precharge/predischarge circuit is provided for making high-speed driving to around a level voltage by precharging and predischarging, it is possible to sufficiently reduce the current of the resistor string 200.

Meanwhile, the feedback driving circuit shown in FIGS. 5 and 6 can readily achieve high-speed driving. However, in order to drive the data lines with high voltage accuracy in a stable manner, it is necessary to provide a phase compensation means for preventing oscillation.

In the case where idling current is reduced by the constant current circuit like the operational amplifier of FIG. 5, it is necessary to apply the idling current (static current) which is large enough to rapidly charge and discharge a phase compensating capacity.

Further, in case of the operational amplifier shown in FIG. 5, source voltage is predischarged for each output period. In case of continuous driving at the same level voltage as well, the data lines need to be predischarged for each output period. Thus, excessive charge/discharge power is consumed.

Furthermore, in case of the driving circuit shown in FIG. 6, only one of the charging operation and the discharging operation is carried out in driving data lines during an output period. Hence, in case of the data line having a relatively small capacity, a driving voltage may be largely shifted from a selected level voltage.

Moreover, other than the configurations shown in FIGS. 5 and 6, there is proposed a method of temporarily bringing the operational amplifier to a non-operation state to reduce power consumption caused by idling current in the driving circuit using the operational amplifier. However, an output voltage is unstable until the phase compensating capacity is stable in charging and discharging at the start of the operation of the operational amplifier. When the operational amplifier is frequently switched between an operation and a non-operation, it is difficult to produce an output with high voltage accuracy, and power consumption increases due to charging and discharging of a period having an unstable output.

SUMMARY OF THE INVENTION

A first object of the present invention is to provide a driving circuit and so on that achieves a high-speed operation and low power consumption.

A second object of the present invention is to provide a driving circuit and so on that achieves high accuracy of output voltage, a high-speed operation, and low power consumption.

In order to attain the above objects, a first driving circuit of the present invention includes an output circuit for outputting output voltage to a driving output terminal in response to input voltage and a precharge/predischarge circuit for driving the driving output terminal in response to the input voltage, and is characterized in that the precharge/predischarge circuit include:

a first output stage which is controlled by a first operation control signal and includes a first constant current circuit having a discharging function and a charging means;

a second output stage which is controlled by a second operation control signal and includes a second constant current circuit having a charging function and a discharging means; and at least a single differential circuit which is controlled by a third operation control signal and includes at least a single input terminal for receiving the input voltage and an output terminal connected to the input terminals of the first output stage and the second output stage, and the output terminals of the first output stage and the second output stage which are connected in common to said driving output terminal.

A second driving circuit of the present invention includes an output circuit for outputting output voltage to a driving output terminal in response to input voltage, a precharge/predischarge circuit for driving the driving output terminal in response to the input voltage, a multilevel voltage generating circuit for generating a plurality of level voltages, and a means for selecting the plurality of level voltages and supplying the voltages as input voltage of the output circuit, and is characterized in that the precharge/predischarge circuit includes:

a first output stage which is controlled by the first operation control signal and includes a first constant current circuit having a discharging function and a charging means;

a second output stage which is controlled by the second operation control signal and includes a second constant current circuit having a charging function and a discharging means; and at least a single differential circuit which is controlled by a third operation control signal and includes at least a single input terminal for receiving the input voltage and an output terminal connected to the input terminals of the first output stage and the second output stage, and the output terminals of the first output stage and the second output stage which are connected in common to said driving output terminal.

A third driving circuit of the present invention includes a first output circuit for outputting a first output voltage to a first driving output terminal in response to a first input voltage, a second output circuit for outputting a second output voltage to a second driving output terminal in response to a second input voltage, and a precharge/predischarge circuit for driving the first and second driving output terminals in response to the first and second input voltages, and is characterized in that the precharge/predischarge circuit includes:

a first output stage including a first constant current circuit having a discharging function and a charging means;

a second output stage including a second constant current circuit having a charging function and a discharging means;

a first differential circuit having at least a single input terminal for receiving the first input voltage or the second input voltage and an output terminal connected to the input terminal of the first output stage;

a second differential circuit having at least a single input terminal for receiving the first input voltage or the second input voltage and an output terminal connected to the input terminal of the second output stage; and the output terminals of the first and second output stages which are connected in common, and connected to the first or second driving output terminals.

a switching group for connecting the first and second output circuits and the first differential circuit and the first output stage or the second differential circuit and the second output stage, and in an output period when the first and second output circuits and the switch group are controlled and desired voltages are outputted to the first and second driving output terminals, at least the precharge/predischarge circuit is operated in the first half of the output period and only the two output circuits are operated in the second half of the output period.

A fourth driving circuit of the present invention includes an output circuit for inputting an input signal voltage from an input terminal to drive an output terminal, and a precharge/predischarge circuit for precharging/predischarging the output terminal and is characterized in that the precharge/predischarge circuit includes;

first and second differential circuits for differential-inputting an input signal voltage from the input terminal and an output signal voltage of the output terminal;

a first output stage including a first conductive transistor and a first switch connected in series between a high-potential side power source and the output terminal, the first conductive transistor having a control terminal connected to an output voltage of the first differential circuit to be turned on and off, and having when being turned on, a current applied by the output voltage controlled to charge output terminal from a high-potential side power source, and the first switch being subjected to on-off control by an operation control signal, and a first constant current source circuit, which discharges from the output terminal to the low-potential side power source, and a second switch, which is subjected to on-off control by an operation control signal, connected in series between the output terminal and the low-potential side power source; and a second output stage including a second conductive transistor and a third switch connected in series between a low-potential side power source and the output terminal, the second conductive transistor having a control terminal connected to an output voltage of the second differential circuit to be turned on and off, and having, when being turned on, a current applied by the output voltage is controlled to discharge from the output terminal to the low-potential side power source, and the third switch being subjected to on-off control by an operation control signal, and a second constant current source circuit, which charges the output terminal from the high-potential side power source, and a fourth switch, which is subjected to on-off control by the operation control signal, connected in series between the output terminal and the high-potential side power source.

A fifth driving circuit of the present invention includes an output circuit for inputting an input signal voltage from an input terminal to drive an output terminal, and a precharge/predischarge circuit for precharging and predischarging the output terminal, and is characterized in that the precharge/predischarge circuit includes:

first and second differential circuits for differential-inputting an input signal voltage from the input terminal and an output signal voltage from the output terminal;

a first output stage including a first conductive transistor and a first switch connected in series between a high-potential side power source and the output terminal, the first conductive transistor having a control terminal connected to a first output voltage of the first differential circuit to be turned on and off, and having, when being turned on, a current applied by the first output voltage controlled to charge the output terminal from a high-potential side power source, and the first switch being subjected to on-off control by an operation control signal, and a first constant current source circuit, which discharges from the output terminal to the low-potential side power source, and a second switch, which is subjected to on-off control by the operation control signal, connected in series between the output terminal and the low-potential side power source, and a second output stage including a second conductive transistor and a third switch connected in series between a low-potential side power source and the output terminal, the second conductive transistor having a control terminal connected to a second output voltage of the second differential circuit to be turned on and off, and having, when being turned on, current applied by the output voltage controlled to discharge from the output terminal to the low-potential side power source, and the third switch being subjected to on-off control by the operation control signal, and a second constant current source circuit, which charges the output terminal from the high-potential side power source, and a fourth switch, which is subjected to on-off control by the operation control signal, connected in series between the output terminal and the high-potential side power source.

The precharge/predischarge circuit of the present invention is characterized by including:

a first output stage which is controlled by a first operation control signal and includes a first constant current circuit having a discharging function and a charging means;

a second output stage which is controlled by a second operation control signal and includes a second constant current circuit having a charging function and a discharging means; and at least a single differential circuit which is controlled by a third operation control signal and includes a first input terminal, a second input terminal connected to the output terminals of both the first output stage and the second output stage, and an output terminal connected to both the input terminals of the first output stage and the second output stage.

The liquid crystal display device of the present invention is characterized by including the driving circuit or the precharge/predischarge circuit of the present invention.

BRIEF DESCRIPTION OF THE DRAWINGS

FIG. 18A is a diagram showing another method of controlling the driving circuit shown in FIG. 16, FIG. 18B is an output voltage waveform diagram of an output terminal 2A, and FIG. 18C is an output voltage waveform diagram of an output terminal 2B;

DESCRIPTION OF THE PREFERRED EMBODIMENTS

Figure 1:
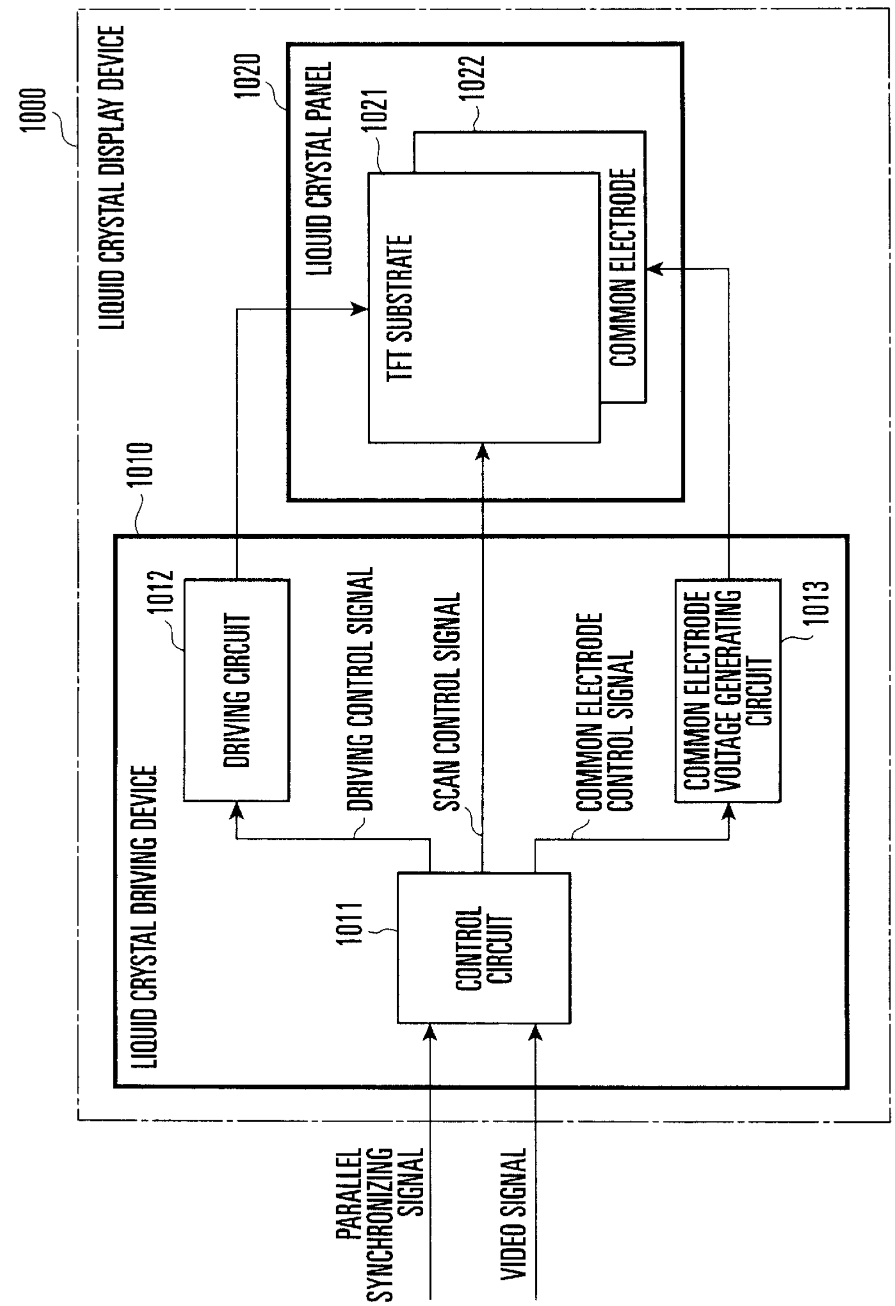
FIG. 1 shows an example of a block diagram of a typical liquid crystal display device.

Referring to figures, the following will discuss a driving circuit of the present invention.

Besides, in the following explanation, an embodiment will be described in which the present invention is used for a driving circuit for driving a capacitive load such as a data line of a liquid crystal display device to a desired voltage in a predetermined period.

Further, for simple explanation, the following example will discuss a MOS transistor used as a transistor. As for transistors other than the MOS transistor, the explanation thereof is omitted because the same effect is obtained as the MOS transistor. Additionally, in the referred figures, the same function or circuit as those of the other figures is indicated by the same reference numerals.

Figure 7:
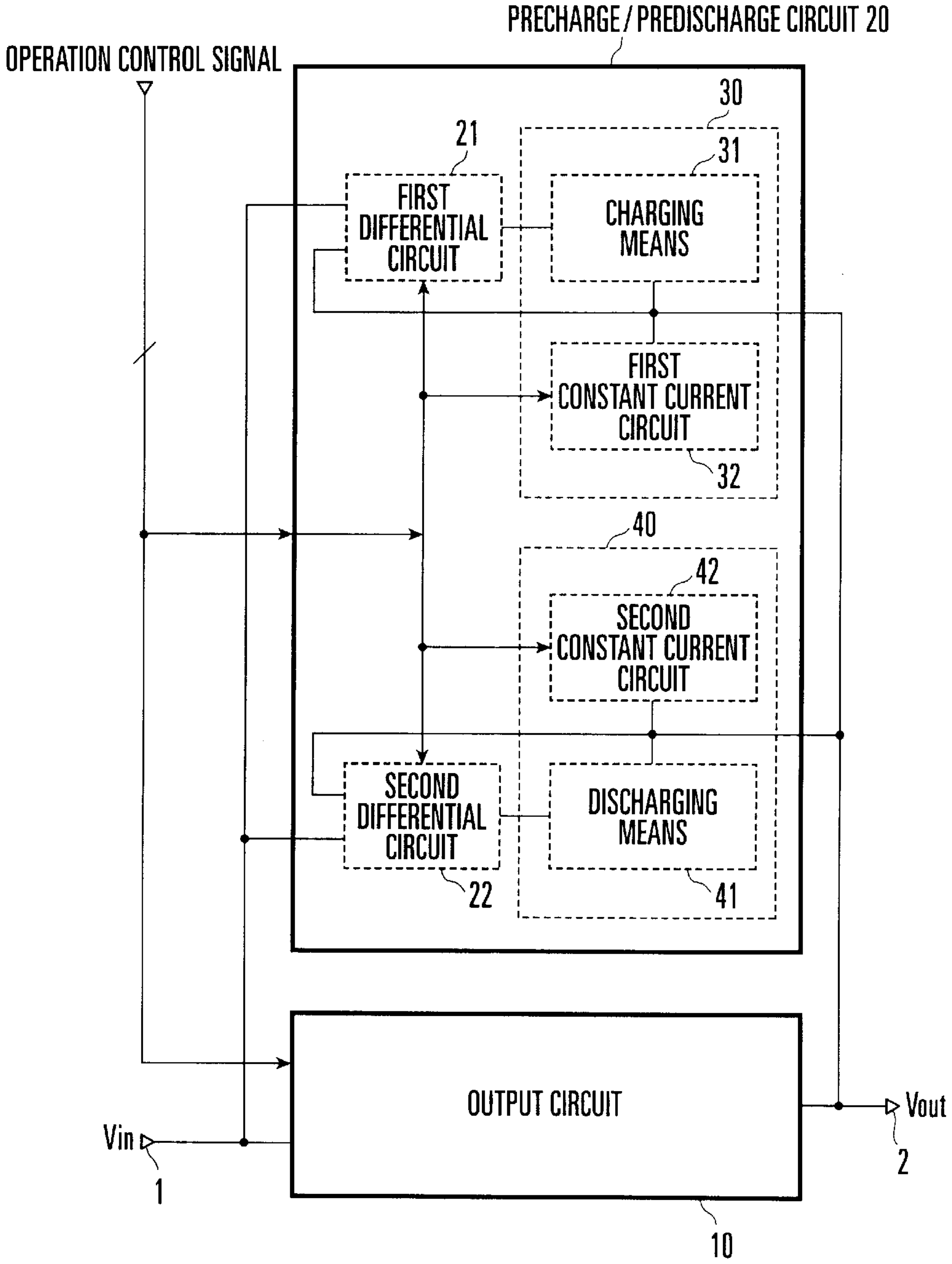
FIG. 7 is a block diagram showing Embodiment 1 of a driving circuit of the present invention.

FIG. 7 is a diagram showing the configuration of the driving circuit according to Embodiment 1 of the present invention.

Referring to FIG. 7, the driving circuit includes an input terminal 1, an output terminal 2, an output circuit 10 which receives a voltage Vin of the input terminal 1 and outputs a desired voltage to the output terminal 2, and a precharge/predischarge circuit 20 for changing a voltage Vout of the output terminal 2 to around a desired voltage with high speed.

To the input terminal 1, a gradation voltage from a multilevel voltage generating circuit (e.g., 200 of FIG. 3) is supplied as Vin via a decoder (e.g., 300 of FIG. 3), and a voltage Vout of the output terminal 2 is, for example, supplied to the data lines of the liquid crystal panel 1020 of FIG. 1. The driving circuit according to the present invention is applicable not only as one for such a liquid crystal apparatus as illustrated in FIG. 1 but also as a capacitive load driving circuit like the driving circuit for an active matrix type organic EL display.

Moreover, an operation control signal is a signal for controlling an operation and non-operation of the precharge/predischarge circuit 20 and the output circuit 10. As described in FIG. 3, the operation control signal is, for example, produced in the control circuit 1011 of FIG. 1 or in the operation control signal generating circuit (not shown) in the driving circuit 1012 of FIG. 1.

The precharge/predischarge circuit 20 has a first differential circuit 21, a second differential circuit 22, and a first output stage 30, and a second output stage 40.

The first output stage 30 has a charging means 31 and a first constant current circuit 32, and the second output stage 40 has a discharging means 41 and a second constant current circuit 42.

The first differential circuit 21 and the first output stage 30 and the second differential circuit 22 and the second output stage 40 respectively have feedback structures in which output voltages of the output stages 30 and 40 are fed back to the inputs of the differential circuits 21 and 22. The first differential circuit 21 and the second differential circuit 22 operate according to a change in a voltage difference between the input voltage Vin and the output voltage Vout. In response to the outputs of the differential circuits 21 and 22, the charging means 31 and the discharging means 41 also operate to change the output voltage Vout.

The charging means 31 charges the output terminal 2 with high current supplying capability and increases the output voltage Vout to a high potential side (e.g., the side of the source voltage VDD), the discharging means 41 discharges accumulated charge of the output terminal 2 with high current supplying capability and reduces the output voltage Vout to a low potential side (the side of source voltage VSS).

Further, the first constant current circuit 32 discharges accumulated charge of the output terminal 2 with constant current supplying capability and reduces the output voltage Vout to the side of the source voltage VSS. The second constant current circuit 42 charges the output terminal 2 with constant current supplying capability and increases the output voltage Vout to the side of the source voltage VDD.

Besides, the first differential circuit 21 and the first output stage 30 and the second differential circuit 22 and the second output stage 40 respectively have feedback structures. In the embodiments of the present invention, a phase compensating means is not provided.

The following will discuss the operation of the driving circuit according to Embodiment 1 of the present invention shown in FIG. 7.

First, the operations of the first differential circuit 21 and the first output stage 30 (charging means 31 and first constant current circuit 32) will be described.

The voltage output of the first differential circuit 21 is varied according to a change in voltage difference between the voltage Vin of the input terminal 1 and the voltage Vout of the output terminal 2. Based on the change, when the voltage Vout is lower than a desired voltage, the charging means 31 is operated, and when the voltage Vout is higher than a desired voltage, the charging means 31 is suspended.

Therefore, the output voltage Vout is rapidly increased to the side of the source voltage VDD by the charging means 31 when the output voltage Vout is lower than a desired voltage. When the output voltage Vout is higher than a desired voltage, the output voltage Vout is slightly reduced by the first constant current circuit 32 and is stabilized around a desired voltage. Although the first differential circuit 21 and the first output stage 30 have feedback structures, a phase compensating means is not provided. The phase compensating means have functions of suppressing oscillation and stabilizing the output voltage Vout but causes reduction in operating speed or increase in power consumption.

In Embodiment 1 of the present invention, the first differential circuit 21 and the first output stage 30 provide high-speed response without a phase compensating means. Thus, the output voltage Vout is rapidly changed to around a desired voltage.

However, in case of the absence of a phase compensating means as well, the first differential circuit 21 and the charging means 31 are slightly delayed in response to a change in output voltage Vout, due to a parasitic capacitance accompanied with a circuit element.

Therefore, when the output voltage Vout is increased to the side of the source voltage VDD, excessive is caused by delay in response of the charging means 31 and the output voltage Vout may be increased higher than a desired voltage. However, in Embodiment 1 of the present invention, the high-speed response of the first differential circuit 21 and the charging means 31 can reduce overcharging to a sufficiently low level.

Moreover, due to the repetition of the charging operation and the discharging operation, the output voltage Vout causes oscillation (vibration). However, the first constant current circuit 32 is set at a sufficiently low level of current in order to reduce oscillation (vibration) to a sufficiently low level.

Even when the charging means 31 carries out a charging operation with high speed, since the discharging operation of the first constant current circuit 32 is slow, the oscillation (vibration) is reduced to a low level with a slight change around a desired voltage.

Namely, in Embodiment 1 of the present invention, since a phase compensating means is not provided, the first differential circuit 21 and the charging means 31 increase in response to a change in the output voltage Vout to reduce overcharging and the first constant current circuit 32 is set at a sufficiently low level of current. Thus, it is possible to suppress oscillation (vibration) to a low level with slight change.

Besides, since a current value of the first constant current circuit 32 is reduced to a sufficiently small current level, power consumption can be also reduced.

Additionally, the first differential circuit 21 and the first output stage 30 only need to rapidly precharge the output voltage Vout sufficiently to a level close to a desired voltage. Even if a low level of oscillation (vibration) remains, no serious problem occurs.

Next, the following will discuss the second differential circuit 22 and the second output stage 40 (discharging means 41 and second constant current circuit 42). The fundamental operating principle is the same as that of the first differential circuit 21 and the first output stage 30.

A voltage output of the second differential circuit 22 is varied due to a voltage difference between the voltage Vin of the input terminal 1 and the voltage Vout of the output terminal 2. When the voltage Vout is higher than a desired voltage, the discharging means 41 is operated. When the voltage Vout is lower than a desired voltage, the discharging means 41 is suspended.

Therefore, when the output voltage Vout is higher than a desired voltage, the output voltage Vout is rapidly decreased to the side of the source voltage VSS by the discharging means 41. When the output voltage Vout is lower than a desired voltage, the output voltage Vout is slightly increased by the second constant current circuit 42 and is stabilized around a desired voltage.

The second differential circuit 22 and the second output stage 40 also have a feedback structure. Like the configuration of the first differential circuit 21 and the first output stage 30, a phase compensating means is not provided and the second constant current circuit is set at a sufficiently low level of current. Hence, it is possible to increase speed up the response of the second differential circuit 22 and the discharging means 41 with respect to a change in the output voltage Vout to reduce over discharging, thereby reducing oscillation (vibration) to a low level with slight change.

Further, since the second constant current circuit 42 is reduced to a sufficiently low level of current, power consumption can be also reduced.

Additionally, the second differential circuit 22 and the second output stage 40 only need to rapidly predischarge the output voltage Vout sufficiently to a level close to a desired voltage. Even if a low level of oscillation (vibration) remains, no serious problem occurs.

The first constant current circuit 32 and the second constant current circuit 42 perform effective operations particularly when a load capacity (load capacity of the output terminal 2) is small.

In the case where an output load capacity is small, when overcharging or over discharging is caused by the charging means 31 or the discharging means 41, the output voltage Vout is likely to largely shift from a desired voltage. In Embodiment 1 of the present invention, since the first constant current circuit 32 and the second constant current circuit 42 are provided, it is possible to reduce overcharging or over discharging, thereby reducing a difference between a desired voltage and a voltage reached by the operation of the precharge/predischarge circuit 20.

Further, the first differential circuit 21 and the second differential circuit 22 are respectively provided with constant current circuits for controlling idling current. Thus, the currents applied to the first differential circuit 21, the second differential circuit 22, the first output stage 30, and the second output stage 40 are controlled by the constant current circuits, and the idling currents are each set at sufficiently small values. Thus, it is possible to achieve low power consumption of the precharge/predischarge circuit 20.

As described above, in Embodiment 1 of the present invention, a high-speed operation is possible while idling current is reduced sufficiently. Besides, the operation of the precharge/predischarge circuit 20 can be suspended by interrupting idling current.

Additionally, in the case where the operation and non-operation of the precharge/predischarge circuit 20 are switched frequently as well, a high-speed operation is possible and power consumption is not increased by switching the operation and non-operation.

Next, in Embodiment 1 of the present invention, the following will discuss the control of an operation control signal that is exercised on the precharge/predischarge circuit 20.

The first differential circuit 21, the first output stage 30 (charging means 31, first constant current circuit 32), the second differential circuit 22, and the second output stage 40 (discharge means 41, second constant current circuit 42) of the precharge/predischarge circuit 20 each include a switch (not shown) for interrupting current. An operation control signal performs on/off control on each switch to control the operation and non-operation of the precharge/predischarge circuit 20.

When the precharge/predischarge circuit 20 is brought into non-operation, it is possible to eliminate power consumption. Further, even during the operation of the precharge/predischarge circuit 20, when the first differential circuit 21 and the first output stage 30 (charging means 31, first constant current circuit 32) are operated, an operation control signal brings the second differential circuit 22 and the second output stage 40 (discharging means 41, second constant current circuit 42) into non-operation, and when the second differential circuit 22 and the second output stage 40 (discharging means 41, second constant current circuit 42) are operated, an operation control signal brings the first differential circuit 21 and the first output stage 30 (charging means 31, first constant current circuit 32) into non-operation.

Such control is exercised in Embodiment 1 of the present invention for the following reason: when the charging means 31 and the discharging means 41 happen to be operated simultaneously, they tend to cause high-potential oscillation due to both their significant power supplying capabilities.

Therefore, while at least one of the first output stage 30 and the second output stage 40 is operated, the other means is brought into non-operation. Thus, it is possible to rapidly precharge and predischarge the output voltage Vout to around a desired voltage.

Next, the following will discuss the operation of the driving circuit including the precharge/predischarge circuit 20 and the output circuit 10 by the operation control signal in Embodiment 1 of the present invention.

The precharge/predischarge circuit 20 can rapidly change the voltage Vout of the output terminal 2 to around a desired voltage but cannot supply high-accuracy voltage output with stability.

Therefore, the output circuit 10 is combined which is able to output voltage with high accuracy. Any conventional driving circuit is applicable as the output circuit 10.

During an arbitrary output period, when a capacitive load is driven to a desired voltage, the precharge/predischarge circuit 20 is operated by an operation control signal in a first half of the output period to rapidly drive the capacitive load to around a desired voltage. During a second half of the output period, the precharge/predischarge circuit 20 is brought into non-operation and the capacitive load is driven to a desired voltage with high voltage precision by the operation of the output circuit 10.

The output circuit 10 is brought into operation or non-operation according to circuit characteristics in the first half of the output period for operating the precharge/predischarge circuit 20. Further, instead of non-operation, a means may be provided for interrupting the output circuit 10 from the input terminal 1 and the output terminal 2.

With the above driving, a driving circuit with reduced current supplying capability can be used as the output circuit 10 as long as voltage output is possible with high accuracy.

As described above, the driving circuit according to Embodiment 1 of the present invention can achieve high-speed driving to around a desired voltage by the precharge/predischarge circuit 20. Since the output circuit 10 is used which achieves high-accuracy voltage output with reduced current supplying capability, high-accuracy output, high-speed driving, and low power consumption are realized.

Figure 8:
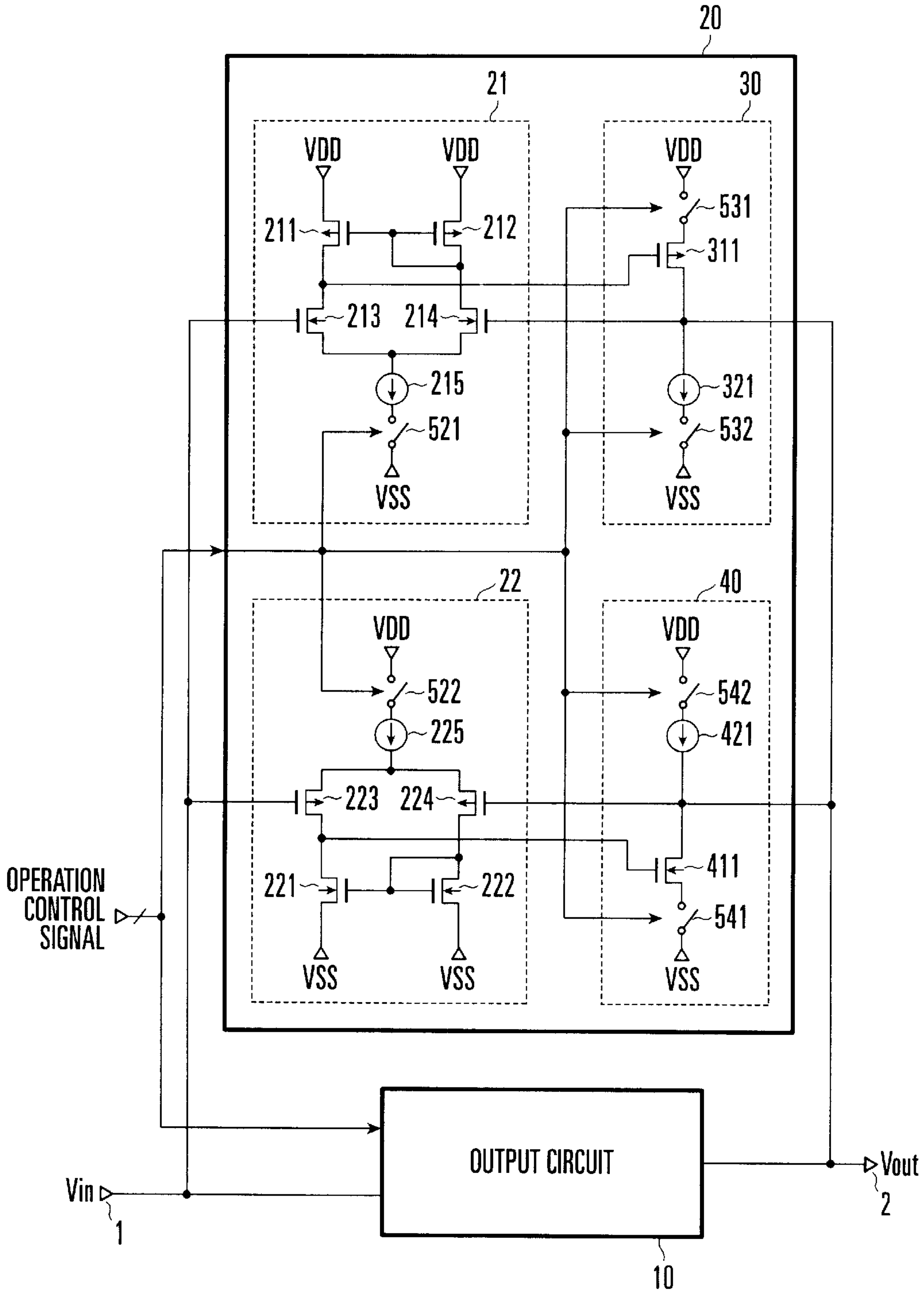
FIG. 8 is a structural diagram showing the configuration of a driving circuit according to Embodiment 2 of the present invention and a specific circuit configuration of a precharge/predischarge circuit 20 of FIG. 7.

FIG. 8 is a diagram showing the configuration of a driving circuit according to Embodiment 2 of the present invention.

FIG. 8 shows a specific example of the precharge/predischarge circuit 20 in the driving circuit of FIG. 7.

In FIG. 8, the precharge/predischarge circuit 20 is a circuit which rapidly precharges and predischarges the output voltage Vout to a voltage level sufficiently close to the voltage Vin when the voltage Vin is applied to the input terminal 1. Further, the output circuit 10 is a circuit which can drive the output terminal 2 to the voltage Vin with high voltage accuracy. The precharge/predischarge circuit 20 is provided with the first differential circuit 21, the first output stage 30, the second differential circuit 22, and the second output stage 40.

The first output stage 30 includes a charging means (311) and the first constant current circuit (321), and the second output stage 40 includes a discharging means (411) and a second constant current circuit (421). The above configuration will be further described in detail.

The first differential circuit 21 is composed of differential pair NMOS transistors 213 and 214 having a current mirror circuit, which is composed of PMOS transistors 211 and 212, as a load. To be specific, there are provided: the NMOS transistors 213 and 214 whose sources are connected in common and are connected to an end of a constant current source 215, whose gates are respectively connected to an input terminal 1 (Vin) and an output terminal 2 (Vout), a PMOS transistor 211 (transistor on the current output side of the current mirror circuit) whose source is connected to VDD, whose gate is connected to the gate of the PMOS transistor 212 and whose drain is connected to the drain of the NMOS transistor 213, a PMOS transistor 212 (current input side transistor of the current mirror circuit) whose source is connected to high-potential side power source VDD, whose drain and gate are connected to each other and are connected to the drain of the NMOS transistor 214, and a switch 521 connecting the other end of the constant current source 215 and the low-potential side power source VSS. The differential NMOS transistors 213 and 214 are equal to each other in size. Here, a drain voltage of the NMOS transistor 213 is an output of the first differential circuit 21.

Moreover, the first output stage 30 includes a PMOS transistor 311 in which the drain is connected to the output terminal 2 as a charging means, an output voltage of the first differential circuit 21 is inputted to the gate, and the source is connected to a high-potential power source VDD via the switch 531. As the first constant current circuit (reference numeral 31 of FIG. 7), a constant current circuit 321 is provided, which has an end connected to the output terminal 2 and the other end connected to the low-potential side power source VSS via the switch 532, to control current applied between the output terminal 2 and the power source VSS.

The switches 521, 531, and 532 having control terminals connected to an operation control signal (operation control signal generated as in FIG. 7) are subjected to on-off control. When the switches are turned off, current is interrupted and the operation is suspended. Even when an arrangement is different from FIG. 8, it is applicable as long as the switches can interrupt current. As mentioned earlier, although the first differential circuit 21 and the first output stage 30 have a feedback structure, a phase compensating capacity is not provided.

The second differential circuit 22 has reversed polarity from the first differential circuit 21 and is constituted by a current mirror circuit composed of NMOS transistors 221 and 222, a differential pair of 223 and 224 which is composed of PMOS transistors equal to each other in size, and a constant current circuit 225.

In the current mirror circuit, the gate and the drain of the NMOS transistor 222 are connected in common. The voltage Vin of the input terminal 1 and the voltage Vout of the output terminal 2 are respectively inputted to the gates of the PMOS transistors 223 and 224. And then, a drain voltage of the differential PMOS transistor 223 is used as an output of the second differential circuit 22.

In the second output stage 40, a NMOS transistor 411 is provided as a discharging means 41, the drain of the NMOS transistor 411 is connected to the output terminal 2, an output voltage of the second differential circuit 22 is connected to the gate of the NMOS transistor 411, and the source of the transistor is connected to the low-potential side power source VSS. Further, a second constant current circuit 421 is provided to control current applied between the output terminal 2 and the high-potential side power source VDD.

Moreover, the second differential circuit 22 and the second output stage 40 include switches 522, 541, and 542 which are controlled by the operation control signal. When the switches are turned off, current is interrupted and the operation is suspended. Even when the arrangement is different from FIG. 8, it is applicable as long as the switches can interrupt current. Besides, although the second differential circuit 22 and the second output stage 40 have a feedback structure, a phase compensating capacity is not provided.

Also, it is preferable that threshold voltages of the PMOS transistor 311 and the NMOS transistor 411 are sufficiently close to threshold voltages of the transistors constituting the current mirrors (211 and 212) and (221 and 222).

Next, referring to FIG. 8, the following will discuss the operation of the precharge/predischarge circuit 20 according to Embodiment 2 of the present invention. The operation of the precharge/predischarge circuit 20 is controlled by an operation control signal. When the first differential circuit 21 and the first output stage 30 or the second differential circuit 22 and the second output stage 40 are operated, control is exercised such that at least the other circuit and stage are suspended.

First, the following will discuss the case where the first differential circuit 21 and the first output stage 30 are operated. Hereinafter, an initial state refers to a state in which the voltage Vin and the voltage Vout are equal to each other.

The first differential circuit 21 and the first output stage 30 perform the following operations when the switches 521, 531, and 532 are turned on.

When the voltage Vin is shifted to a higher voltage from the initial state, a drain current of the NMOS transistor 213 of the differential pair of NMOS transistors 213 and 214 is increased, an output voltage (drain terminal voltage of the NMOS transistor 213) of the first differential circuit 21 decreases rapidly, a gate voltage of the PMOS transistor 311 is reduced, and the voltage Vout of the output terminal 2 is increased by the charging operation of the PMOS transistor 311 (current supply from the power source VDD to the output terminal 2).

And then, as the output voltage Vout increases, a drain current of the NMOS transistor 214 of the differential pair of NMOS transistors 213 and 214 is increased, a drain current of the NMOS transistor 213 decreases, and an output voltage of the first differential circuit 21 (drain voltage of the NMOS transistor 213) also starts increasing from a temporarily lowered level.

Therefore, since a voltage between the gate and the source of the PMOS transistor 311 is lower, a current applied to the PMOS transistor 311 is reduced and the influence of the charging operation is also reduced immediately.

When the output voltage Vout increases to around the input voltage Vin, a voltage between the gate and the source of the PMOS transistor 311 reaches its threshold voltage level, the PMOS transistor 311 is turned off, and the charging operation is suspended.

Even when the output voltage of the first differential circuit 21 further increases, a voltage between the gate and source of the PMOS transistor 311 is at or lower than the threshold voltage. Thus, the charging operation remains suspended.

Since the constant current circuit 321 discharges a constant current from the output terminal 2 to a low-potential side power source VSS, when the output voltage Vout is higher than the voltage Vin due to overcharging, the PMOS transistor 311 is turned off and the charging operation is suspended. Hence, the output voltage Vout is reduced by the constant current circuit 321.

And then, when the output voltage Vout decreases to around the input voltage Vin, the PMOS transistor 311 is turned on again to start the charging operation. At this moment, the first differential circuit 21 and the first output stage 30 are delayed in their responses to a change in the output voltage Vout. Thus, the charging operation and the discharging operation are performed alternately. Although the output voltage Vout converges in the end, oscillation (vibration) may continue for a long time around the voltage Vin.

In order to reduce oscillation (vibration) to a sufficiently low level, the constant current circuit 321 is set at current of a sufficiently low level. Therefore, even when the PMOS transistor 311 performs a charging operation at high speed, the discharging operation of the constant current circuit 321 is slow. Hence, it is possible to reduce oscillation (vibration) to a small change around the voltage Vin.

Meanwhile, when the voltage Vin is changed to a voltage lower than the voltage Vout from the initial state, the output voltage of the first differential circuit 21 is increased to raise a gate voltage of the PMOS transistor 311 to the side of the first source potential VDD, and the PMOS transistor 311 is turned off to suspend the charging operation.

Therefore, the constant current circuit 321 operates to reduce the output voltage Vout. When a sufficiently low level of current is set, the output voltage Vout cannot be varied immediately.

As described above, the first differential circuit 21 and the first output stage 30 can set the output voltage Vout to a level sufficiently close to the voltage Vin when the voltage Vin is changed from the voltage Vout to a higher voltage.

Besides, the first differential circuit 21 and the second output stage 30 do not have a phase compensating capacity. Hence, it is possible to quickly operate the PMOS transistor 311 even when a current level of the constant current circuit 215 is set at a sufficiently low level.

Therefore, the response of the PMOS transistor 311 is fast with respect to a change in the output voltage Vout, and overcharging can be reduced to a sufficiently low level. Namely, since a phase compensating capacity is not provided, the response of the first differential circuit 21 and the PMOS transistor 311 with respect to a change in the output voltage Vout is increased and overcharging is reduced, and the constant current circuit 321 is set at a sufficiently low level of current. Thus, it is possible to reduce oscillation (vibration) to a small change.

Moreover, it is also possible to decrease power consumption by reducing the constant current circuits 321 and 215 to a sufficiently low level of current.

Additionally, it is only necessary for the first differential circuit 21 and the first output stage 30 to immediately precharge the output voltage Vout to a level sufficiently close to the voltage Vin. Even if a low level of oscillation (vibration) remains, no serious problem occurs.

Next, the following will discuss the operations of the second differential circuit 22 and the second output stage 40 in Embodiment 2 of the present invention. Hereinafter, an initial state refers to the case where the voltage Vin and the voltage Vout are equal to each other.

When the switches 522, 541, and 542 are turned on, the second differential circuit 22 and the second output stage 40 perform the following operations.

In the case where the voltage Vin is varied to a lower voltage from the initial state, the output voltage of the second differential circuit 22 increases rapidly to increase a gate voltage of the NMOS transistor 411 to the first power source VDD, the NMOS transistor 411 is turned on, and the voltage Vout of the output terminal 2 is reduced to the side of the second power source VSS due to the discharging operation.

And then, when the voltage Vout decreases, the output voltage of the second differential circuit 22 also starts decreasing from a temporarily increased level. Hence, since a voltage is reduced between the gate and source of the NMOS transistor 411, a current applied to the NMOS transistor 411 decreases and the influence of the discharging operation is also reduced.

When the voltage Vout is lowered to around the voltage Vin, a voltage between the gate and source of the NMOS transistor 411 reaches a level of a threshold voltage, the NMOS transistor 411 is turned off, and the discharging operation is suspended. Even when an output voltage of the second differential circuit 22 is further reduced, the discharging operation remains suspended because a voltage between the gate and source of the NMOS transistor 411 is at or lower than a threshold voltage.

The constant current circuit 421 charges a constant current to the output terminal 2 from the first power source VDD. Thus, when the output voltage Vout is lower than the voltage Vin due to over discharging, the NMOS transistor 411 is turned off and the discharging operation is suspended. Hence, the constant current circuit 421 raises the voltage Vout.

And then, when the output voltage Vout rises to around the voltage Vin, the NMOS transistor 411 is turned on again to start the discharging operation. In this case as well, the second differential circuit 22 and the second output stage 40 are delayed in their responses to a change in the output voltage Vout. Hence, the charging and the discharging operation are alternately performed. Although the output voltage Vout converges in the end, oscillation (vibration) may continue for a long time around the voltage Vin.

In order to reduce oscillation to a sufficiently low level, the constant current circuit 421 is set at a sufficiently low level of current. Therefore, even when the NMOS transistor 411 performs the discharging operation at high speed, it is possible to reduce oscillation to a low level of change around the voltage Vin because the charging operation of the constant current circuit 421 is gentle.

Meanwhile, when the input voltage Vin is changed to a voltage higher than the output voltage Vout from the initial state, the output voltage of the second differential circuit 22 is reduced, a gate voltage of the NMOS transistor 411 is reduced, the NMOS transistor 411 is turned off, and the discharging operation is suspended.

Therefore, the constant current circuit 421 operates to increase the output voltage Vout. When setting is made at a sufficiently low level of current, it is not possible to change the output voltage Vout immediately.

As described above, the second differential circuit 22 and the second output stage 40 can set the output voltage Vout at a level sufficiently close to the input voltage Vin when the input voltage Vin is changed to a voltage lower than the output voltage Vout.

Besides, the second differential circuit 22 and the second output stage 40 do not have a phase compensating capacity. Hence, even when a current level of the constant current circuit 225 is set at a sufficiently low level, it is possible to operate the NMOS transistor 411 immediately.

Therefore, the response of the NMOS transistor 411 with respect to a change in the output voltage Vout is fast and overcharging can be reduced to a sufficiently low level. Namely, since a phase compensating capacity is not provided, the response of the second differential circuit 22 and the NMOS transistor 411 is hastened with respect to a change in the output voltage Vout to reduce over discharging, and the constant current circuit 421 is set at a sufficiently low level of current. Hence, it is possible to reduce oscillation (vibration) to a small change.

Further, it is possible to reduce power consumption by reducing the constant current circuits 421 and 225 to a sufficiently small current level. Besides, the second differential circuit 22 and the second output stage 40 only need to immediately predischarge the output voltage Vout to a level sufficiently close to the output voltage Vin. Even if a low level of oscillation (vibration) remains, no serious problem occurs.

Next, the following will discuss the operation of the precharge/predischarge circuit 20 in response to an operation control signal according to Embodiment 2 of the present invention.

The first differential circuit 21, the first output stage 30, the second differential circuit 22, and the second output stage 40 of the precharge/predischarge circuit 20 include the switches 521, 531, 532, 522, 541 and 542 for interrupting current, respectively. In response to an operation control signal, the turning on/off of the switches is controlled and the operation and non-operation of the precharge/predischarge circuit 20 are controlled.

When the precharge/predischarge circuit 20 is brought into non-operation, idling current is entirely interrupted to eliminate power consumption. At this moment, the voltage Vin and the voltage Vout are not affected.

Further, an operation control signal exercises control such that during the operation of the precharge/predischarge circuit 20 as well, when the first differential circuit 21 and the first output stage 30 or the second differential circuit 22 and the second output stage 40 are operated, at least the other circuit and the stage are suspended.

In Embodiment 2 of the present invention, such control is exercised for the following reason: when the PMOS transistor 311 and the NMOS transistor 411 are operated at the same time, since the transistors can operate with high current supplying capability, a large level of oscillation occurs and power consumption rises.

When at least one of the first output stage 30 and the second output stage 40 is operated, the other stage is brought into non-operation. Hence, it is possible to immediately precharge/predischarge the output voltage Vout to around the voltage Vin.

Next, in Embodiment 2 of the present invention, the following will discuss the operation of the driving circuit, which includes the precharge/predischarge circuit 20 and the output circuit 10, in response to an operation control signal.

The precharge/predischarge circuit 20 can rapidly change the voltage Vout of the output terminal 2 to around the voltage Vin but cannot supply high-accuracy voltage output with stability. Thus, the output circuit 10 being capable of high-accuracy voltage output is combined and used. Any conventional driving circuit is applicable as the output circuit 10. During an arbitrary output period, when a capacitive load is driven to a desired voltage Vin, the precharge/predischarge circuit 20 is operated and rapidly driven to around the voltage Vin in response to an operation control signal in the first half of an output period. During the last half of the output period, the precharge/predischarge circuit 20 is brought into non-operation and is driven to the voltage Vin with high voltage accuracy by the operation of the output circuit 10.

The output circuit 10 is brought into the operation or non-operation according to circuit characteristics in the first half of the output period for operating the precharge/predischarge circuit 20. Further, instead of non-operation, a means may be provided for interrupting the output circuit 10 from the input terminal 1 and the output terminal 2.

With the above driving operation, as the output circuit, it is possible to adopt a driving circuit with reduced current supplying capability if voltage output is possible with high accuracy.

Besides, the precharge/predischarge circuit 20 is a circuit for precharging and predischarging the output voltage Vout to a level sufficiently close to the voltage Vin. It is not always necessary to have voltage output with high accuracy. Thus, it is possible to readily prepare a design without the necessity for a stringent design. Therefore, in the event of some variations in threshold voltages of the transistors, a design can be prepared. In this case, although some variations are found in voltage driven by precharging and predischarging, high-speed driving is possible with high voltage accuracy by combining the output circuit 10 being capable of driving with high voltage accuracy. Further, as for the PMOS transistor 311 or the NMOS transistor 411, it is possible to speed up the charging operation and the discharging operation by increasing a ratio of a channel width W to a channel length L (W/L ratio).

Moreover, even when the operation and non-operation of the precharge/predischarge circuit 20 are switched in a short period, the first differential circuit 21, the first output stage 30, the second differential circuit 22, and the second output stage 40 can rapidly operate with a low level of current. Hence, the operation can be started immediately without increasing power consumption. Therefore, the precharge/predischarge circuit 20 can operate at high speed with low power consumption.

As described above, the driving circuit of FIG. 8 can perform high-speed driving to around a desired voltage by the precharge/predischarge circuit 20, and can realize high-accuracy output, high-speed driving, and low power consumption by using the output circuit 10 having reduced current supplying capability with high accuracy.

Figure 9:
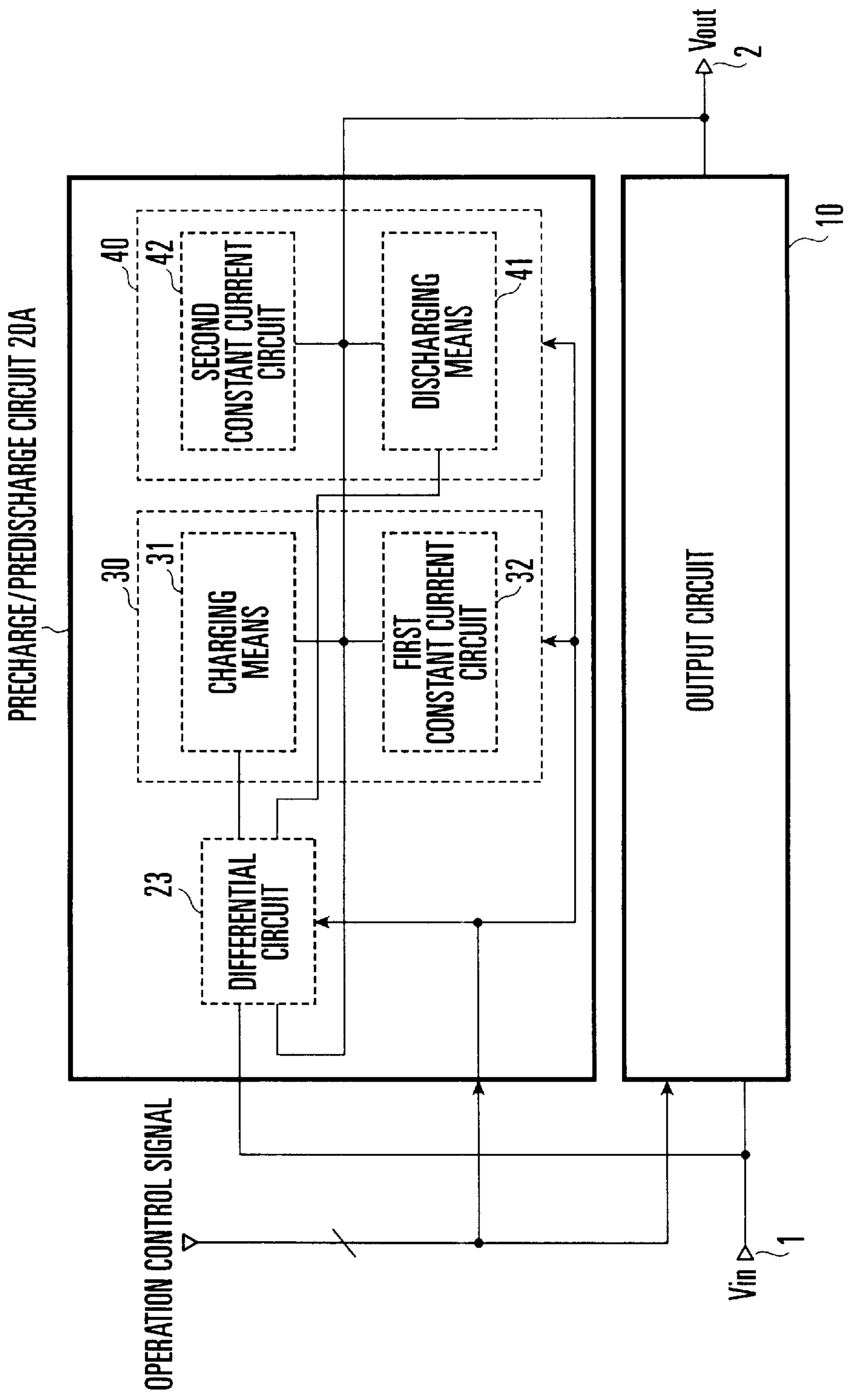
FIG. 9 is a block diagram showing Embodiment 3 of a driving circuit of the present invention.

FIG. 9 is a diagram showing the configuration of Embodiment 3 of the present invention. In Embodiment 3 of the present invention, a modification is made on the configuration of the precharge/predischarge circuit 20 of Embodiment 1 shown in FIG. 7.

The precharge/predischarge circuit 20 of Embodiment 1 is configured such that the two output stages are respectively provided with a differential circuit. Meanwhile, in Embodiment 3 of the present invention, a precharge/predischarge circuit 20A is provided with a single differential circuit 23 which operates for two output stages 30 and 40.

Referring to FIG. 9, the driving circuit includes an input terminal 1, an output terminal 2, an output circuit 10 for receiving a voltage Vin of the input terminal 1 and for outputting a desired voltage to the output terminal 2, and the precharge/predischarge circuit 20A which can rapidly change the voltage Vout of the output terminal 2 to around a desired voltage. The operation and non-operation of the precharge/predischarge circuit 20A and the output circuit 10 are controlled by an operation control signal, which is produced by the circuit (not shown) as described in Embodiments 1 and 2.

The precharge/predischarge circuit 20A is provided with the differential circuit 23, the first output stage 30, and the second output stage 40.

The first output stage 30 has a charging means 31 and a first constant current circuit 32. The second output stage 40 has a discharging means 41 and a second constant current circuit 42.

The precharge/predischarge circuit 20A has a feedback structure. A differential circuit 23 operates according to a change in voltage difference between the voltage Vin and the voltage Vout, the charging means 31 and the discharging means 41 also operates in response to the output to change the output voltage Vout. The differential circuit 23 is provided with at least a single output for operating the charging means 31 and the discharging means 41. A plurality of different outputs may be provided.

The charging means 31 operates to increase the output voltage Vout with high current supplying capability, and the discharging means 41 operates to reduce the output voltage Vout with high current supplying capability.

Also, the first constant current circuit 32 operates to increase the output voltage Vout with a constant current supplying capability. The second constant current circuit 42 operates to increase the output voltage Vout with a constant current supply capability. In Embodiment 3 of the present invention as well, the precharge/predischarge circuit 20A has a feedback structure but is not provided with a phase compensating means.

Next, the following will discuss the operation of the precharge/predischarge circuit 20A by an operation control signal.

The differential circuit 23, the first output stage 30 (charging means 31, first constant current circuit 32) and the second output stage 40 (discharging means 41, second constant current circuit 42) of the precharge/predischarge circuit 20A respectively include switches for interrupting current. In response to an operation control signal, on-off control of the switches is exercised to control the operation and non-operation of the precharge/predischarge circuit 20A. Therefore, it is possible to eliminate power consumption when the precharge/predischarge circuit 20A is brought into non-operation.

Moreover, during the operation of the precharge/predischarge circuit 20A, when an operation control signal operates the first output stage 30 (charging means 31, first constant current 32) or the second output stage 40 (discharging means 41, second constant current circuit 42), the operation control signal brings the other stage into non-operation.

Hence, in the operation of the precharge/predischarge circuit 20A, the differential circuit 23 and the first output stage 30 are operated or the differential circuit 23 and the second output stage 40 are operated.

This operation is the same as that of Embodiment 1 shown in FIG. 7, in which the first differential circuit 21 and the first output stage 30 of the precharge/predischarge circuit 20 are operated or the second differential circuit 22 and the second output stage 40 are operated.

Therefore, the precharge/predischarge circuit 20A of Embodiment 3 shown in FIG. 9 has the same effect as the precharge/predischarge circuit 20 shown in FIG. 7. Namely, in Embodiment 3 of the present invention, in the case where the differential circuit 23 and the first output stage 30 are operated, when the voltage Vout is lower than a desired voltage, the charging means 31 raises the output voltage Vout to around a desired voltage with high current supplying capability in the precharge/predischarge circuit 20A.

Further, in the case where the differential circuit 23 and the second output stage 40 are operated, when the voltage Vout is higher than a desired voltage, the discharging means 41 reduces the output voltage Vout to around a desired voltage with high current supplying capability.

According to Embodiment 3 of the present invention, since a phase compensating means is not provided, it is possible to speed up the response to a change in the output voltage Vout and to immediately bring the output voltage Vout to around a desired voltage. Further, overcharging or overdischarging can be reduced. Moreover, since the first constant current circuit 32 and the second constant current circuit 42 are set at a sufficiently low level of current, it is possible to reduce oscillation (vibration) to a low level of change.

Additionally, since the first constant current circuit 32 and the second constant current circuit 42 are reduced to a sufficiently low level of current, power consumption can be also reduced. Besides, the precharge/predischarge circuit 20A only needs to immediately precharge/predischarge the output voltage Vout to a level sufficiently close to a desired voltage. Even if a sufficiently low level of oscillation (vibration) remains, no serious problem occurs.

Also, the differential circuit 23 includes a constant current circuit for controlling idling current. Hence, current applied to the differential circuit 23, the first output stage 30, and the second output stage 40 is controlled by the constant current circuits. Low power consumption can be achieved in the precharge/predischarge circuit 20A by setting idling current at a sufficiently low level. As described above, even when idling current is sufficiently reduced, a high-speed operation is possible. Further, the differential circuit 23, the first output stage 30, and the second output stage 40 respectively include switches controlled by an operation control signal. Since idling current is interrupted by controlling the switches, the operation of the precharge/predischarge circuit can be suspended. Additionally, in the case where the operation and non-operation of the precharge/predischarge circuit are frequently switched, a high-speed operation is possible and power consumption is not increased by switching the operation and non-operation.

Next, the following will describe the operation of the driving circuit, which includes the precharge/predischarge circuit 20A and the output circuit 10, by an operation control signal in Embodiment 3 of the present invention.

The precharge/predischarge circuit 20A can rapidly change the voltage Vout of the output terminal 2 to around a desired voltage but cannot supply high accuracy voltage output with stability. Thus, the output circuit 10 being capable of high-accuracy voltage output is combined. Additionally, as the output circuit 10, any conventional driving circuit is applicable.

In the case where a capacitive load is driven to a desired voltage in an arbitrary output period, the precharge/predischarge circuit 20A is operated by an operation control signal in the first half of the output period to rapidly drive the capacitive load to around a desired voltage. In the last half of the output period, the precharge/predischarge circuit 20A is brought into non-operation, and the operation of the output circuit 10 drives the capacitive load to a desired voltage with high voltage accuracy.

The output circuit 10 brings the precharge/predischarge circuit 20A into operation or non-operation according to circuit characteristics in the first half of the output period.

Moreover, in stead of non-operation, a means may be provided for interrupting the output circuit 10 from the input terminal 1 and the output terminal 2.

With the above driving, as the output circuit 10, a driving circuit with reduced current supplying capability is applicable as long as voltage output is possible with high accuracy.

As described above, in the driving circuit of FIG. 9, the precharge/predischarge circuit 20A can achieve high-speed driving to around a desired voltage. With the output circuit 10 being capable of high-accuracy voltage output is used with reduced current supplying capability, it is possible to achieve high-accuracy output, high-speed driving, and low power consumption.

Figure 10:
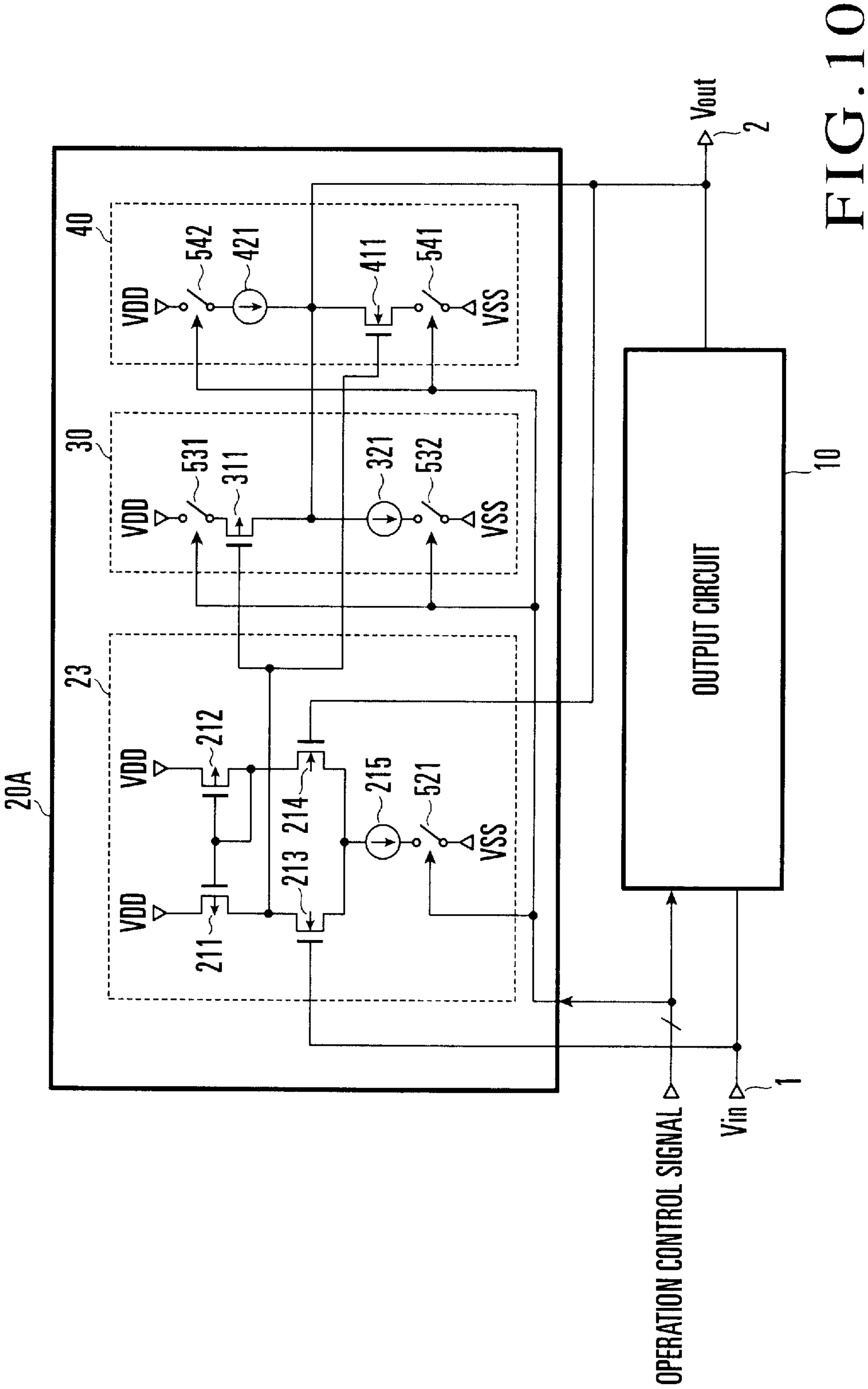
FIG. 10 is a diagram showing the configuration of a driving circuit according to Embodiment 4 of the present invention and a specific circuit configuration of a precharge/predischarge circuit 20A of FIG. 8.

FIG. 10 is a diagram showing the configuration of a driving circuit according to Embodiment 4 of the present invention and a specific example of the precharge/predischarge circuit 20A in the driving circuit of FIG. 9.

Referring to FIG. 10, the precharge/predischarge circuit 20A is a circuit for rapidly precharging and predischarging the output voltage Vout to a voltage level sufficiently close to the voltage Vin when the voltage Vin is applied to the input terminal 1.

In FIG. 10, the precharge/predischarge circuit 20A is constituted by a differential circuit 23, a first output stage 30, and a second output stage 40. Further, the first output stage 30 includes a charging means (311) and a first constant current circuit (321), and the second output stage 40 includes a discharging means (411) and a second constant current circuit (421). The above configuration will be further discussed.

The differential circuit 23 is constituted by a current mirror circuit composed of PMOS transistors 211 and 212, a differential pair of 213 and 214 composed of NMOS transistors being equal in size, and a constant current circuit 215.

In the current mirror circuit, the gate and the drain of the PMOS transistor 212 are connected in common. A voltage Vin of an input terminal 1 and a voltage Vout of an output terminal 2 are respectively inputted to the gates of the NMOS transistors 213 and 214. And a drain voltage of the differential NMOS transistor 213 is used as an output of the differential circuit 23. The differential circuit 23 is identical in configuration to the differential circuit 21 shown in FIG. 8, the output of the differential circuit 23 is commonly supplied to the charging means 31 and the discharging means 41.

Further, the first output stage 30 includes the PMOS transistor 311 as a charging means 31. The drain of the PMOS transistor 311 is connected to the output terminal 2, the output voltage of the differential circuit 23 is inputted to the gate of the transistor, a source voltage VDD is supplied to the source of the transistor via the switch 531. As the first constant current circuit 32 (see FIG. 3), the first constant current circuit 321 is provided to control current applied between the output terminal 2 and the source supply VSS (VSS<VDD).

In the second output stage 40, the NMOS transistor 411 is provided as the discharging means 41. The drain of the NMOS transistor 411 is connected to the output terminal 2, an output voltage of the second differential circuit 22 is inputted to the gate of the transistor and the source is connected to the second source voltage VSS. Further, the constant current circuit 421 is provided as the second constant current circuit 42 (FIG. 3) to control current applied between the output terminal 2 and the source voltage VDD. The first output stage 30 and the second output stage 40 are also identical to those of FIG. 8.

Moreover, the differential circuit 23, the first output stage 30, and the second output stage 40 includes switches 522, 531, 532, 541, and 542 that are controlled by an operation control signal. When the switches are turned off, current is interrupted and the operation is suspended. Besides, the precharge/predischarge circuit 20 has a feedback structure but does not have a phase compensation capacity.

Also, it is preferable that a threshold voltage of the PMOS transistor 311 is sufficiently close to a threshold voltage of the transistor constituting the current mirror circuit (211, 212). Meanwhile, it is preferable that a voltage between the gate and source of the NMOS transistor 411 is sufficiently close to a threshold voltage at an output voltage of the differential circuit when the voltage Vin and the voltage Vout are equal to each other.

Next, the following will discuss the operation of the precharge/predischarge circuit 20A according to Embodiment 4 of the present invention.

The operation of the precharge/predischarge circuit 20A is controlled by an operation control signal as shown in FIG. 9 and the differential circuit 23 always operates during the operation of the precharge/predischarge circuit 20A. Control is exercised such that when one of the first output stage 30 and the second output stage 40 is operated, the other is suspended. First, the operation of the differential circuit 23 and the first output stage 30 will be described.

Hereinafter, an initial state will refer to a state in which the voltage Vin and the voltage Vout are equal to each other.

Figure 2:
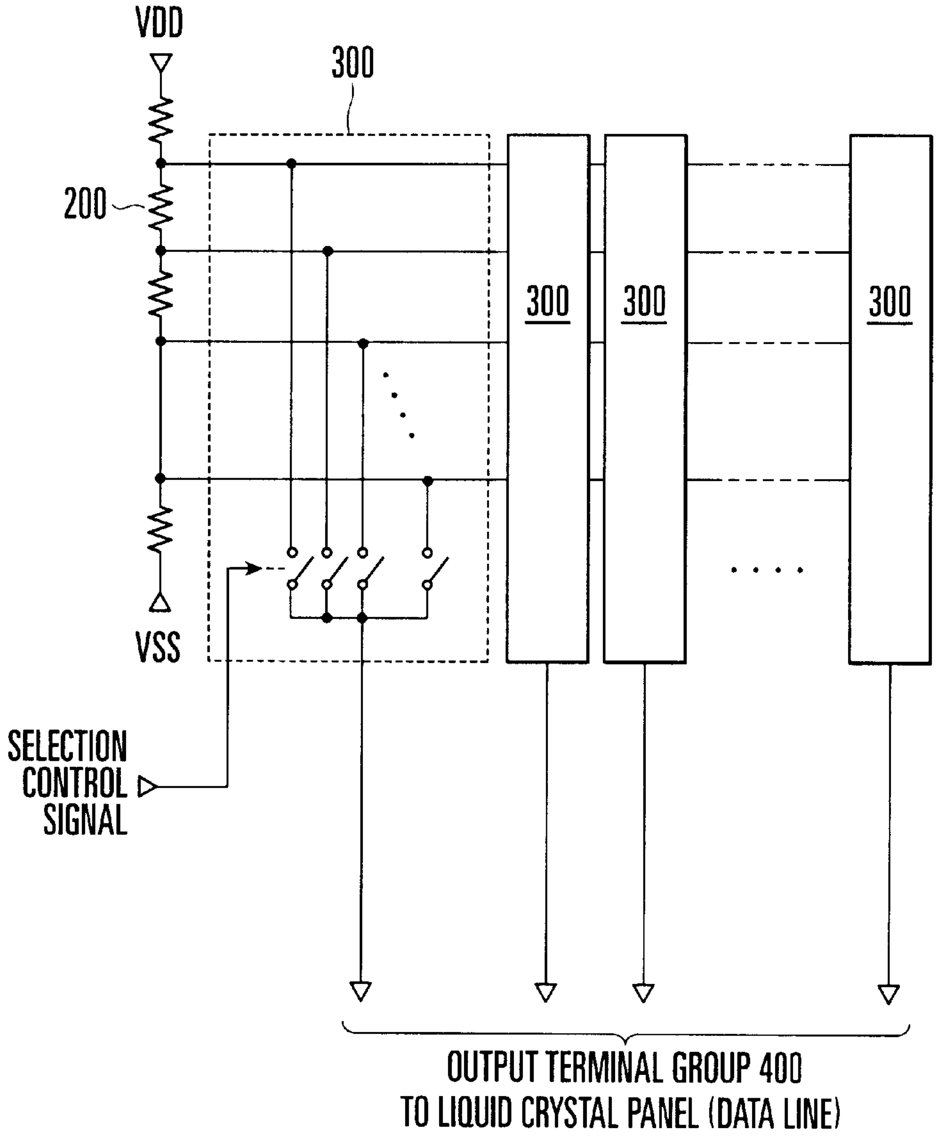
FIG. 2 PRIOR ART
FIG. 2 is a diagram showing the configuration of a conventional driving circuit for directly supplying charge from a resistor string to a capacitive load.

The differential circuit 23 and the first output stage 30 performs the following operations. The differential circuit 23 performs the same operation as the differential circuit 21 of FIG. 2. When the voltage Vin is changed to a higher voltage from the initial state, an output voltage of the differential circuit 23 decreases rapidly and reduces a gate voltage of the PMOS transistor 311 of the first output stage 30. Hence, the PMOS transistor 311 performs the charging operation and the voltage Vout is raised to the side of the first power source VDD. And then, when the voltage Vout increases, an output voltage of the differential circuit 23 also starts increasing from a level which is reduced temporarily.

Thus, a voltage between the gate and source of the PMOS transistor 311 is smaller, so that the influence of the charging operation decreases immediately.

When the output voltage Vout rises to around the input voltage Vin, a voltage between the gate and source of the PMOS transistor 311 reaches a threshold voltage and the charging operation is suspended.

Even when an output voltage of the differential circuit 23 further increases, a voltage between the gate and source of the PMOS transistor 311 is at or lower than a threshold value. Thus, the charging operation remains suspended.

The constant current circuit 321 discharges a constant current from the output terminal 2 to the second power source VSS. Hence, when the output voltage Vout is higher than the voltage Vin due to overcharging, the charging operation is suspended. Thus, the output voltage Vout is decreased by the constant current circuit 321.

And then, when the output voltage Vout is reduced to around the voltage Vin, the PMOS transistor 311 is turned on again and the charging operation is performed. At this moment, the differential circuit 23 and the first output stage 30 are delayed in their responses to a change in the output voltage Vout. Thus, the charging operation and the discharging operation are alternately performed. Although the output voltage Vout converges in the end, oscillation (vibration) may continue around the voltage Vin for a long time.

In order to reduce oscillation (vibration) to a sufficiently low level, the constant current circuit 321 is set at a sufficiently low level of current. Thus, even when the charging operation is rapidly performed by the PMOS transistor 311, the influence of the discharging operation by the constant current circuit 321 is small. Hence, it is possible to reduce oscillation (vibration) to a small change at around the voltage Vin.

Meanwhile, when the voltage Vin is changed to a lower voltage than the voltage Vout from the initial state, an output voltage of the differential circuit 23 is increased to raise a gate voltage of the PMOS transistor 311 in the first output stage 30. Hence, the PMOS transistor 311 of the first output stage 30 is turned off and the charging operation is suspended. Therefore, the constant current circuit 321 reduces the output voltage Vout. When setting is made at a sufficiently low level of current, it is not possible to change the output voltage Vout immediately.

As described above, when the voltage Vin is changed to a voltage higher than the voltage Vout, it is possible for the differential circuit 23 and the first output stage 30 to bring the output voltage Vout to a level sufficiently close to the voltage Vin.

Besides, since neither the differential circuit 23 nor the first output stage 30 has a phase compensating capacity, even when a current level of the constant current circuit 215 is set at a sufficiently low level, it is possible to immediately operate the PMOS transistor 311.

Therefore, the response of the PMOS transistor 311 is fast with respect to a change in the output voltage Vout and overcharging can be reduced to a sufficiently low level. Namely, since a phase compensating capacity is not provided, the response of the differential circuit 23 and the PMOS transistor 311 is increased with respect to a change in the output voltage Vout to reduce overcharging and the constant current circuit 321 is set at a sufficiently low level of current. Hence, it is possible to reduce oscillation (vibration) to a low level of change.

Besides, since the constant current circuits 215 and 321 are reduced to a sufficiently low level of current, it is possible to reduce power consumption.

Additionally, the precharge/predischarge circuit 20A only needs to immediately precharge the output voltage Vout to a level sufficiently close to the voltage Vin. Even if a sufficiently low level of oscillation (vibration) remains on the output voltage Vout of the differential circuit 23 and the first output stage 30, no serious problem occurs.

Next, the following will discuss the case where the differential circuit 23 and the second output stage 40 are operated according to Embodiment 4 of the present invention.

When the voltage Vin is changed to a lower voltage from the initial state, an output voltage of the differential circuit 23 is increased. Thus, a gate voltage of the NMOS transistor 411 of the second output stage 40 is increased, and the voltage Vout is lowered due to the discharging operation of the NMOS transistor 411.

And then, when the output voltage Vout decreases, an output voltage of the differential circuit 23 also starts decreasing from a temporarily increased level. Accordingly, since a voltage between the gate and source of the NMOS transistor 411 is reduced, the influence of the discharging operation is reduced immediately.

When the output voltage Vout decreases to around the input voltage Vin, a voltage between the gate and source of the NMOS transistor 411 reaches a threshold voltage and the discharging operation is suspended.

Even when an output voltage of the differential amplifier circuit 23 is further reduced, a voltage between the gate and source of the NMOS transistor 411 is at or lower than a threshold voltage. Hence, the discharging operation remains suspended. The constant current circuit 421 charges a constant current to the output terminal from the source voltage VDD. Thus, when the output voltage Vout is lower than the voltage Vin due to over discharging, the discharging operation is suspended. Hence, the output voltage Vout is increased by the constant current circuit 421.

And then, when the output voltage Vout rises to around the input voltage Vin, the NMOS transistor 411 is turned on again and the discharging operation is performed. In this case as well, the differential circuit 23 and the second output stage 40 are delayed in their responses to a change in the output voltage Vout. Hence, the charging operation and the discharging operation are performed alternately. Although the output voltage Vout converges in the end, oscillation (vibration) may continue at around the voltage Vin for a long time. In order to reduce the oscillation to a sufficiently low level, the constant current circuit 421 is set at a sufficiently low level of current. Thus, even when the discharging operation is rapidly performed by the NMOS transistor 411, the influence of the charging operation by the constant current circuit 421 is small. Hence, it is possible to reduce oscillation (vibration) to a low level of change at around the voltage Vin.

Meanwhile, when the voltage Vin is changed to a voltage higher than the voltage Vout from the initial state, an output voltage of the differential circuit 23 decreases. Accordingly, the NMOS transistor 411 of the second output stage 40 is turned off and the discharging operation is suspended.

Therefore, the constant current circuit 421 operates to raise the output voltage Vout to the side of the first power source VDD. When setting is made at a sufficiently low level of current, it is not possible to immediately change the output voltage Vout.

As described above, when the voltage Vin is changed to a voltage lower than the voltage Vout, the differential circuit 23 and the second output stage 40 can bring the output voltage Vout to a level sufficiently close to the voltage Vin.

Besides, since the differential circuit 23 and the second output stage 40 does not have a phase compensating capacity, even when a current level of the constant current circuit 215 is set at a sufficiently low level, it is possible to immediately operate the NMOS transistor 411.

Therefore, the response of the NMOS transistor 411 is fast with respect to a change in the output voltage Vout and over discharging can be reduced to a sufficiently low level. Namely, in Embodiment 4 of the present invention, since a phase compensating capacity is not provided, the response of the differential circuit 23 and the NMOS transistor 411 is increased with respect to a change in the output voltage Vout, overdischarging is reduced, and the constant current circuit 421 is set at a sufficiently low level of current. Hence, it is possible to reduce oscillation (vibration) to a low level of change.

Additionally, since the constant current circuits 215 and 421 are reduced to a sufficiently low level of current, it is possible to reduce power consumption.

Besides, the precharge/predischarge circuit 20A only needs to immediately predischarge the output voltage Vout to a level sufficiently close to the voltage Vin. Even when a sufficiently low level of oscillation (vibration) remains on the output voltage Vout of the differential circuit 23 and the second output stage 40, no serious problem occurs.

Next, the following will discuss the operation of the precharge/predischarge circuit 20A by an operation control signal according to Embodiment 4 of the present invention.

The differential circuit 23, the first output stage 30, and the second output stage 40 of the precharge/predischarge 20A include the switches 521, 531, 532, 541, and 542 for interrupting current and an operation control signal exercise on-off control on the switches to control the operation and non-operation of the precharge/predischarge circuit 20. Thus, when the precharge/predischarge circuit 20A is brought into non-operation, idling current is interrupted completely to eliminate power consumption. This operation does not affect the input voltage Vin and the output voltage Vout.

During the operation of the precharge/predischarge circuit 20A as well, an operation control signal exercises control such that when one of the first output stage 30 and the second output stage 40 operates, at least the other stage is suspended. Hence, precharging/predischarging can be performed immediately without causing large oscillation until the output voltage Vout reaches around the input voltage Vin.

Next, according to Embodiment 4 of the present invention, the following will discuss the driving circuit which is driven by an operation control signal and includes the precharge/predischarge circuit 20A and the output circuit 10.

The precharge/predischarge circuit 20A can rapidly change the output voltage Vout of the output terminal 2 to around the voltage Vin but cannot supply high-accuracy voltage output with stability. Therefore, the output circuit 10 being capable of high-accuracy voltage output is combined and used. Additionally, any conventional driving circuit is applicable as the output circuit 10.

When a capacitive load is driven to a desired voltage Vin in an arbitrary output period, the precharge/predischarge circuit 20 is operated by an operation control signal in the first half of the output period and is rapidly driven to around the voltage Vin. In the last half of the output period, the precharge/predischarge circuit 20A is brought into non-operation and is driven to the voltage Vin by the operation of the output circuit 10 with high voltage accuracy.

Besides, the output circuit 10 sets operation or non-operation according to circuit characteristics in the first half of the output period in which the precharge/predischarge 20A is operated. Further, instead of non-operation, a means may be provided for interrupting the output circuit 10 from the input terminal 1 and the output terminal 2.

With the above driving operation, it is possible to adopt a driving circuit having reduced current supplying capability if voltage output is possible with high accuracy.

The precharge/predischarge circuit 20A is a circuit for precharging and predischarging the output voltage Vout to a level sufficiently close to the input voltage Vin, and high-accuracy voltage output is not always necessary. Thus, it is possible to readily prepare a design without the necessity for a stringent design. Therefore, in the event of some variations in threshold voltages of the transistors, a design can be prepared.

In this case, although some variations are found in voltage driven by precharging and predischarging, high-speed driving is possible with high voltage accuracy by combining the output circuit 10 being capable of driving with high voltage accuracy.

Further, as for the PMOS transistor 311 or the NMOS transistor 411, it is possible to speed up the charging operation and the discharging operation by increasing a ratio of a channel width W to a channel length L (W/L ratio).

Moreover, even when the operation and non-operation of the precharge/predischarge circuit 20A are switched in a short period, the differential circuit 23, the first output stage 30, and the second output stage 40 can rapidly operate with a low level of current. Hence, the operation can be started immediately without increasing power consumption. Therefore, the precharge/predischarge circuit 20 can operate at high speed with low power consumption.

As described above, the driving circuit of Embodiment 4 of the present invention that is shown in FIG. 10 can perform high-speed driving to around a desired voltage by the precharge/predischarge circuit 20A, and can realize high-accuracy output, high-speed driving, and low power consumption by using the output circuit 10 having reduced current supplying capability with high accuracy.

It is certain that the differential circuit 23 is identical in configuration to the differential circuit 22 of FIG. 8 and has the same functions and effects. Further, FIG. 10 shows an example in which the output voltage of the differential circuit 23 is shared. The output voltage affects the charging means 31 and the discharging means 41. The differential circuit 23 may be provided with a plurality of different output voltages that respectively operates the charging means 31 and the discharging means 41.

Figures 11A, 11B, 12:
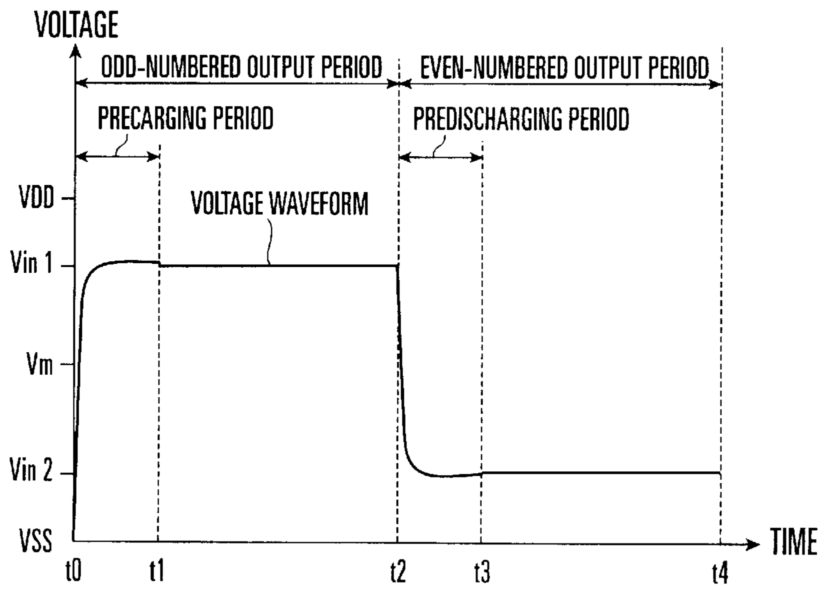
FIG. 11A is a diagram showing a method of controlling the driving circuit shown in FIG. 8.
FIG. 11B is an output voltage waveform diagram of the driving circuit.
FIG. 12 is a diagram showing a method of controlling the driving circuit shown in FIG. 10.

FIGS. 11A and 11B are diagrams showing a specific example of a method of driving the driving circuit shown in FIG. 8. Namely, FIG. 11A shows a control method for controlling the switches of the precharge/predischarge circuit 20 and the output circuit 10. FIG. 11B shows a voltage waveform of the output voltage Vout during two output periods of the control shown in FIG. 11A. A voltage applied to the input terminal 1 is Vin1 in an arbitrary odd-numbered output period and the voltage is Vin2 in an even-numbered output period.

The above diagrams show a driving method for driving a voltage between an arbitrary intermediate voltage Vm and the voltage VDD inclusive in an odd-numbered output period and for driving a voltage less than Vm or a voltage at or higher than VSS in an even-numbered output period.

In the driving method shown in FIGS. 11A and 11B, odd-numbered and even-numbered output periods (time t0 to t2 and time t2 to t4) each have a precharging/predischarging periods (time t0 to t1 and time t2 to t3) in the first half.

In the precharging/predischarging periods (time t0 to t1) of the odd-numbered output periods, the voltage Vout is increased. Thus, the switches 521, 531, and 532 (FIG. 8) are turned on, the first differential circuit 21 and the first output stage 30 are operated, the switches 522, 541, and 542 are turned off, and the second differential circuit 22 and the second output stage 40 are suspended. Hence, the voltage Vout is rapidly raised to around the voltage Vin1.

After the precharging/predischarging periods, the switches 521, 531, and 532 are turned off, and the first differential circuit 21 and the first output stage 30 are also suspended.

And then, the voltage Vout precharged to around the voltage Vin1 is driven to the voltage Vin1 by the output circuit 10 with high voltage accuracy.

Meanwhile, in the precharging/predischarging periods (time t2 to t3) of the even-numbered output periods, the output voltage Vout is reduced. Hence, the switches 522, 541, and 542 (FIG. 8) are turned on, the second differential circuit 22 and the second output stage 30 are operated, the switches 521, 531, and 532 are turned off, and the first differential circuit 21 and the first output stage 30 are suspended. Thus, the output voltage Vout is rapidly reduced to around the voltage Vin2.

After the precharging/predischarging periods, the switches 522, 541, and 542 are turned off and the second differential circuit 22 and the second output stage 40 are also suspended. And then, the voltage Vout predischarged to around the voltage Vin2 is driven to the voltage Vin2 by the output circuit 10 with high voltage accuracy.

Additionally, the control of the output circuit 10 is switched between operation and non-operation according to circuit characteristics in the precharging/predischarging periods. Further, instead of non-operation, the output circuit 10 may be interrupted from the input terminal 1 and the output terminal 2.

With the above driving method, it is possible to rapidly drive the voltage Vout to the voltage Vin1 or the voltage Vin2 with high voltage accuracy in the output periods. Besides, since the precharge/predischarge circuit 20 is operated with high speed in the precharging/predischarging periods, it is possible to shorten the precharging/predischarging periods.

Further, the precharge/predischarge circuit 20 (FIG. 8) has sufficiently small power consumption and consumes electricity only in the precharge/predischarge periods.

Meanwhile, the output circuit 10 only needs to drive a voltage, which is driven to around the voltage Vin (Vin1/Vin2) in the precharging/predischarging periods, to the voltage Vin (Vin1/Vin2) with high voltage accuracy after the precharging/predischarging periods. Hence, high current supplying capability is not necessary. Therefore, a driving circuit with low power consumption is applicable as the output circuit 10.

As described above, since the driving circuit of FIG. 8 is operated according to the driving method of FIGS. 11A and 11B, it is possible to realize high-accuracy output, high-speed driving, and low power consumption.

Further, FIG. 12 shows a method of controlling the switches of the precharge/predischarge circuit 20A and the output circuit 10 in the driving circuit of FIG. 10.

The controlling operation of the differential circuit 23 and the first output stage 30 shown in FIG. 10 is the same as that of the first differential circuit 21 and the first output stage 30 shown in FIG. 8. The controlling operation of the differential circuit 23 and the second output stage 40 shown in FIG. 10 is the same as that of the second differential circuit 22 and the second output stage 40 shown in FIG. 8.

In FIG. 12, the differential circuit 23 and the first output stage 30 of FIG. 10 are operated by the same controlling method as that of the first differential circuit 21 and the first output stage 30 of FIG. 8, and the differential circuit 23 and the second output stage 40 of FIG. 10 are operated by the same controlling method as that of the second differential circuit 22 and the second output stage 40 of FIG. 8.

Namely, the switch 521 of the differential circuit 23 is turned on in the precharging/predischarging periods of odd-numbered and even-numbered output periods. The switches 531 and 532 of the first output stage 30 are turned on only in the precharging/predischarging periods of odd-numbered output periods. The switches 541 and 542 of the second output stage 40 are turned on only in the precharging/predischarging periods of even-numbered output periods.

The output circuit 10 exercises control as shown in FIG. 11A. Hence, the output voltage Vout has the same voltage waveform as FIG. 11B. Namely, when the driving circuit of FIG. 10 is operated by the controlling method of FIG. 12, it is possible to provide driving as the driving circuit of FIG. 8 that is operated by the controlling method of FIG. 11A.

Figures 13A, 13B, 14:
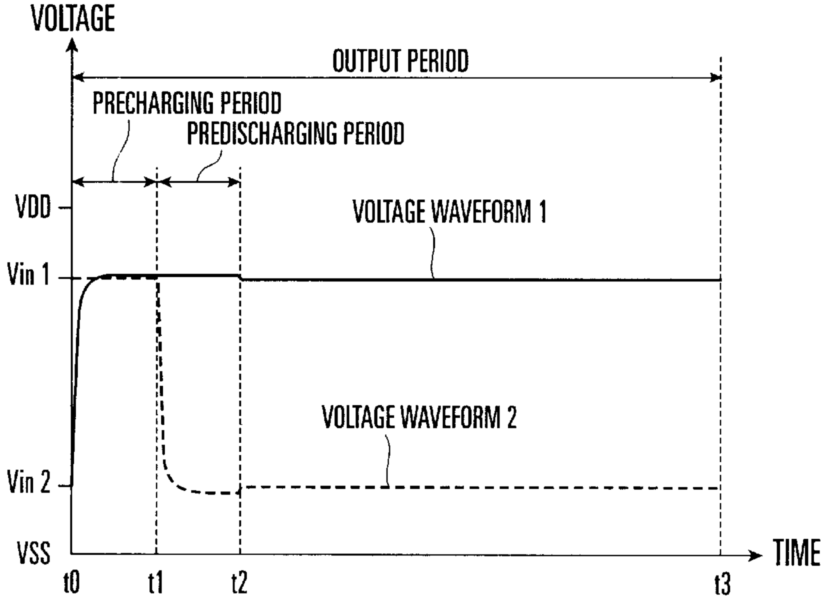
FIG. 13A is a diagram showing another method of controlling the driving circuit shown in FIG. 8.
FIG. 13B is an output voltage waveform diagram of the driving circuit.
FIG. 14 is a diagram showing another method of controlling the driving circuit shown in FIG. 10.

FIGS. 13A and 13B are diagrams showing another specific example of a driving method of the driving circuit shown in FIG. 8.

This specific example will describe a driving method for driving a desired voltage in a desired order in successive output periods.

FIG. 13A is a diagram showing a control method of the switches of the precharge/predischarge circuit 20 and the output circuit 10 in the driving circuit of FIG. 8. FIG. 13B is a diagram showing a voltage waveform (voltage waveform 1) of the voltage Vout when control is exercised as shown in FIG. 13A in an output period just after voltage applied to the input terminal 1 is switched from the voltage Vin2 to the voltage Vin1 (here, Vin1>Vin2). FIG. 13B also shows a voltage waveform (voltage waveform 2) of the voltage Vout of the output terminal 2 when control is exercised as shown in FIG. 13A in an output period just after voltage is switched from voltage Vin1 to the voltage Vin2.

Referring to FIGS. 13A and 13B, in the above driving method, a precharging period (time t0 to t1) and a predischarging period (time t1 to t2) are provided successively in the first half of an output period (time t0 to t3) such that a desired voltage is driven in a desired order.

In the precharging period, the switches 521, 531, and 532 are turned on to operate the first differential circuit 21 and the first output stage 30. The switches 522, 541, and 542 are turned off to suspend the second differential circuit 22 and the second output stage 40.

In the predischarging period, the switches 522, 541, and 542 are turned on to operate the second differential circuit 22 and the second output stage 40. The switches 521, 531, and 532 are turned off to suspend the first differential circuit 21 and the first output stage 30.

After the precharging/discharging periods (time t0 to t2), the switches 521, 522, 531, 532, 541, and 542 are all turned off to suspend the precharge/predischarge circuit 20.

The output circuit 10 is operated at least after the precharging/predischarging periods and is brought into operation or non-operation according to circuit characteristics of the output circuit 10. Further, instead of non-operation, the output circuit 10 may be interrupted from the input terminal 1 and the output terminal 2.

In FIGS. 13A and 13B, when voltage applied to the input terminal 1 is switched from the voltage Vin2 to the voltage Vin1, in the precharging period, the operations of the first differential circuit 21 and the first output stage 30 rapidly increase the voltage Vout from the voltage Vin2 to the voltage Vin1. In the predischarging period, since the voltage Vout has been sufficiently close to the voltage Vin1, even when the second differential circuit 22 and the second output stage 40 are operated, the voltage Vout hardly fluctuates.

After the precharging/predischarging periods, the output circuit 10 drives the voltage Vout to the voltage Vin1 with high voltage accuracy.

Meanwhile, when voltage applied to the input terminal 1 is switched from the voltage Vin1 to the voltage Vin2, the voltage is changed to a lower voltage. Hence, the constant current circuit 321 operates in the first output stage 30 in the precharging period and is set at sufficiently small current. Thus, the influence of the discharging operation is small and the voltage Vout does not largely vary from the voltage Vin1 of the previous output period.

In the predischarging period, the operations of the second differential circuit 22 and the second output stage 40 rapidly decrease the voltage Vout from around the voltage Vin1 to around the voltage Vin2.

After the predischarging period, the output circuit 10 drives the voltage Vout to the voltage Vin2 with high voltage accuracy.

Besides, even when the precharging period and the predischarging period are switched in the order, the precharge/predischarge circuit 20 can provide driving in a suitable manner.

With the above driving method, it is possible to rapidly drive the voltage Vout to the voltage Vin1 or the voltage Vin2 with high voltage accuracy in an arbitrary output period.

Namely, it is possible to drive desired voltages in a desired order in successive output periods.

Additionally, since the precharge/predischarge circuit 20 operates at high speed, the precharging/predischarging periods can be shortened. Further, the precharge/predischarge circuit 20 is sufficiently small in power consumption and its electricity is consumed only in the precharging/predischarging periods.

Meanwhile, the output circuit 10 only drives voltage, which is driven to around the voltage Vin (Vin1/Vin2) in the precharging/predischarging periods, to the voltage Vin (Vin1/Vin2) with high voltage accuracy after the precharging/predischarging periods. Hence, high current supplying capability is not necessary. Therefore, a driving circuit with low power consumption is applicable as the output circuit 10.

As described above, since the driving circuit of FIG. 8 undergoes the driving control of FIGS. 13A and 13B, it is possible to realize high-accuracy output, high-speed driving, and low power consumption.

Moreover, FIG. 14 shows a method of controlling the switches of the precharge/predischarge circuit 20 and the output circuit 10 when the same driving method is carried out in the driving circuit of FIG. 10.

The differential circuit 23 and the first output stage 30 of FIG. 10 operate in the same manner as the first differential circuit 21 and the first output stage 30 of FIG. 8. The differential circuit 23 and the second output stage 40 of FIG. 10 operate in the same manner as the second differential circuit 22 and the output stage 40 of FIG. 8.

In FIG. 14, the differential circuit 23 and the first output stage 30 of FIG. 10 are operated by the same controlling method as the operations of the first differential circuit 21 and the first output stage 30 of FIG. 8. The differential circuit 23 and the second output stage 40 of FIG. 10 are operated by the same controlling method as the operations of the second differential circuit 22 and the second output stage 40 of FIG. 8.

Namely, the switch 521 of the differential circuit 23 is turned on both in the precharging period and the predischarging period. The switches 531 and 532 of the first output stage 30 are turned on only in the precharging period. The switches 541 and 542 of the second output stage 40 are turned on only in the predischarging period.

The output circuit 10 exercises the same control as FIG. 13A. Hence, the output voltage Vout has the same voltage waveform as FIG. 13B.

Namely, when the driving circuit of FIG. 10 is operated by the controlling method shown in FIG. 14, the same driving can be achieved as when the driving circuit of FIG. 8 is operated by the controlling method of FIG. 13A.

Figure 15:
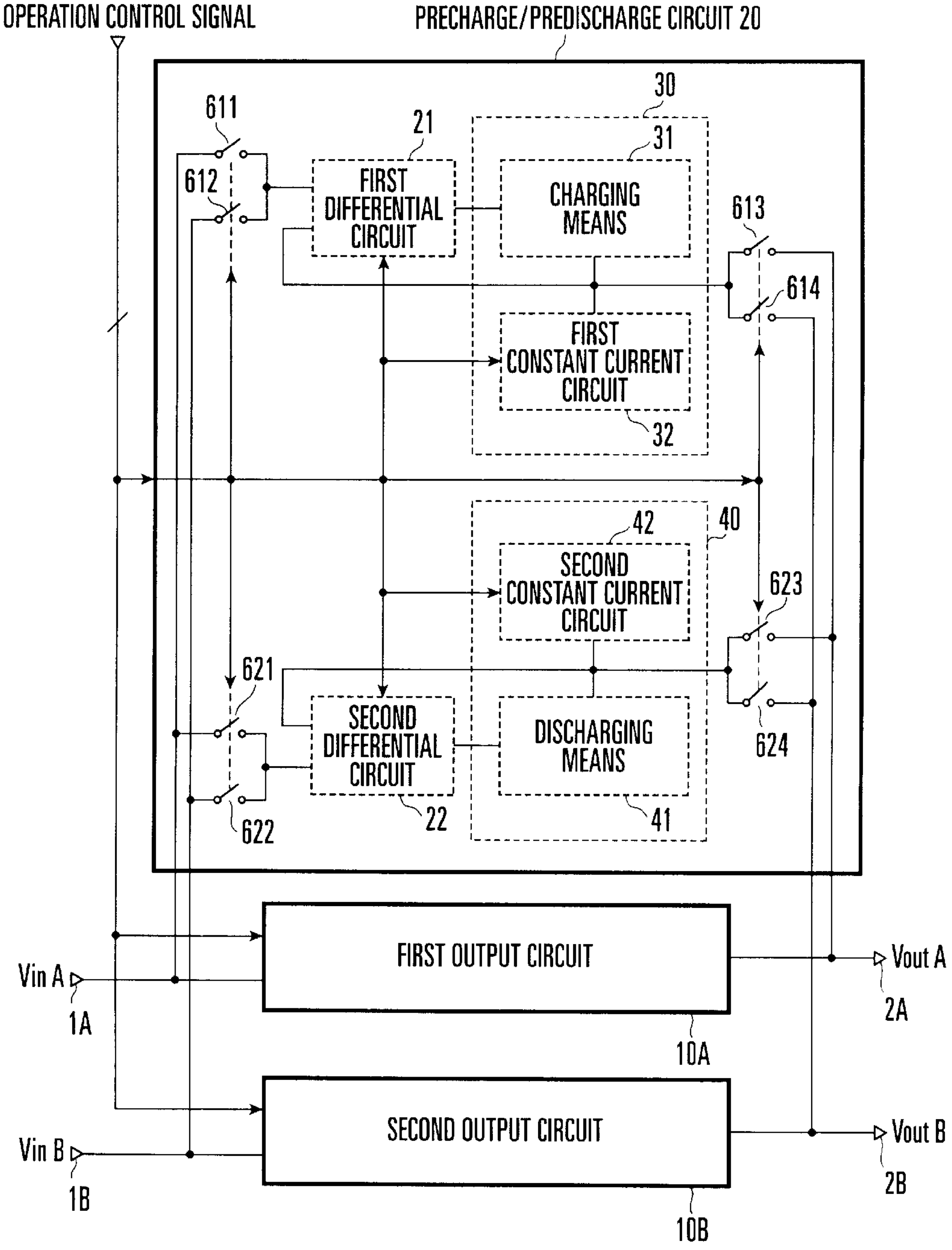
FIG. 15 is a block diagram showing the configuration of a driving circuit according to Embodiment 5 of the present invention.

FIG. 15 is a diagram showing the configuration of a driving circuit according to Embodiment 5 of the present invention. Embodiment 5 of the present invention is a modification of the driving circuit shown in FIG. 7.

The driving circuit of FIG. 15 is constituted by a first output circuit 10A for receiving a voltage VinA of an input terminal 1A and outputting a desired voltage to the output terminal 2A, a second output circuit 10B for receiving a voltage VinB of an input terminal 1B and outputting a desired voltage to an output terminal 2B, a precharge/predischarge circuit 20 for rapidly varying voltages VoutA and VoutB of the output terminals 2A and 2B to around desired voltages, and an operation control signal for controlling the operation and non-operation of the precharge/predischarge circuit 20, the first output circuit 10A, and the second output circuit 10B.

Namely, in Embodiment 1, a single output circuit has a single precharge/predischarge circuit 20. Meanwhile, in Embodiment 9 of the present invention, a single precharge/predischarge circuit 20 is shared by two output circuits (first output circuit 10A and second output circuit 10B).

In FIG. 15, the precharge/predischarge circuit 20 is configured such that switches 611, 612, 613, 614, 615, and 616 for switching the connections with two output circuits are added to the precharge/predischarge circuit 20 of FIG. 7.

In the operation of the precharge/predischarge circuit 20 of FIG. 15, the switches 611, 612, 613, 614, 615, and 616 are controlled by an operation control signal as follows:

When the switches 611 and 613 are turned on, the switches 612 and 614 are turned off.

Further, when the switches 621 and 623 are turned on, the switches 622 and 624 are turned off.

Furthermore, when the switches 611 and 613 or the switches 621 and 623 are turned on, the other switches are turned off. When the switches 612 and 614 or the switches 621 and 623 are turned on, the other switches are turned off.

Since the switches are controlled thus, the relationship of the precharge/predischarge circuit 20 with the first output circuit 10A and the second output circuit 10B is the same as the relationship of the precharge/predischarge circuit 20 with the output circuit 10 of FIG. 7.

Therefore, with the driving circuit of FIG. 15, it is possible to achieve the same function and effect as FIG. 7 for the two outputs.

Moreover, when forming a driving circuit with two outputs, the driving circuit shown in FIG. 15 is smaller in the number of elements and a required area as compared with FIG. 7 having two driving circuits.

Figure 16:
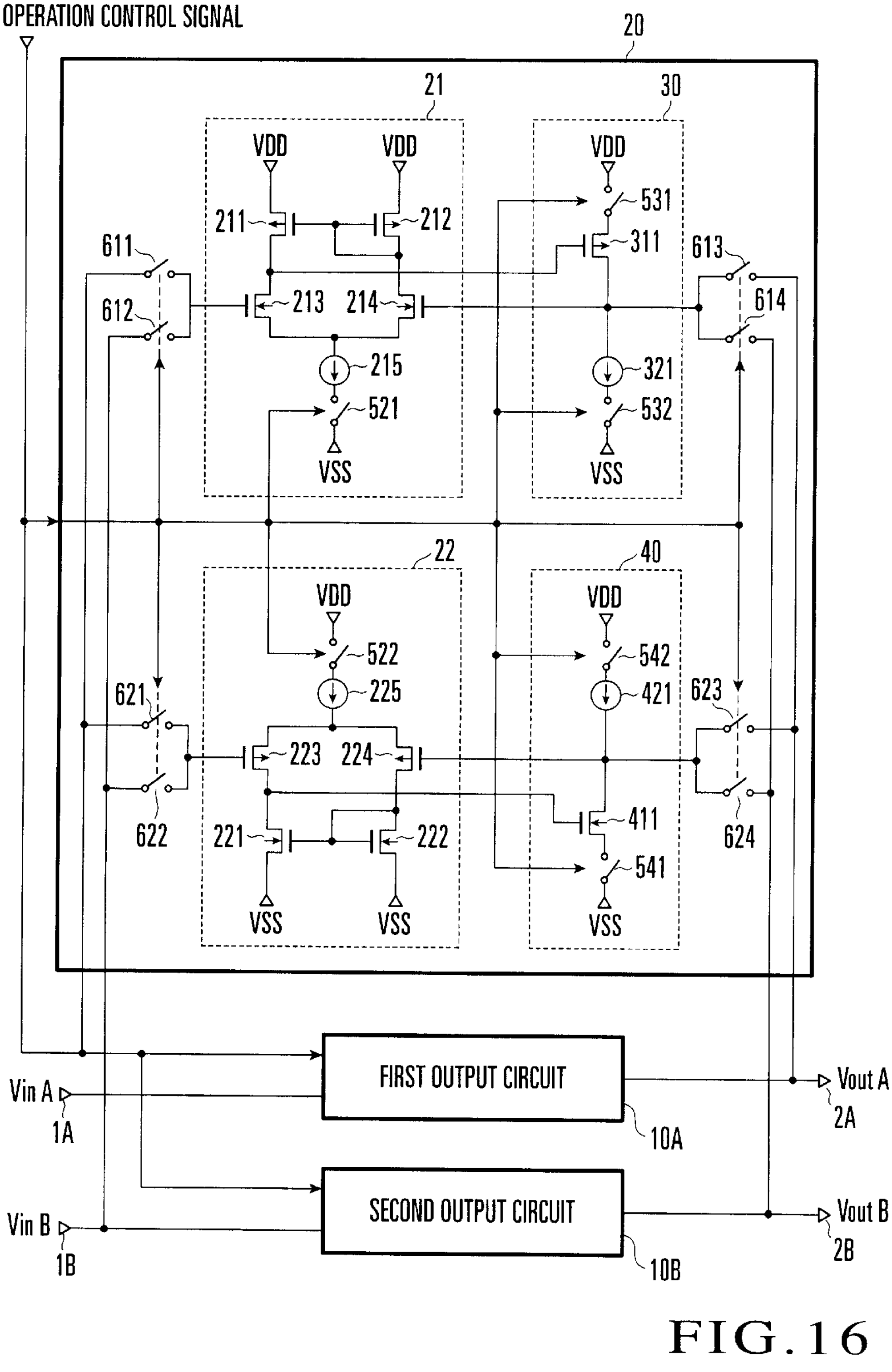
FIG. 16 is a diagram showing the configuration of a driving circuit according to Embodiment 6 of the present invention and a specific circuit configuration of a precharge/predischarge circuit 20B shown in FIG. 15.

FIG. 16 is a diagram showing a driving circuit according to Embodiment 6 of the present invention and a specific configuration of the precharge/predischarge circuit 20 in the driving circuit of FIG. 15. Referring to FIG. 16, in the precharge/predischarge circuit 20, when the voltages VinA and VinB are respectively applied to the input terminals 1A and 1B, the voltages VoutA and VoutB of the output terminals 2A and 2B are rapidly precharged and predischarged to a voltage level sufficiently close to the voltages VinA and VinB. In Embodiment 6 of the present invention, the precharge/predischarge circuit 20 is configured such that the switches 611, 612, 613, 614, 615, and 616 for switching the connections of the two output circuits are added to the precharge/predischarge circuit 20 of FIG. 8.

As in the case of FIG. 15, during the operation of the precharge/predischarge circuit 20, the switches are controlled by an operation control signal as follows: when the switches 611 and 613 are turned on, the switches 612 and 614 are turned off. Further, when the switches 621 and 623 are turned on, the switches 622 and 624 are turned off. Furthermore, when the switches 611 and 613 or the switches 621 and 623 are turned on, the other switches are turned off. When the switches 612 and 614 or the switches 621 and 623 are turned on, the other switches are turned off. Since the switches are controlled thus, the relationship of the precharge/predischarge circuit 20 with the first output circuit 10A and the second output circuit 10B is the same as the relationship of the precharge/predischarge circuit 20 with the output circuit 10 shown in FIG. 7.

Therefore, the driving circuit of FIG. 16 can achieve the same function and effect as FIG. 8 for the two outputs.

Further, when forming a driving circuit with two outputs, the driving circuit shown in FIG. 16 is smaller in the number of elements and a required area as compared with FIG. 8 having two driving circuits.

Figures 17A, 17B:
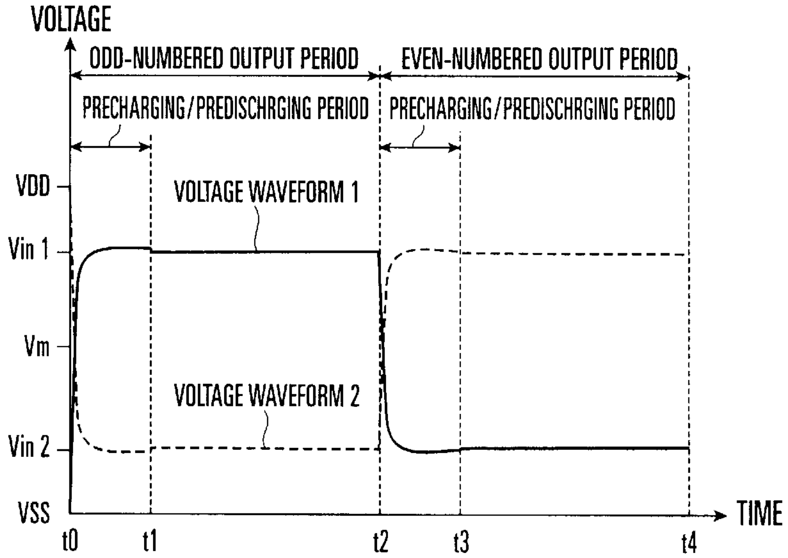
FIG. 17A is a diagram showing a method of controlling the driving circuit shown in FIG. 16.
FIG. 17B is an output voltage waveform diagram of the driving circuit.

FIGS. 17A and 17B show a specific example of a driving method of the driving circuit that is shown in FIG. 16.

In the above driving method, the output voltage VoutA of the output terminal 2A is driven to a voltage between an arbitrary intermediate voltage Vm and a high-potential side source voltage VDD inclusive in an odd-numbered output period. The output voltage VoutA is driven to less than the voltage Vm and not less than a low-potential side source voltage VSS in an even-numbered output period. The output voltage VoutB of the output terminal 2B is driven to less than an arbitrary intermediate voltage Vm and not less than the source voltage VSS in an odd-numbered output period. The output voltage VoutB is driven to a voltage between the voltage Vm and the source voltage VDD inclusive in an even-numbered output period. The above driving method will be discussed.

Such a driving method can be used for performing dot inversion driving in a liquid crystal display device.

FIG. 17A shows a method of controlling the switches of the precharge/predischarge circuit 20 and the output circuit 10 shown in FIG. 16.

FIGS. 17B shows voltage waveforms of the two output periods of the output voltages VoutA and VoutB of the output terminals 2A and 2B when the control of FIG. 17A sets voltage applied to the input terminals 1A and 1B at voltages Vin1 and Vin2 during an arbitrary odd-numbered output period and sets voltage at voltages Vin2 and Vin1 in the following even-numbered output period. The following explanation will be given referring to FIGS. 16, 17A, and 17B.

In the driving method shown in FIGS. 17A and 17B, precharging/predischarging periods (time t0 to t1 and t2 and t3) are provided in the first half of odd-numbered and even-numbered output periods (time t0 to t2 and time t2 to t4).

In the precharging/predischarging periods of odd-numbered output periods, the switches 611 and 613 and the switches 622 and 624 are turned on and the switches 521, 531, and 532, and the switches 522, 541, and 542 are turned on to operate the first differential circuit 21, the first output stage 30, the second differential circuit 22, and the second output stage 40 together. Therefore, the voltage VoutA is rapidly increased to around the voltage Vin1 by the operations of the first differential circuit 21 and the first output stage 30, and the voltage VoutB is rapidly reduced to around the voltage Vin2 by the operations of the second differential circuit 22 and the second output stage 40.

After the precharging/predischarging periods, all the switches are turned off, the precharge/predischarge circuit 20 is suspended, the output voltages VoutA and VoutB are driven to the voltages Vin1 and Vin2 by the first output circuit 10A and the second output circuit 10B with high voltage accuracy.

Meanwhile, in the precharging/predischarging periods of even-numbered output periods, the switches 612 and 614 and the switches 621 and 623 are turned on, and the switches 521, 531, and 532 and the switches 522, 541, and 542 are turned on.

Thus, the voltage VoutA is rapidly reduced to around the voltage Vin2 by the operations of the second differential circuit 22 and the second output stage 40, and the voltage VoutB is rapidly increased to around the voltage Vin1 by the operations of the first differential circuit 21 and the first output stage 30. After the precharging/predischarging periods, all the switches are turned off to suspend the precharge/predischarge circuit 20, and the output voltages VoutA and VoutB are driven to the voltages Vin2 and Vin1 with high voltage accuracy by the first output circuit 10A and the second output circuit 10B. Additionally, the operation of the output circuit 10 in the precharging/predischarging periods is brought into operation or non-operation according to a circuit characteristic. Further, instead of non-operation, the first output circuit 10A and the second output circuit 10B may be respectively interrupted from the input terminal 1A and output terminal 2A and the input terminal 1B and the output terminal 2B.

With the above driving method, in the respective output periods, it is possible to drive the voltages VoutA and VoutB with high voltage accuracy to a voltage applied to the input terminals 1A and 1B.

Moreover, since a single precharge/predischarge circuit 20 is shared by two outputs, the circuit can be smaller in size than the case where the precharge/predischarge circuit 20 is provided for each of the outputs. Additionally, the precharge/predischarge circuit 20 can be driven at high speed in the respective precharging/predischarging periods. Thus, it is possible to shorten the precharging/predischarging periods.

Also, the precharge/predischarge circuit 20 is sufficiently small in power consumption and its electricity is consumed only in the precharging/predischarging periods.

Meanwhile, the first output circuit 10A and the second output circuit 10B only need to drive voltages, which have been driven to around desired voltages in the precharging/predischarging periods, to desired voltages after the precharging/predischarging periods with high voltage accuracy. Hence, high current supplying capability is not necessary. Therefore, driving circuits with low power consumption are applicable as the first output circuit 10A and the second output circuit 10B.

As described above, since the driving method of FIG. 17A is performed on the driving circuit of FIG. 16, it is possible to realize high-accuracy output, high-speed driving, and low power consumption.

FIGS. 18A to 18C shows another specific example of the driving method of the driving method shown in FIG. 16.

The present embodiment will describe a driving method for driving desired voltages in a desired order in successive output periods for each of the two outputs. FIG. 18A shows a method of controlling the switches of the precharge/predischarge circuit 20 and the output circuit 10 shown in FIG. 16.

FIG. 18B shows a voltage waveform (voltage waveform 1A) of the voltage VoutA when the control of FIG. 18A is exercised in an output period just after voltage applied to the input terminal 1A is switched from the voltage Vin2A to the voltage Vin1A (here, Vin1A>Vin2A).

Besides, FIG. 18B also shows a voltage waveform (voltage waveform 2A) of the voltage VoutA in an output period just after voltage applied to the input terminal 1A is switched from the voltage Vin1A to the voltage Vin2A.

FIG. 18C shows a voltage waveform (voltage waveform 1B) of the voltage VoutB when the control of FIG. 18 is exercised in an output period just after voltage applied to the input terminal 1B is switched from the voltage Vin2B to the voltage Vin1B (here, Vin1B>Vin2B). FIG. 18C also shows a voltage waveform (voltage waveform 2B) of the voltage VoutB in an output period just after voltage applied to the input terminal 1B is switched from the voltage Vin1B to the voltage Vin2B.

The following explanation will be given referring to FIGS. 16 and FIGS. 18A to 18C.

In the driving method of FIGS. 18A to 18C, a first precharging/predischarging period (time t0 to t1) and a second precharging/predischarging period (time t1 to t2) is provided in the first half of a single output period (time t0 to t3) such that desired voltages are driven in a desired order.

In the first precharging/predischarging period, the switches 611 and 613 and the switches 622 and 624 are turned on, and the switches 612 and 614 and the switches 621 and 623 are turned off.

In the second precharging/predischarging period, the switches 611 and 613 and the switches 622 and 624 are turned off, and the switches 612 and 614 and the switches 621 and 623 are turned on. Further, the switches 521, 531, and 532, and the switches 522, 541, and 542 are turned on in the first precharging/predischarging period and the second precharging/predischarging periods to operate the first differential circuit 21, the first output stage 30, the second differential circuit 22, and the second output stage 40 together.

After the first and second precharging/predischarging periods, all the switches are turned off to suspend the precharge/predischarge circuit 20.

The first output circuits 10A and the second output circuit 10B are operated at least after the first and second precharging/predischarging periods and are brought into operation and non-operation according to the circuit characteristics of the output circuits in the first and second precharging/predischarging periods. Further, instead of non-operation, the first output circuit 10A and the second output circuit 10B may be interrupted from the input terminal 1A, the output terminal 2A, the input terminal 1B, and the output terminal 2B.

In FIGS. 18A to 18C, when voltage applied to the input terminal 1A is switched from the voltage Vin2A to the voltage Vin1A, the voltage VoutA is rapidly increased from the voltage Vin2A to around the voltage Vin1A by the operations of the first differential circuit 21 and the first output stage 30 in the first precharging/predischarging period.

In the second precharging/predischarging period, since the voltage VoutA has been already set at a voltage sufficiently close to the voltage Vin1A, even when the second differential circuit 22 and the second output stage 40 are operated, the voltage VoutA hardly fluctuates.

After the first and second precharging/predischarging periods, the first output circuit 10A drives the voltage VoutA to the voltage Vin1A with high voltage accuracy.

Further, when voltage applied to the input terminal 1A is switched from the voltage Vin1A to the voltage Vin2A, a change is made to a lower voltage. Thus, the constant current circuit 321 is operated in the first output stage 30 in the first precharging/predischarging period. However, the influence of the discharging operation is small because current is sufficiently small, and the voltage VoutA does not change largely from the voltage Vin1A of the previous output period.

In the second precharging/predischarging period, due to the operations of the second differential circuit 22 and the second output stage 40, the voltage VoutA is rapidly reduced from around the voltage Vin1A to around the voltage Vin2A. After the first and second precharging/predischarging periods, the voltage VoutA is driven to the voltage Vin2A by the first output circuit 10A with high accuracy.

Meanwhile, when voltage applied to the input terminal 1B is switched from the voltage Vin1B to the voltage Vin2B, the voltage VoutB is rapidly reduced from the voltage Vin1B to around the voltage Vin2B by the operations of the second differential circuit 22 and the second output stage 40 in the first precharging/predischarging period.

In the second precharging/predischarging period, the voltage VoutB has been already sufficiently close to the voltage Vin2B. Thus, even when the first differential circuit 21 and the first output circuit stage 30 are operated, the voltage VoutB hardly fluctuates.

After the first and second precharging/predischarging periods, the voltage VoutB is driven to the voltage Vin2B by the second output circuit 10B with high voltage accuracy.

Moreover, when voltage applied to the input terminal 1B is switched from the voltage Vin2B to the voltage Vin1B, the constant current circuit 421 is operated in the second output stage 40 in the first precharging/predischarging period. However, the influence of the charging operation is small because current is sufficiently small, and the voltage VoutB does not largely change from the voltage Vin2B of the previous output period.

In the second precharging/predischarging period, the voltage VoutB is rapidly reduced from around the voltage Vin2B to around the voltage Vin1B by the operations of the first differential circuit 21 and the first output stage 30.

After the first and second precharging/predischarging periods, the voltage VoutB is driven to the voltage Vin1B by the second output circuit 10B with high voltage accuracy.

Besides, even when the control of the precharge/predischarge circuit 20 is switched between the first precharging/predischarging period and the second precharging/predischarging period, suitable driving is possible.

With the above driving method, it is possible to drive the voltages VoutA and VoutB at a high speed with high voltage accuracy to a voltage applied to the input terminals 1A and 1B in an arbitrary output period.

Namely, for each of two outputs, it is possible to drive desired voltages in a desired order in successive output periods.

Further, since a single precharge/predischarge circuit 20 is shared by the two outputs, the circuit can be small in size as compared with the case where the precharge/predischarge circuit 20 is provided for each of the outputs.

Additionally, since the precharge/predischarge circuit 20 operates at high speed, the first and second precharging/predischarging periods can be shortened. Moreover, the precharge/predischarge circuit 20 is sufficiently small in power consumption and its electricity is consumed only in the precharging/predischarging periods. Meanwhile, the first output circuit 10A and the second output circuit 10B only drive voltages, which have been driven to around desired voltages in the two-step precharging/predischarging periods, to desired voltages with high voltage accuracy after the precharging/predischarging periods. Hence, high current supplying capability is not necessary. Therefore, as the first output circuit 10A and the second output circuit 10B, driving circuits with low power consumption are applicable.

As described above, since the driving method of FIGS. 18A to 18C is performed on the driving circuit of FIG. 16, it is possible to realize high-accuracy output, high-speed driving, and low power consumption.

Figure 19:
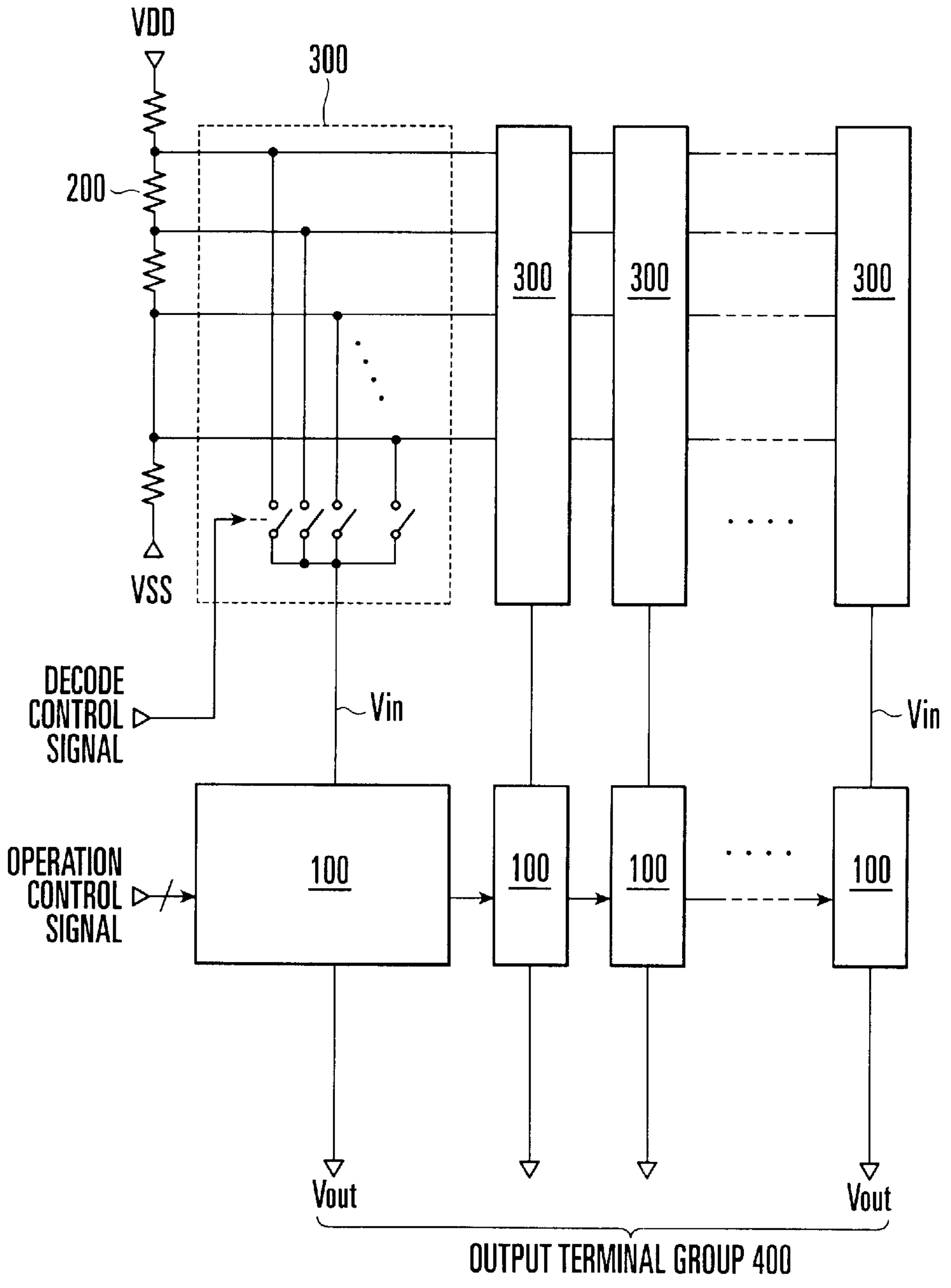
FIG. 19 is a block diagram showing Embodiment 7 of a driving circuit of the present invention and an example of the configuration of a data driver in a liquid crystal display device.

FIG. 19 is a diagram showing a driving circuit according to Embodiment 7 of the present invention and the configuration of a data driver of a liquid crystal display device (e.g. FIG. 1).

Referring to FIG. 19, the driver is constituted by resistor strings 200, selective circuits 300, an output terminal group 400, and output stages 100.

On each connecting terminal (tap) of the resistor string 200, level voltage is generated according to a gradation, the selective circuit 300 selects a graduation level voltage in each output period, and the output stage 100 output the level voltage to each output terminal.

As the output stage 100, it is possible to adopt the driving circuits described in the foregoing embodiments (the driving circuit including the precharge/predischarge circuits 20 and 20A and the output circuits 10, 10A, and 10B).

To the output stage 100 of each output, for example, an operation control signal is transmitted from an operation control signal generating circuit (not shown) to control the operations of the precharge/predischarge circuits 20 and 20A and the output circuits 10, 10A, and 10B in each embodiment.

Besides, when the driving circuit of FIGS. 15 and 16 is used as the output stage 100 of FIG. 19, two outputs of the output stages 100 are replaced with the driving circuit of FIGS. 15 and 16.

It is possible to readily form a data driver being capable of high-speed driving with low power consumption by using the driving circuit of the present invention as the output stage 100.

Next, referring to figures, the examples of the present invention will be described. Regarding the driving circuits described in the foregoing embodiments, specific examples will be discussed based on results obtained by simulation.

In the foregoing driving circuits, as the output circuit, it is possible to use a circuit being capable of high-accuracy output with reduced current supplying capability. Therefore, in FIG. 19, charge is directly supplied from the resistor strings 200 to drive a capacitive load connected to the output terminal as long as precharging/predischarging is conducted to around a desired voltage. In this case, high-speed driving is possible even when the resistor string 200 is sufficiently small in current and it is possible to realize high-accuracy output and small power consumption.

Figure 20:
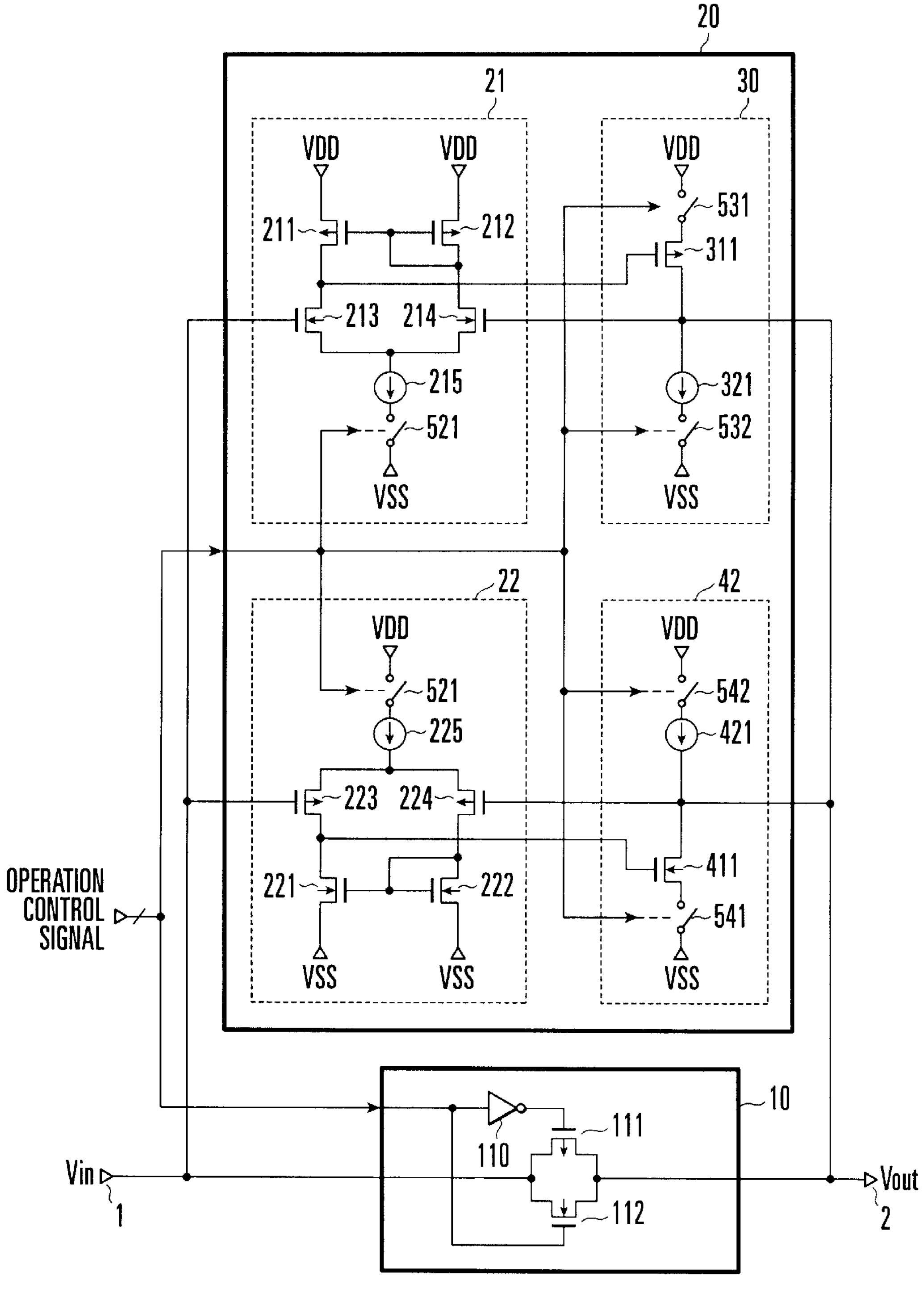
FIG. 20 is a diagram showing a specific circuit configuration of Embodiment 8 that is applicable to an output stage 100 of FIG. 19.

FIG. 20 shows a specific example of the output stage 100 for achieving the above characteristics.

FIG. 20 is a diagram showing an example of the driving circuit shown in FIG. 8. The driving circuit has the output circuit 10 composed of CMOS switches 111 and 112 (complementary transfer gate) and an inverter 110 for controlling the switches. The precharge/predischarge circuit 20 is identical to the configuration shown in FIG. 8.

The control and non-control of the output circuit 10 can be controlled by an operation control signal.

In the present example, the driving circuit of FIG. 20 is used as the output stage 100 of FIG. 19 and simulation results are shown regarding the driving circuit of FIG. 20 that is operated by the driving methods of FIGS. 11A and 11B.

For a simple configuration, simulation is conducted with a single output instead of multiple outputs.

A precharging/predischarging period is set at 2 $\mu$s, and the CMOS switches (111, 112) are turned off in the precharging/predischarging periods and are turned on after the precharging/predischarging periods.

Further, constant current circuits 215, 225, 321, and 421 of the precharge/predischarge circuit 20 shown in FIG. 20 are set at a constant current of 0.5 $\mu$A.

A capacitance element having a capacity of 20 pF is connected to an output terminal 2 via a resistor element of 2 k$\Omega$, and the other end of the capacitance element is connected to a GND potential (0V). Moreover, the resistor string 200 of the data driver is set such that two source voltages of high-level source voltage VDD and a low-potential side source voltage VSS are supplied to both ends of the resistor string 200 to apply current of 5 $\mu$A. Besides, the source voltages VDD and VSS are respectively set at 5 V and 0 V.

Figure 21:
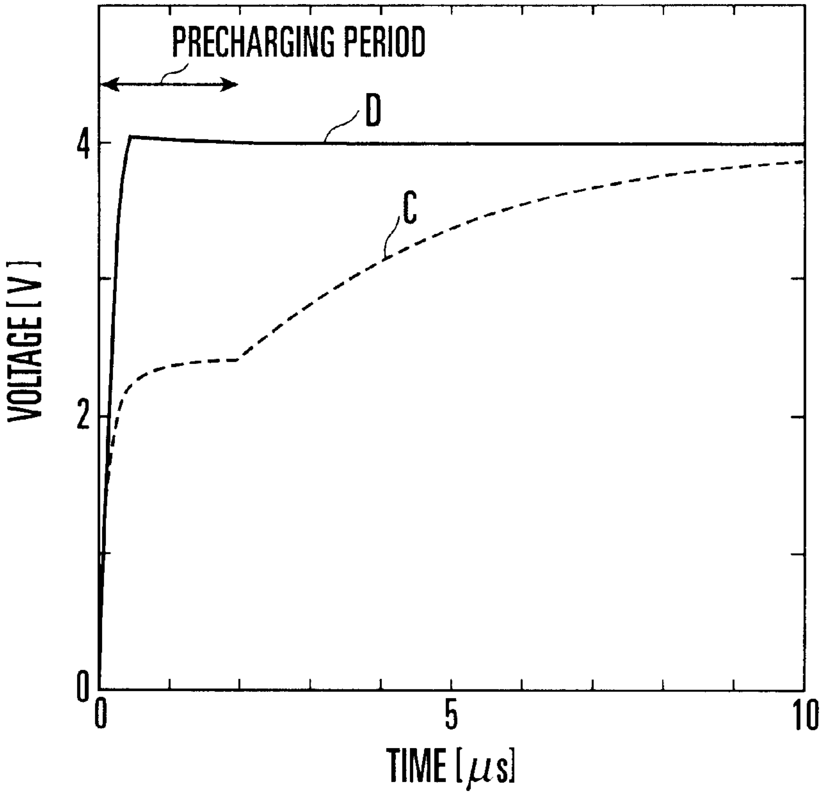
FIG. 21 is a diagram showing simulation results of an output voltage waveform shown in FIG. 20.

FIG. 21 shows simulation results of an output period including a precharging period under the above conditions. FIG. 21 shows a change in voltage of the capacitive load when a level voltage generated in the resistor string 200 is switched from 0 V to 4 V by the selective circuit 300.

For comparison, FIG. 21 also shows a voltage waveform of the driving circuit which is different from FIG. 19 in the configuration of the output stage. Simulation of the driving circuit of FIG. 3 is conducted under the same conditions as the driving circuit of FIG. 19 using FIG. 20, and the switch of the output circuit 10 shown in FIG. 20 is used as the switch 901 of FIG. 3 to exercise the same control.

Figure 3:
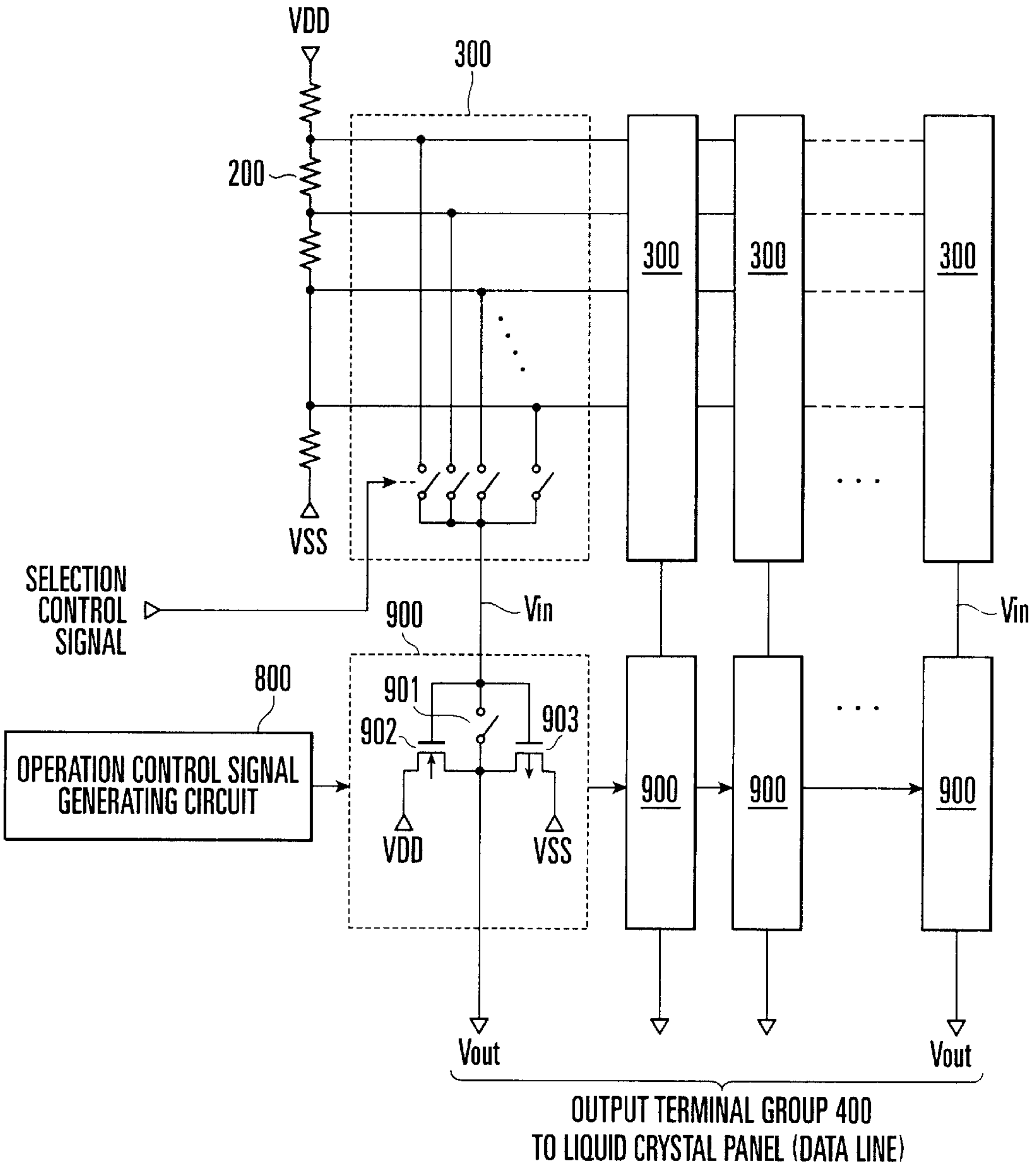
FIG. 3 PRIOR ART
FIG. 3 is a diagram showing the configuration of another conventional driving circuit which achieves faster driving as compared with FIG. 2.
Figure 4:
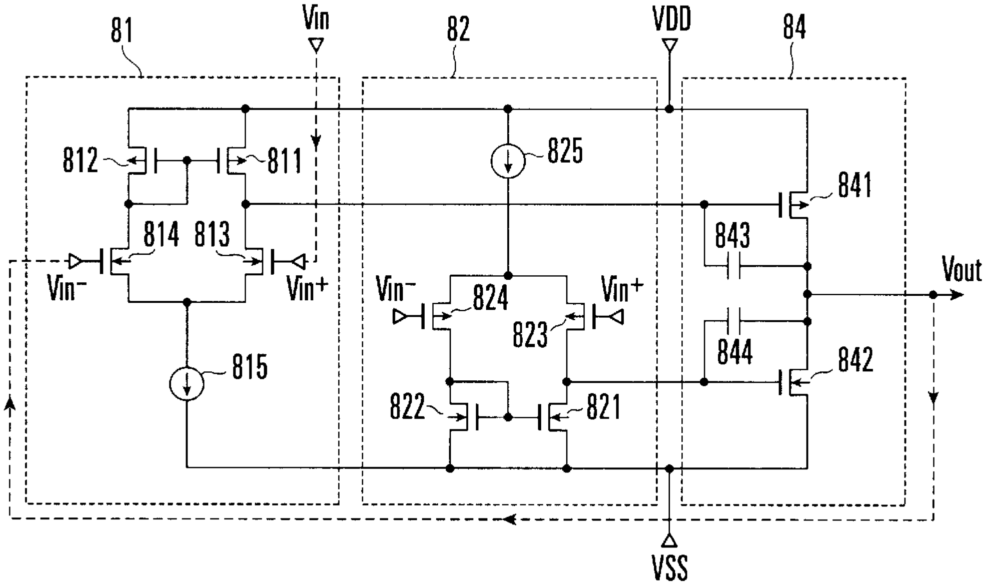
FIG. 4 PRIOR ART
FIG. 4 is a diagram showing the configuration of a conventional operational amplifier.
Figure 5:
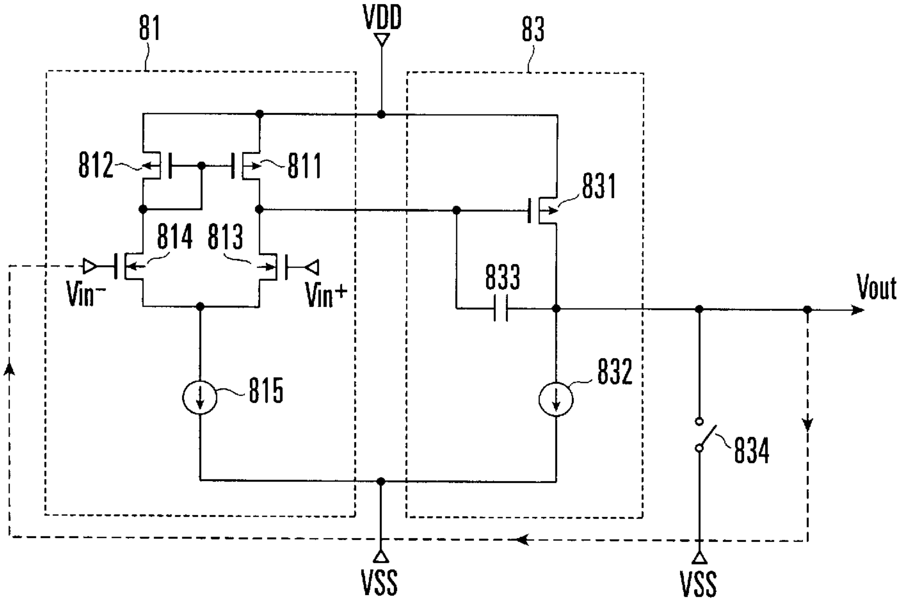
FIG. 5 PRIOR ART
FIG. 5 is a diagram showing the configuration of another conventional operational amplifier which achieves low power consumption.
Figure 6:
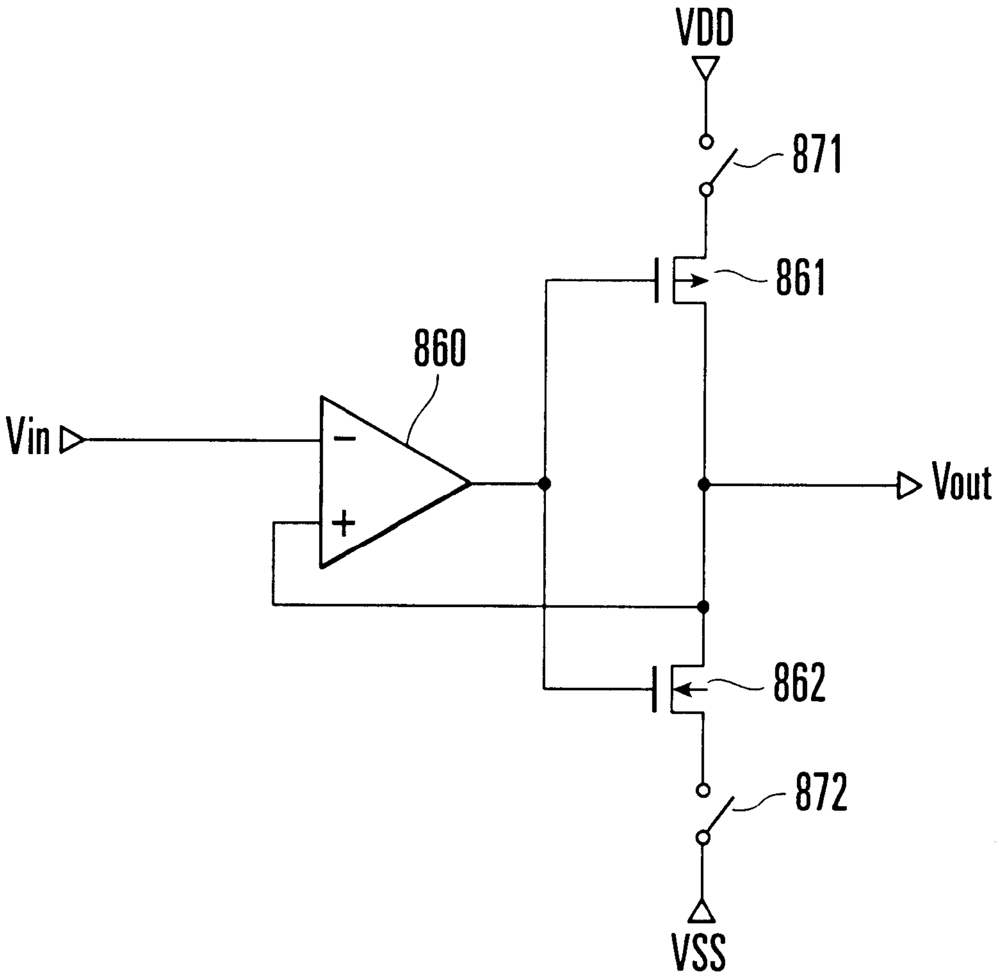
FIG. 6 is a diagram showing the configuration of a driving circuit including a conventional operational amplifier which achieves low power consumption.

In FIG. 21, a voltage waveform C is formed when driving is made by the driving circuit of FIG. 3, and a voltage waveform D is formed when driving is made by the driving circuit which is shown in FIG. 20 as the output stage 100 of FIG. 19.

As shown in FIG. 21, when driving is made by the driving circuit shown in FIG. 3, in the first half of 2 $\mu$s (precharging period), voltage can be driven to around 2.5 V at high speed by the source follower operation of the NMOS transistor 902. However, in the source follower operation, driving can be made only to a voltage level lower than a selected gradation voltage by about a threshold voltage. Thus, in the second half, the switch 901 is turned on and current is directly supplied from the resistor strings 200 to provide driving.

In the driving circuit of FIG. 3, the resistor string 200 needs to make driving by about a difference in threshold voltage of the transistor. Since the current supplying capability is somewhat low in the above simulation conditions, a selected voltage (4V) can be reached after the precharging period with low speed, resulting in no high-speed driving.

Meanwhile, in the case of driving by the driving circuit of FIG. 19 (the driving circuit of FIG. 20 is included as an output stage), a voltage waveform D is obtained, and a voltage is rapidly increased to around 4 V, which is a level voltage selected by the precharge/predischarge circuit 20 in the precharing period of 2 μs. Hence, it is possible to readily drive a selected gradation voltage with high voltage accuracy even when the current supplying capability of the resistor string 200 is low after the precharging period, achieving high-speed driving.

Additionally, in the configuration of FIG. 20, only the first differential circuit 21 and the first output stage 30 are operated in the precharging period, the precharge/predischarge circuit 20 has a sufficiently small current of 1 μA in total, and the precharging period is short. Thus, the operation of the precharge/predischarge circuit 20 is sufficiently small in power consumption.

The power consumption of the driving circuit shown in FIG. 19 (the driving circuit of FIG. 20 is included as the output stage 100) includes the power consumption of the current in the resistor string 200, the power consumption of the idling current in the precharge/predischarge circuit 20, and the charging/discharging power of a capacitive load.

Since the power consumption of the resistor string 200 and the precharging/discharging circuit 20 can be reduced, the driving circuit of FIG. 20 (the driving circuit of FIG. 14 is included as an output stage) can achieve low power consumption.

Besides, in the driving circuit of FIG. 3, in order to obtain the same driving speed as that of the driving circuit shown in FIG. 20 (the driving circuit of FIG. 14 is included as the output stage 100), it is necessary to largely increase current applied to the resistor string 200, resulting in extremely large power consumption.

Therefore, the driving circuit of FIG. 19 (the driving circuit of FIG. 20 is included as the output stage 100) can achieve faster driving than the driving circuit of FIG. 3 and has sufficiently small power consumption.

FIG. 21 shows a change to a higher voltage (output period including the precharging period). In the case of a change to a lower voltage (output period including a predischarging period) as well, the driving circuit of FIG. 20 (the driving circuit of FIG. 14 is included as the output stage 100) can provide high-speed driving. Further, the same effect can be obtained by the operation according to the driving method of FIG. 12.

The above explanation discussed the high-speed driving and low power consumption of the driving circuit shown in FIG. 19 (the driving circuit shown in FIG. 20 is included as the output stage 100). Moreover, high voltage accuracy is obtained because the resistor string 200 directly outputs voltage.

Furthermore, the precharge/predischarge circuit 20 of FIG. 20 only needs to precharge and predischarge to around a selected voltage. Hence, without the necessity for a stringent design, it is possible to design the current mirror circuit and the differential transistor pair in a minimum size, thereby reducing a required area of the circuit.

Also, when the transistors are somewhat varied in threshold voltage, a voltage driven by the precharge/predischarge circuit 20 is slightly shifted from a desired voltage. However, high voltage accuracy is obtained by the direct output of the resistor string 200.

Therefore, with the data driver using the driving circuit of FIG. 20 as the output stage 100 of FIG. 19, it is possible to realize high-accuracy voltage output, high-speed driving, and low power consumption even in a process having some variations in threshold voltage.

Further, in the case where the first output circuit 10A and the second output circuit 10B of FIG. 16 use the same CMOS switch as the output circuit 10 of FIG. 20 to carry out the same driving method as that of FIGS. 17A and 17B or FIGS. 18A to 18C, it is possible to obtain the same effect as the driving circuit of FIG. 19 (the driving circuit of FIG. 20 is included as the output circuit 100).

Figure 22:
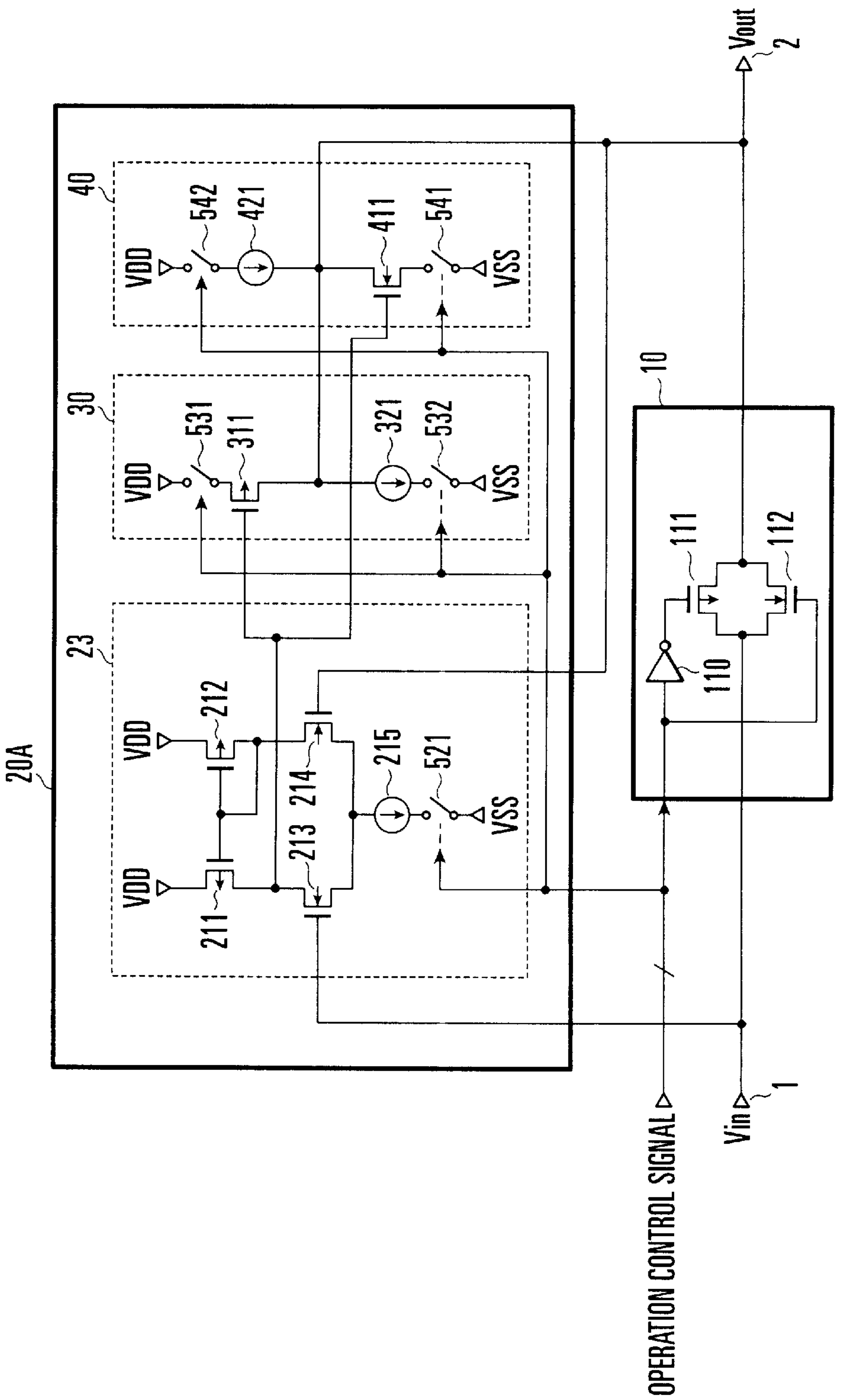
FIG. 22 is a diagram showing another specific circuit configuration of Embodiment 9 that is applicable to the output stage 100 of FIG. 20.

FIG. 22 is a diagram showing another example of the output stage 100 shown in FIG. 19.

Referring to FIG. 22, in the present example, the output circuit 10 is constituted by the same CMOS switches (111, 112) and the inverter 110 as those of FIG. 20. The operation and non-operation of the output circuit 10 can be controlled by an operation control signal.

In the present example, the configuration of FIG. 22 was used for the output stage 100 in the configuration of FIG. 19, and the driving circuit of FIG. 22 was operated according to the driving method of FIG. 12. In this case, the same simulation results were obtained as the voltage waveform D of FIG. 21. Additionally, the simulating conditions were the same as (22) those of Example 1, and the constant current circuits 215, 321, and 421 of the differential circuit 23, the first output stage 30, and the second output stage 40 were each 0.5 μA in current.

Thus, in the precharing/predischarging period, the precharge/predischarge circuit 20 had a sufficiently idling current of 1 μA, which was a total of the differential circuit 23 and the first output stage 30.

The precharge/predischarge circuits 20 of FIGS. 20 and 22 operate in the same manner. Hence, in the driving circuit 19 configured as FIG. 22 as well, it is possible to realize high-accuracy output, high-speed driving, and low power consumption as the driving circuit of FIG. 19 that is configured as FIG. 20.

Figure 23:
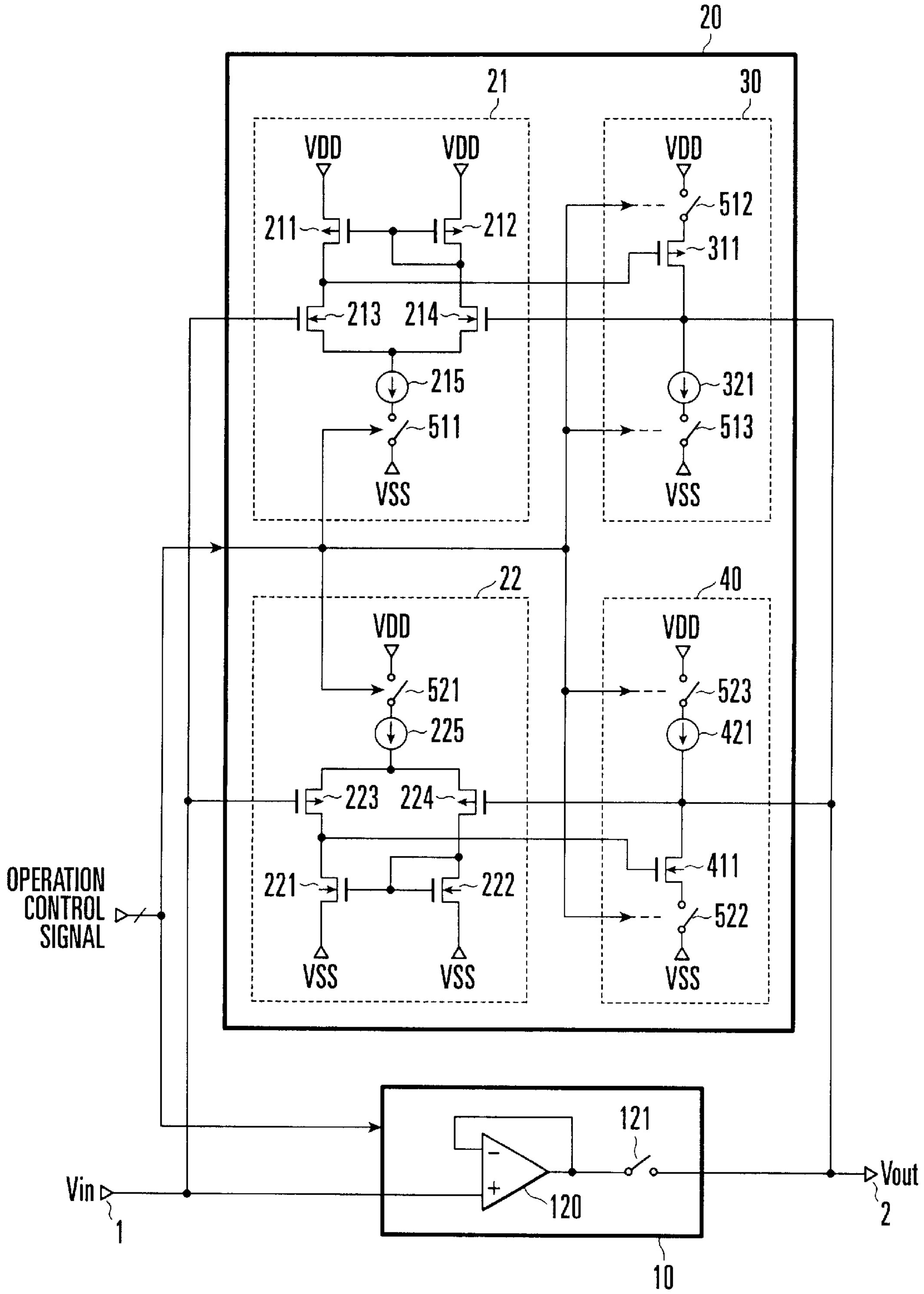
FIG. 23 is a diagram showing the configuration of a driving circuit according to Embodiment 10 of the present invention.

The driving circuit of the present invention can be applied to a typical driving circuit as well. When a conventional driving circuit is used as the output circuit of the present invention, it is possible to improve its performance on low power consumption or high-speed driving. FIG. 23 is a diagram showing a specific example.

FIG. 23 shows an example of the driving circuit shown in FIG. 8, in which the output circuit 10 is composed of the operational amplifier 120 (voltage follower) and the switch 121 for transmitting/intercepting the output of the operational amplifier 120 to the output terminal 2. The output circuit 10 shown in FIG. 23 is applicable to the output stage 100 of FIG. 19.

Further, even in the case of a driving circuit being different from FIG. 19, it is possible to use the configuration of FIG. 23 as long as the driving circuit applies multilevel voltage to the input terminal 1.

The present example shows simulation results when the driving circuit of FIG. 23 was operated according to the driving methods of FIGS. 11A and 11B. In the simulation of the driving circuit of FIG. 23, the precharging/discharging period for operating the precharge/predischarge circuit 20 was 5 μs and the switch 121 was turned off to interrupt the output of the operational amplifier 120 in the precharging/discharging period.

When the operational amplifier 120 is frequently switched between operation and non-operation, the output of the operational amplifier 120 is unstable and the power consumption of the operational amplifier is increased. Hence, the operational amplifier 120 was operated during the precharging/predischarging period as well.

After the precharging/predischarging period, the switch 121 was turned on and driving was made by the operational amplifier 120 with high voltage accuracy. Besides, the operational amplifier 120 was about 10 $\mu$A in idling current and the constant current circuits 215, 225, 321, and 421 of the precharge/predischarge circuit 20 were all set at a sufficiently small current of 0.5 $\mu$A.

To the output terminal 2, a 100-pF capacitor element was connected via a resistance element of 10 kΩ, and the other end of the capacitor element was connected to GND (0 V). Besides, the source voltages VDD and VSS were respectively set at 5 V and 0 V.

Figure 24:
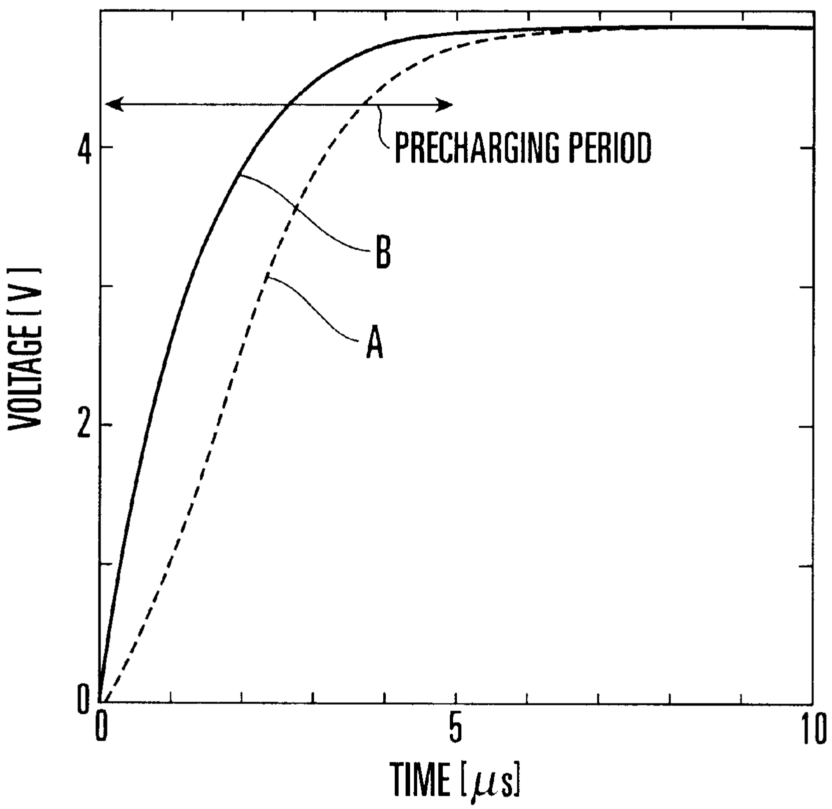
FIG. 24 is a diagram showing simulation results of an output voltage waveform of FIG. 23.

FIG. 24 is a diagram showing simulation results of an output period including a precharging period under the above conditions. FIG. 24 shows a change in voltage of the capacitive load when the voltage Vin is changed from 0 V to 4.9 V. For comparison, FIG. 24 also shows a voltage waveform, which is obtained when driving is made only by the operational amplifier 120 not having the precharge/predischarge circuit 20 and the switch 121. Voltage waveform A is obtained when only the operational amplifier 120 provides driving, and voltage waveform B is obtained when driving is made by the driving circuit of FIG. 23.

FIG. 24 shows that a driving speed is largely improved by the precharge/predischarge circuit 20. This is because the precharge/predischarge circuit 20 is quick in response to a fluctuation of the output voltage Vout as compared with an operational amplifier having a phase compensating means.

Moreover, current applied to the constant current circuits of the precharge/predischarge circuit 20 is low and the precharging period is short, resulting in a sufficiently small increase in power consumption of the operation of the precharge/predischarge circuit 20.

Therefore, the driving circuit of FIG. 23 is substantially equal in power consumption to the driving made only by the operational amplifier 120.

Meanwhile, when achieving the same driving speed as the driving circuit of FIG. 23 only by the operational amplifier 120, it is necessary to sufficiently increase idling current, thereby largely increasing power consumption.

FIG. 24 only shows a change to a higher voltage (output period including a precharging period). In the case of a change to a lower voltage as well (output period including a predischarging period), the driving circuit of FIG. 23 can achieve high-speed driving. Further, the operation according to the driving method of FIG. 12 also achieves the same effect.

The above explanation proved that the driving circuit of FIG. 23 can achieve high-speed driving or lower power consumption as compared with an operational amplifier operating by itself.

Further, when the operational amplifier 120 and the switch 121, which is the same as those of FIG. 23, are used in the first output circuit 10A and the second output circuit 10B of FIG. 16 and driving is made by the methods of FIGS. 17A and 17B or FIGS. 18A to 18C.

Figure 25:
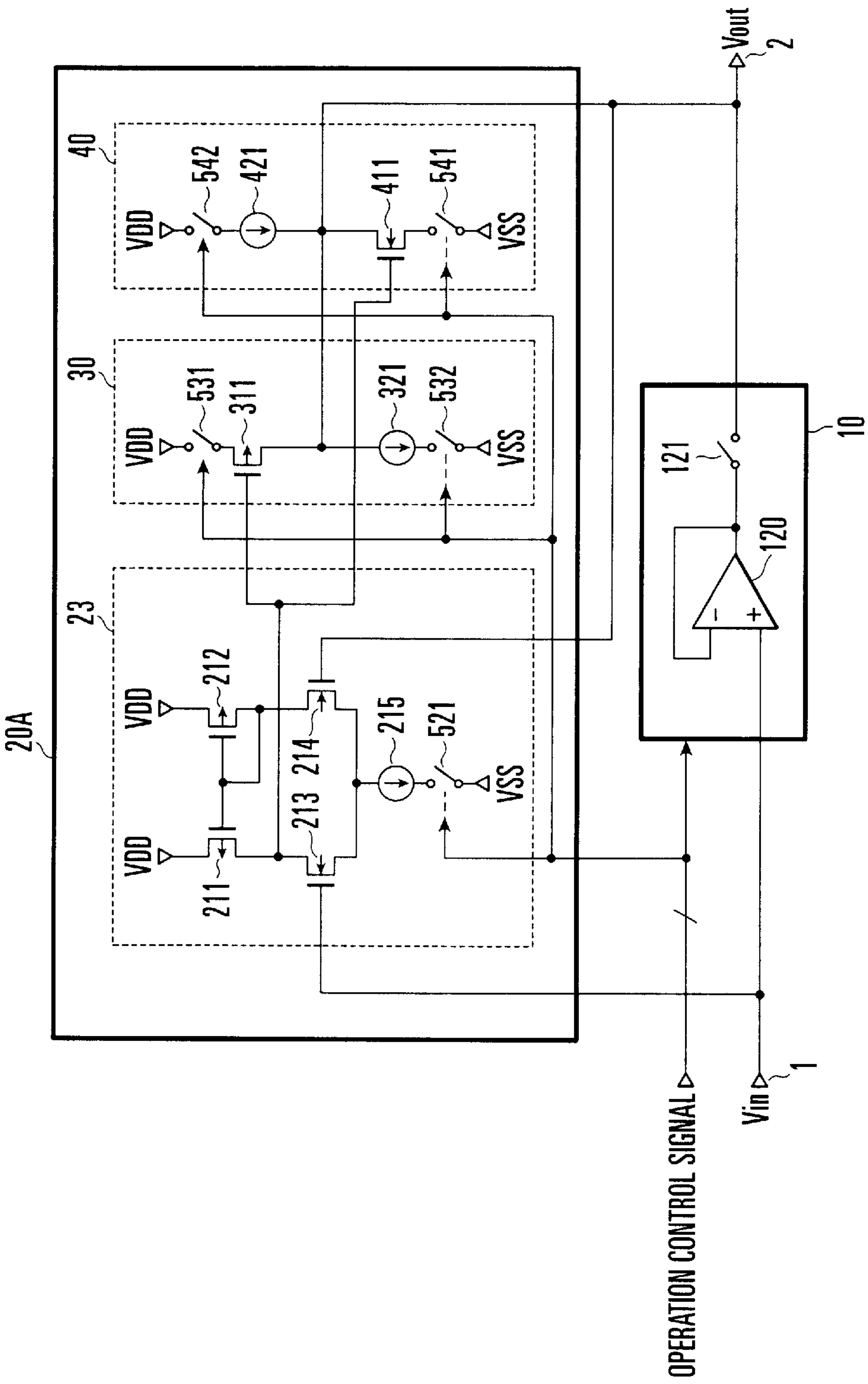
FIG. 25 is a diagram showing the configuration of the driving circuit according to Embodiment 11 of the present invention.

FIG. 25 is a diagram showing another example of the configuration shown in FIG. 23.

FIG. 25 shows an example of the driving circuit shown in FIG. 10. Like FIG. 17, the output circuit 10 is composed of an operational amplifier 120 and switches.

In the present example as well, when the driving circuit of FIG. 25 was operated by the driving method of FIG. 12, the same simulation results were obtained as the voltage waveform B of FIG. 24. Additionally, the simulation conditions were the same as those of FIG. 23 and the constant current circuits 215, 321, and 421 of the precharge/predischarge circuit 20 were each set at 0.5 $\mu$A.

Therefore, the precharge/predischarge circuit 20 has a sufficiently small idling current of 1 $\mu$A of the differential circuit 23 and the first output stage 30 in the precharging/predischarging period.

In FIG. 25, the precharge/predischarge circuit 20 performs the same operation as the precharge/predischarge circuit 20 of FIG. 23. Hence, in the driving circuit of FIG. 25 as well, it is possible to achieve high-speed driving or lower power consumption as compared with driving only by an operational amplifier.

The above description discussed the driving circuit of a liquid crystal display device according to an active matrix driving method. The circuit was described as a representative example of a driving circuit having a capacitive load and the present invention is also applicable as a driving circuit having an arbitrary load other than a liquid crystal display device.

As described above, according to the precharge/predischarge circuit of the present invention, a capacitive load connected to an output terminal can be driven to around a desired voltage with high speed by a first output stage composed of a charging means and a first constant current circuit, a second output stage composed of a discharging means and a second constant current circuit, and first and second differential circuits.

Moreover, in the case of a driving circuit having an operational amplifier, a phase compensating capacity is included for maintaining a stable operation and large idling current is necessary for charging/discharging the phase compensating capacity at a sufficient speed. In the precharge/predischarge circuit of the present invention, a phase compensating means such as a phase compensating capacity is not provided. With this arrangement, it is possible to sufficiently reduce idling current without the necessity for charging/discharging a phase compensating capacity.

Further, in the precharge/predischarge circuit of the present invention, since a phase compensating capacity is not provided, a gate voltage of the transistor can be immediately changed with slight idling current. Thus, high-speed operation is possible as compared with a driving circuit including a phase compensating capacity such as an operational amplifier.

However, in a feedback structure, it is not possible to produce oscillation and provide stable output without a phase compensating means.

Thus, in the present invention, the precharge/predischarge circuit is provided with a first output stage, which includes a first constant current circuit having a discharging function and a charging means, and a second output stage, which includes a second constant current circuit having a charging function and a discharging means.

Additionally, control is exercised such that when one of the first output stage and the second output stage is operated, the other stage is brought into non-operation.

When the first output stage operates, high-speed charging is made by the charging means. When a current value of the first constant current circuit, which has a discharging function, is set at a sufficiently small value, even in the event of oscillation, oscillation can be reduced to a small level around a desired voltage.

Further, when the second output stage operates, the discharging means provides high-speed discharging. When a current value of the second constant current circuit, which has a charging function, is sufficiently reduced, even in the event of oscillation, oscillation can be reduced to a small level around a desired voltage.

Hence, even when a capacitive load is relatively small in capacity, driving can be made at around a desired voltage.

Further, in the precharge/predischarge circuit of the present invention, the differential circuit, the first output stage, and the second output stage are each provided with the constant current circuits (third characteristic of the present invention). Thus, idling current of the precharge/predischarge circuit is controlled by the constant current circuits and the constant current circuits are sufficiently small, achieving low power consumption.

Besides, as described above, a high-speed operation is possible even when idling current is reduced sufficiently. Further, the differential circuit, the first output stage, and the second output stage are provided with switches for interrupting idling current, and the switches are turned off by an operation control signal to suspend the operation of the precharge/predischarge circuit.

Furthermore, when switching operation and non-operation of the precharge/predischarge circuit often, quick operation is possible and the switching between operation and non-operation does not increase power consumption.

As described above, in the present invention, the precharge/predischarge circuit can realize high-speed driving to around a desired voltage and low power consumption with the above characteristics.

Therefore, according to the precharge/predischarge circuit of the present invention, it is possible to sufficiently reduce charging/discharging power and prevent reduction in driving speed that is resulted from precharging and predischarging. Even when idling current of the precharge/predischarge circuit is reduced, a high-speed operation can be achieved.

Moreover, according to the present invention, combination can be made with an output circuit having reduced current supplying capability with low power consumption, a voltage is driven to around a desired voltage by the precharge/predischarge circuit in the first half of an output period, and a voltage is driven to a desired voltage with high voltage accuracy by the output circuit in the second half of the output period. Hence, it is possible to realize high-accuracy output, high-speed driving, and low power consumption.

The following will discuss the driving circuit including the precharge/predischarge circuit and the output circuit of the present invention. Since the precharge/predischarge circuit can make high-speed driving to around a desired voltage, it is possible to realize a driving circuit with high accuracy, high speed, and low power consumption of output voltage by making combination with an output circuit being capable of high-accuracy voltage output.

During an arbitrary output, when a capacitive load is driven to a desired voltage, a precharging/predischarging period is provided in the first half of the output period, the precharge/predischarge circuit is operated in the precharging/predischarging period to rapidly drive a voltage to around a desired voltage. The precharge/predischarge circuit is brought to non-operation (deactivated state) in the second half of the output period, and a voltage is driven to a desired voltage by the operation of the output circuit with high voltage accuracy.

Besides, in the precharge/predischarge circuit does not simultaneously perform a high-speed charging operation of the first output stage and a high-speed discharging operation of the second output stage. Thus, the precharging/predischarging period may be divided further into two steps to provide a precharging period for operating the first output stage and a predischarging period for operating the second output stage.

Further, the output circuit is brought to operation or non-operation according to circuit characteristics in the first half of an output period for operating the precharge/predischarge circuit. Instead of non-operation, the output circuit may be temporarily separated from the driving of the capacitive load.

With the above driving, a driving circuit with reduced current supplying capability is applicable as the output circuit as long as high-accuracy voltage output is possible.

As described above, according to the driving circuit of the present invention, it is possible to solve the foregoing conventional problems and realize high-speed driving and low power consumption with high voltage accuracy. For example, by applying the present invention to a driving circuit for directly supplying charge from a resistor string to drive data lines, even when current of the resistor string is reduced sufficiently, it is possible to realize high-speed driving and low power consumption with high voltage accuracy. Also, as an application, by using an operational amplifier as the output circuit, it is possible to improve speed without increasing idling current of the operational amplifier.

What is claimed is:

1. A precharge circuit, comprising:

a first output stage which is controlled by a first operation control signal and includes a first constant current circuit having a discharging function and charging means;

a second output stage which is controlled by a second operation control signal and a second constant current circuit having a charging function and discharging means;

at least a single differential circuit which is controlled by a third operation control signal and includes at least two input terminals and an output terminal connected to the input terminals of the first output stage and the second output stage; and a output terminal which is connected to the output terminals of the first output stage and the second output stage connected thereto.

2. The precharge/predischarge circuit according to claim 1, wherein said first output stage, said second output stage, and said differential circuit respectively respond to said first operation control signal, said second operation control signal, and said third operation control signal and include a plurality of switches for interrupting current applied therein.

3. The precharge/predischarge circuit according to claim 1, further comprising a control signal generating circuit for generating said first operation control signal, said second operation control signal, and said third operation control signal.

4. The precharge/predischarge circuit according to claim 1, wherein said differential circuit is operated according to a voltage difference between an input voltage and output voltage of said precharge/predischarge circuit, said input voltage being inputted to a first input terminal of said differential circuit, said output voltage being outputted from said precharge/predischarge circuit, and said output voltage also being inputted to a second input terminal of said differential circuit.

5. The precharge/predischarge circuit according to claim 1, wherein said differential circuit includes at least a constant current circuit and current applied in said differential amplifier is entirely controlled by said constant current circuit.

6. The precharge/predischarge circuit according to claim 1, wherein while one of said first output stage and said second output stage is operated by said first and second operation control signals, the other output stage is brought into non-operation.

7. The precharge/predischarge circuit according to claim 6, wherein during a precharging/predischarging period for operating said precharge/predischarge circuit, at least said first output stage or said second output stage is operated in the first half of said precharging/predischarging period and the other stage is operated in the second half of said precharging/predischarging period.

8. The precharge/predischarge circuit according to claim 1, wherein no phase compensating means is included.

9. A driving circuit, wherein the driving circuit comprises:

an output circuit for outputting an output voltage to a driving output terminal in response to input voltage; and a precharge/predischarge circuit for driving said driving output terminal in response to said input voltage, and said precharge/predischarge circuit comprises:

a first output stage which is controlled by a first operation control signal and includes a first constant current circuit having a discharging function and charging means;

a second output stage which is controlled by a second operation control signal and includes a second constant current circuit having a charging function and discharging means;

at least a single differential circuit which is controlled by a third operation control signal and includes at least a single input terminal for receiving said input voltage and an output terminal connected to the input terminals of said first output stage and said second output stage; and the output terminals of said first output stage and said second output stage which are connected in common to said driving output terminal.

10. The driving circuit according to claim 9, wherein said output circuit is controlled by a fourth operation control signal.

11. The driving circuit according to claim 9, further comprising a control signal generating circuit for generating said first to third operation control signals.

12. The driving circuit according to claim 10, further comprising a control signal generating circuit for generating said first to fourth operation control signals.

13. The driving circuit according to claim 9, wherein during an output period for outputting a desired voltage to said driving output terminal, at least said precharge/predischarge circuit is operated in the first half of said output period and only said output circuit is operated in the second half of said output period.

14. The driving circuit according to claim 10, wherein during an output period when said first to fourth operation control signal exercise control and a desired voltage is outputted to said driving output terminal, at least said precharge/predischarge circuit is operated in the first half of said output period and only said output circuit is operated in the second half of said output period.

15. The driving circuit according to claim 14, further comprising a control signal generating circuit for generating said first to fourth operation control signals.

16. The driving circuit according to claim 9, further comprising a multilevel voltage generating circuit for generating a plurality of level voltages, and means for selecting said plurality of level voltages and supplying the voltages as input voltage of said output circuit.

17. The driving circuit according to claim 16, further comprising a control signal generating circuit for generating said first to third operation control signals.

18. The driving circuit according to claim 16, wherein said output circuit is controlled by the fourth operation control signal.

19. The driving circuit according to claim 18, further comprising a control signal generating circuit for generating said first to fourth operation control signals.

20. A driving circuit, wherein the driving circuit comprises:

an output circuit for outputting an output voltage to a driving output terminal in response to an input voltage;

a precharge/predischarge circuit for driving said driving output terminal in response to said input voltage;

a multilevel voltage generating circuit for generating a plurality of level voltages; and means for selecting said plurality of level voltages and supplying said voltages as input voltage of said output circuit, and said precharge/predischarge circuit comprises:

a first output stage which is controlled by said first operation control signal and includes a first constant current circuit having a discharging function and charging means;

a second output stage which is controlled by a second operation control signal and includes a second constant current circuit having a charging function and discharging means; and at least a single differential circuit which is controlled by a third operation control signal and includes at least a single input terminal for receiving said input voltage and an output terminal connected to the input terminals of said first output stage and said second output stage; and the output terminals of said first output stage and said second output stage which are connected in common to said driving output terminal.

21. The driving circuit according to claim 20, wherein said output circuit is controlled by a fourth operation control signal.

22. The driving circuit according to claim 20, further comprising a control signal generating circuit for generating said first to third operation control signals.

23. The driving circuit according to claim 21, further comprising a control signal generating circuit for generating said first to fourth operation control signals.

24. The driving circuit according to claim 20, wherein during an output period for outputting a desired voltage to said driving output terminal, at least said precharge/predischarge circuit is operated in the first half of said output period and only said output circuit is operated in the second half of said output period.

25. The driving circuit according to claim 21, wherein during an output period when said first to fourth operation control signal exercise control and a desired voltage is outputted to said driving output terminal, at least said precharge/predischarge circuit is operated in the first half of said output period and only said output circuit is operated in the second half of said output period.

26. A driving circuit, wherein the driving circuit comprises:

a first output circuit for outputting a first output voltage to a first driving output terminal in response to a first input voltage;

a second output circuit for outputting a second output voltage to a second driving output terminal in response to a second input voltage; and a precharge/predischarge circuit for driving said first and second driving output terminals in response to said first and second input voltages, said precharge/predischarge circuit comprises:

a first output stage including a first constant current circuit having a discharging function and charging means;

a second output stage including a second constant current circuit having a charging function and discharging means;

a first differential circuit having at least a single input terminal for receiving said first input voltage or said second input voltage and an output terminal connected to the input terminal of said first output stage;

a second differential circuit having at least a single input terminal for receiving said first input voltage or said second input voltage and an output terminal connected to the input terminal of said second output stage; and the output terminals of said first and said second output stages which are connected in common, and connected to said first or second driving output terminals;

a switch group for connecting said first and second output circuits and said first differential circuit and said first output stage or said second differential circuit and said second output stage, and during an output period for controlling said first and second output circuits and said switch group and outputting desired voltages to said first and second driving output terminals, at least said precharge/predischarge circuit is operated in the first half of said output period and only said two output circuits are operated in the second half of said output circuit.

27. The driving circuit according to claim 26, wherein said first and second input voltages are selected from a plurality of voltages taken out of a connecting terminal of a resistor string, and said first and second output circuits include switches for directly outputting said first and second input voltages or interrupting said voltages.

28. The driving circuit according to claim 26, wherein said first and second output circuits each include an operational amplifier and a switch for interrupting an output of said operational amplifier.

29. The driving circuit according to claim 26, further comprising means for producing an operation control signal for controlling said first and second output stages, said first and second differential circuits, and said switch group.

30. The driving circuit according to claim 26, further comprising means for producing an operation control signal for controlling said first and second output circuits, said first and second output stages, said first and second differential circuits, and said switch group.

31. A driving circuit having an output circuit for inputting an input signal voltage from an input terminal to drive an output terminal, and a precharge/predischarge circuit for precharging and predischarging said output terminal, wherein said precharging/predischarging circuit comprises:

first and second differential circuits for differential-inputting an input signal voltage from said input terminal and an output signal voltage from said output terminal;

a first output stage comprising a first conductive transistor and a first switch connected in series between a high-potential side power source and the output terminal, the first conductive transistor having a control terminal connected to an output voltage of the first differential circuit to be turned on and off, and having, when being turned on, a current applied by the output voltage controlled to charge the output terminal from a high-potential side power source, and the first switch being subjected to on-off control by an operation control signal, and a first constant current source circuit, which discharges from the output terminal to the low-potential side power source, and a second switch, which is subjected to on-off control by an operation control signal, connected in series between the output terminal and the low-potential side power source; and a second output stage comprising a second conductive transistor and a third switch connected in series between a low-potential side power source and the output terminal, the second conductive transistor having a control terminal connected to an output voltage of the second differential circuit to be turned on and off, and having, when being turned on, current applied by the output voltage controlled to discharge from the output terminal to the low-potential side power source, and the third switch being subjected to on-off control by an operation control signal, and a second constant current source circuit, which charges the output terminal from the high-potential side power source, and a fourth switch, which is subjected to on-off control by the operation control signal, connected in series between the output terminal and the high-potential side power source.

32. The driving circuit according to claim 31, wherein said first and second differential circuits differential-input a signal voltage of said input terminal, and said output terminal and include first and second differential pair transistors being opposite in polarity, first and second load circuits connected to said first and second differential pair transistors, first and second constant current sources for supplying current to said first and second differential pair transistors, and fifth and sixth switches for exercising on-off control on a path based on said operation control signal, said path supplying constant current to said first and second differential pair transistors from said first and second constant current sources.

33. A driving circuit having an output circuit for inputting an input signal voltage from an input terminal to drive an output terminal, and a precharge/predischarge circuit for precharging/predischarging the output terminal, wherein said precharge/predischarge circuit comprises:

first and second differential circuits for differential-inputting an input signal voltage from said input terminal and an output signal voltage of said output terminal;

a first output stage comprising a first conductive transistor and a first switch connected in series between a high-potential side power source and said output terminal, said first conductive transistor having a control terminal connected to a first output voltage of said first differential circuit to be turned on and off, and having, when being turned on, a current applied by the output voltage controlled to charge said output terminal from a high-potential side power source, and said first switch being subjected to on-off control by an operation control signal, and a first constant current source circuit, which discharges from said output terminal to said low-potential side power source, and a second switch, which is subjected to on-off control by said operation control signal, connected in series between said output terminal and said low-potential side power source; and a second output stage comprising a second conductive transistor and a third switch connected in series between said low-potential side power source and said output terminal, said second conductive transistor having a control terminal connected to a second output voltage of said second differential circuit to be turned on and off, and having, when being turned on, current applied by said second output voltage controlled to discharge from said output terminal to said low-potential side power source, and said third switch being subjected to on-off control by an operation control signal, and a second constant current source circuit, which charges said output terminal from said high-potential side power source, and a fourth switch, which is subjected to on-off control by said operation control signal, connected in series between said output terminal and said high-potential side power source.

34. The driving circuit according to claim 33, wherein said first differential circuit comprises differential pair transistors for differential-inputting voltages of said input terminal and said output terminal, a load circuit of said differential pair transistors, a constant current source for supplying current to said differential pair transistors, and a fifth switch for exercising on-off control on a path based on said operation control signal, said path supplying constant current from said constant current source to said differential pair transistors.

35. The driving circuit according to claim 34, wherein said second differential circuit comprises differential pair transistors for differential-inputting voltages of said input terminal and said output terminal, a load circuit of said differential pair transistors, a constant current source for supplying current to said differential pair transistors, and a sixth switch for exercising on-off control on a path based on said operation control signal, said path supplying constant current from said constant current source to said differential pair transistors.

36. The driving circuit according to claim 35, wherein during a precharging period for increasing an output voltage of said output terminal, said fifth switch of said first differential circuit and said first and second switches of said first output stage are turned on, said output circuit is turned off, after the precharging period, said sixth switch of said second differential circuit and said first and second switches of said first output stage are turned off, said output circuit is turned on, and during a predischarging period for reducing an output voltage of said output terminal, said first switch of said first differential circuit and said third and fourth switches of said second output stage are turned on, said output circuit is turned off, after the predischarging period, said first switch of said first differential circuit and said third and fourth switches of said second output stage are turned off, and said output circuit is turned on.

37. The driving circuit according to claim 35, wherein said fifth switch of said first differential circuit and said first and second switches of said first output stage are turned on in a precharging period of said output terminal, and said fifth switch of said first differential circuit and said first and second switches of said first output stage are turned off and said sixth switch of said second differential circuit and said third and fourth switches of said second output stage are turned on in a predischarging period subsequent to said precharging period, and after said predischarging period, said sixth switch of said second differential circuit and said third and fourth switches of said second output stage are turned off and said output circuit is turned on.

38. The driving circuit according to claim 33, wherein during a precharging period for increasing an output voltage of said output terminal, said switches of said first differential circuit and said first and second switches of said first output stage are turned on, said output circuit is turned off, after the precharging period, said switches of said first differential circuit and said first and second switches of said first output circuit are turned off, said output circuit is turned on, and during a predischarging period for reducing an output voltage of said output terminal, said switches of said first differential circuit and said third and fourth switches of said second output stage are turned on, said output circuit is turned off, after said predischarging period, said switches of said first differential circuit and said third and fourth switches of said second output stage are turned off, and said output circuit is turned on.

39. The driving circuit according to claim 33, wherein said switches of said first differential circuit and said first and second switches of said first output stage are turned on in a precharging period of said output terminal, and said first and second switches of said first output stage are turned off and said third and fourth switches of said second output stage are turned on in a predischarging period of said output terminal subsequent to said precharging period, and after said second predischarging period, said switches of said first differential circuit and said third and fourth switches of said second output stage are turned off and said output circuit is turned on.

40. The driving circuit according to claim 9, wherein said output circuit connects said input terminal and said output terminal and includes a transfer gate being subjected to on-off control by said operation control signal.

41. The driving circuit according to claim 9, wherein said output circuit includes an operational amplifier having said input terminal connected to a non-inverting input terminal and an output terminal connected to an inverting input terminal as a voltage follower, and a transfer gate which connects an output terminal of said operational amplifier and said output terminal and includes a transfer gate subjected to on-off control by said operation control signal.

42. The driving circuit according to claim 9, wherein a capacitive load connected to said output terminal is driven.

43. A liquid crystal display device, wherein a driving circuit of said liquid crystal display device comprises said driving circuit of claim 9.

44. A liquid crystal display device, wherein a driving circuit of said liquid crystal display device comprises said driving circuit of claim 20.

45. A liquid crystal display device, wherein a driving circuit of said liquid crystal display device comprises said driving circuit of claim 26.

46. A liquid crystal display device, wherein a driving circuit of said liquid crystal display device comprises said driving circuit of claim 31.

47. A liquid crystal display device, wherein a driving circuit of said liquid crystal display device comprises said driving circuit of claim 33.

48. The driving circuit according to claim 9, wherein said first output stage, said second output stage, and said differential circuit of said precharge/predischarge circuit respectively respond to said first operation control signal, said second operation control signal, and said third operation control signal and include a plurality of switches for interrupting current applied therein.

49. The driving circuit according to claim 9, wherein said differential circuit is operated according to a voltage difference between an input voltage and output voltage of said precharge/predischarge circuit, said input voltage being inputted to a first input terminal of said differential circuit, said output voltage being outputted from said precharge/predischarge circuit, and said output voltage also being inputted to a second input terminal of said differential circuit.

50. The driving circuit according to claim 9, wherein said differential circuit includes at least a constant current circuit and current applied in said differential circuit is entirely controlled by said constant current circuit.

51. The driving circuit according to claim 9, wherein while one of said first output stage and said second output stage is operated by said first and second operation control signals, the other output stage is brought into non-operation.

52. The driving circuit according to claim 13, wherein during a precharging/predischarging period where said precharge/predischarge circuit is operated in the first half of said output period, at least said first output stage or said second output stage is operated in the first half of said precharging/predischarging period and the other stage is operated in the second half of said precharging/predischarging period.

53. The driving circuit according to claim 20, wherein said first output stage, said second output stage, and said differential circuit of said precharge/predischarge circuit respectively respond to said first operation control signal, said second operation control signal, and said third operation control signal and include a plurality of switches for interrupting current applied therein.

54. The driving circuit according to claim 20, wherein said differential circuit is operated according to a voltage difference between an input voltage and output voltage of said precharge/predischarge circuit, said input voltage being inputted to a first input terminal of said differential circuit, said output voltage being outputted from said precharge/predischarge circuit, and said output voltage also being inputted to a second input terminal of said differential circuit.

55. The driving circuit according to claim 20, wherein said differential circuit includes at least a constant current circuit and current applied in said differential circuit is entirely controlled by said constant current circuit.

56. The driving circuit according to claim 20, wherein while one of said first output stage and said second output stage is operated by said first and second operation control signals, the other output stage is brought into non-operation.

57. The driving circuit according to claim 24, wherein during a precharging/predischarging period where said precharge/predischarge circuit is operated in the first half of said output period, at least said first output stage or said second output stage is operated in the first half of said precharging/predischarging period and the other stage is operated in the second half of said precharging/predischarging period.

58. The driving circuit according to claim 26, wherein said first and second differential circuit are respectively operated according to a voltage difference between an input voltage and output voltage of said precharge/predischarge circuit, said input voltage being inputted to first input terminals of said first and second differential circuits, said output voltage being outputted from said precharge/predischarge circuit, and said output voltage also being inputted to second input terminals of said first and second differential circuits.

59. The driving circuit according to claim 26, wherein while one of said first output stage and said second output stage is operated by said first and second operation control signals, the other output stage is brought into non-operation.

60. The driving circuit according to claim 26, wherein during a precharging/predischarging period where said precharge/predischarge circuit is operated in the first half of said output period, at least said first output stage or said second output stage is operated in the first half of said precharging/predischarging period and the other stage is operated in the second half of said precharging/predischarging period.

* * * * *